United States Patent
Hashimoto et al.

(10) Patent No.: US 10,910,391 B2
(45) Date of Patent: Feb. 2, 2021

(54) SEMICONDUCTOR MEMORY DEVICE HAVING A PLURALITY OF FIRST SEMICONDUCTOR FILMS

(71) Applicant: TOSHIBA MEMORY CORPORATION, Minato-ku (JP)

(72) Inventors: Takayuki Hashimoto, Kuwana (JP); Ayaha Hachisuga, Yokkaichi (JP); Jun Nishimura, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/552,255

(22) Filed: Aug. 27, 2019

(65) Prior Publication Data

US 2020/0075616 A1 Mar. 5, 2020

(30) Foreign Application Priority Data

Aug. 30, 2018 (JP) .................................. 2018-161974

(51) Int. Cl.
*H01L 27/11556* (2017.01)
*H01L 27/11524* (2017.01)

(52) U.S. Cl.
CPC .. *H01L 27/11556* (2013.01); *H01L 27/11524* (2013.01)

(58) Field of Classification Search
CPC ......... H01L 27/11521; H01L 27/11524; H01L 27/11556; H01L 27/11568; H01L 27/11575; H01L 27/11582
See application file for complete search history.

(56) References Cited

U.S. PATENT DOCUMENTS

| 6,381,166 B1 | 4/2002 | Yoshida et al. |
| 8,426,908 B2 | 4/2013 | Higashi |
| 2016/0268304 A1 | 9/2016 | Ikeda et al. |
| 2019/0378857 A1* | 12/2019 | Lee .................. H01L 27/11521 |

FOREIGN PATENT DOCUMENTS

| JP | 2000-114493 A | 4/2000 |
| JP | 4922370 B2 | 4/2012 |
| JP | 2016-171243 A | 9/2016 |

* cited by examiner

*Primary Examiner* — Hoai V Pham
(74) *Attorney, Agent, or Firm* — Oblon, McClelland, Maier & Neustadt, L.L.P.

(57) ABSTRACT

A semiconductor memory device comprises a substrate, first semiconductor films extending in a first direction crossing a surface of the substrate and arranged in a second direction and in a third direction, a conductive layer which covers peripheral faces of the first semiconductor films on a cross-section crossing the first direction, and a contact which extends in the first direction. Here, when straight lines disposed at equal intervals in the second direction on the cross-section and perpendicular to the second direction are defined as first to third straight lines, a first number of the first semiconductor films are provided on the first straight line, a second number less than the first number of the first semiconductor films are provided on the second straight line, a third number less than the second number of the first semiconductor films are provided on the third straight line.

14 Claims, 64 Drawing Sheets

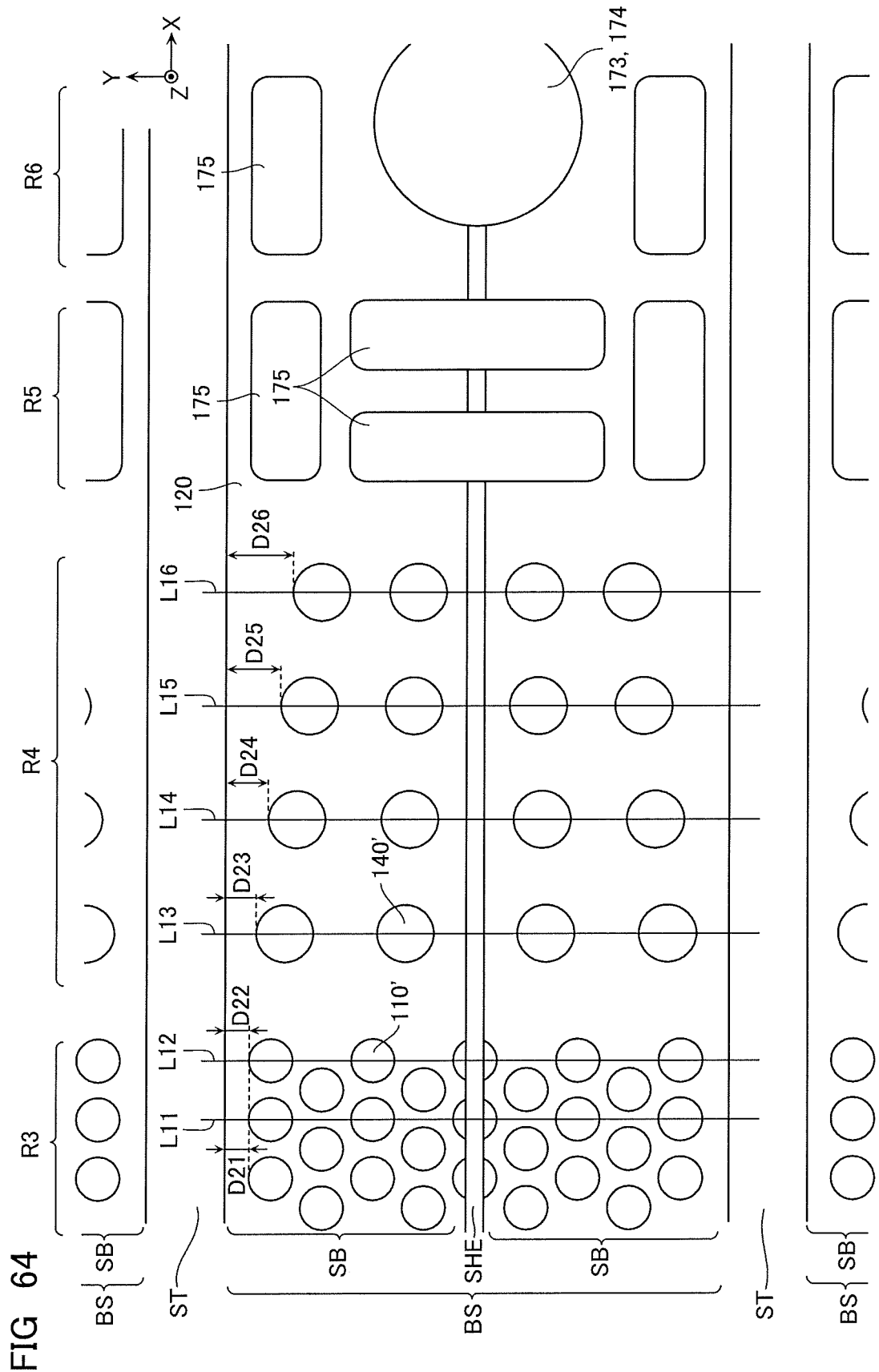

SEMICONDUCTOR MEMORY DEVICE HAVING A PLURALITY OF FIRST SEMICONDUCTOR FILMS

CROSS-REFERENCE TO RELATED APPLICATIONS

This application is based upon and claims the benefit of Japanese Patent Application No. 2018-161974, filed on Aug. 30, 2018, the entire contents of which are incorporated herein by reference.

BACKGROUND

Field

Embodiments described below relate to semiconductor memory devices.

Description of the Related Art

Semiconductor memory devices are known, comprising a substrate, a plurality of semiconductor films which extend in a first direction crossing a surface of the substrate and are arranged in a second direction crossing the first direction and in a third direction crossing the first direction and the second direction, and a conductive layer which extends in the second direction and covers the peripheral faces of the plurality of semiconductor films on a cross-section crossing the first direction.

BRIEF DESCRIPTION OF THE DRAWINGS

FIG. 64 is a schematic plan view of a semiconductor memory device according to another example.

DETAILED DESCRIPTION

Figure 1:
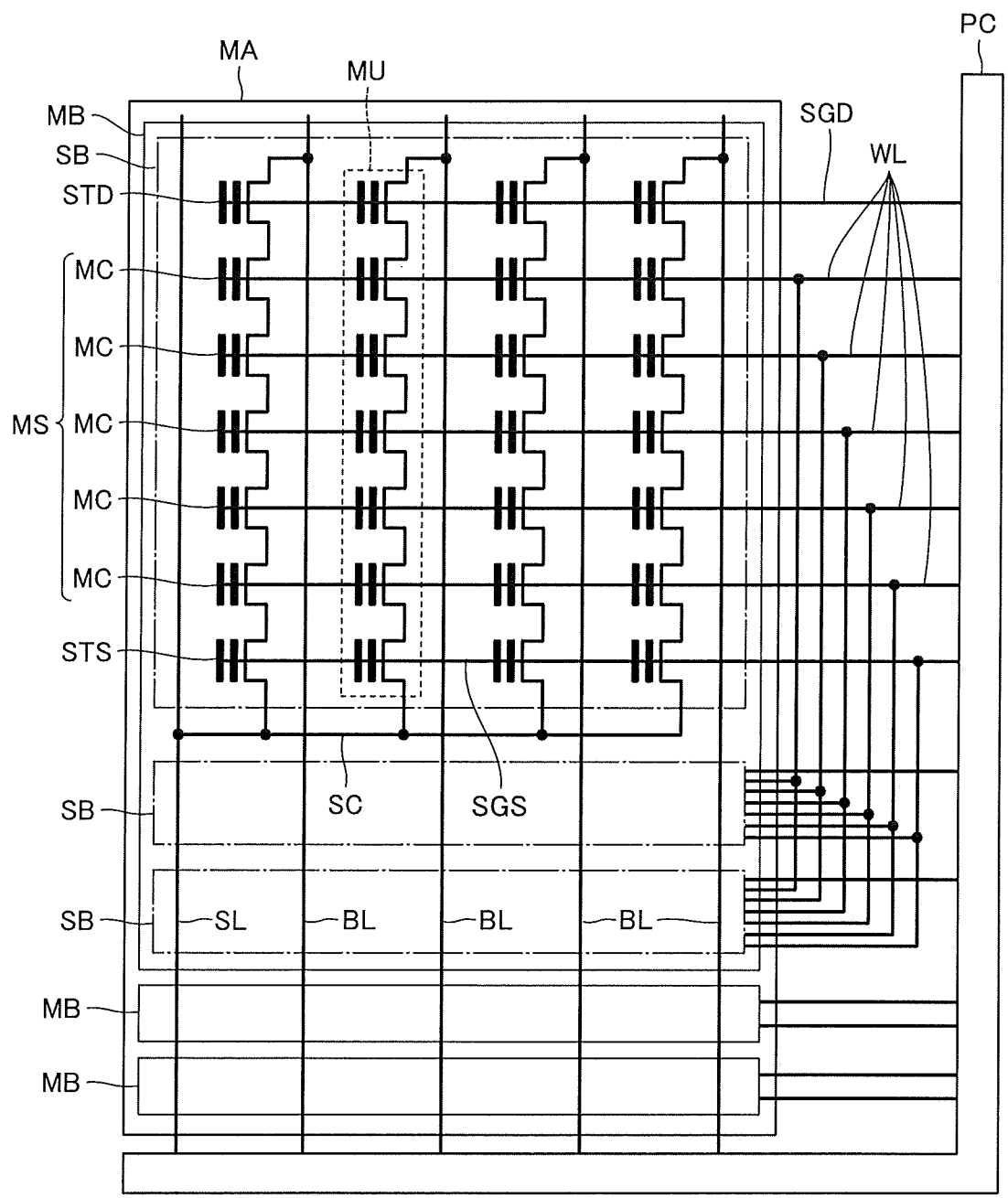
FIG. 1 is an equivalent circuit diagram illustrating a schematic configuration of a semiconductor memory device according to a first embodiment.

A semiconductor memory device according to one embodiment comprises a substrate, a plurality of first semiconductor films which extend in a first direction crossing a surface of the substrate and are arranged in a second direction crossing the first direction and in a third direction crossing the first direction and the second direction, a conductive layer which extends in the second direction and covers the peripheral faces of the plurality of first semiconductor films on a cross-section crossing the first direction, and a contact which extends in the first direction and which is connected with the conductive layer or which has a peripheral face covered by the conductive layer in the cross-section. Here, when straight lines which are disposed at equal intervals in the second direction on the cross-section described above and perpendicular to the second direction are defined as first to third straight lines, a first number of the first semiconductor films are provided on the first straight line, the second straight line is closer to the contact than the first straight line, a second number, which is less than the first number, of the first semiconductor films are provided on the second straight line, the third straight line is closer to the contact than the second straight line, a third number, which is less than the second number, of the first semiconductor films are provided on the third straight line.

A semiconductor memory device comprising: a substrate; a plurality of first semiconductor films which extend in a first direction crossing a surface of the substrate and are arranged in a second direction crossing the first direction and in a third direction crossing the first direction and the second direction; a conductive layer which extends in the second direction and covers the peripheral faces of the plurality of first semiconductor films on a cross-section crossing the first direction; a contact which extends in the first direction and which is connected with the conductive layer or which has a peripheral face covered by the conductive layer in the cross-section; a plurality of first insulating layers which is provided between the plurality of the first semiconductor films and the contact, each of which extends in the first direction, and each of which has a peripheral face covered by the conductive layer in the cross-section; and a plurality of second semiconductor films which is provided between the plurality of the first semiconductor films and the plurality of the first insulating layers, each of which extends in the first direction, and each of which has a peripheral face covered by the conductive layer in the cross-section. Here, when straight lines which are disposed in the second direction on the cross-section and perpendicular to the second direction are defined as first to fourth straight lines, a first number of the first semiconductor films are provided on the first straight line. Additionally, the second straight line is closer to the contact than the first straight line, a second number of the first semiconductor films are provided on the second straight line, and each of the second number of the first semiconductor films is adjacent to at least one of the first number of the first semiconductor films. Additionally, the third straight line is closer to the contact than the second straight line, a third number of the first semiconductor films are provided on the third straight line, and each of the third number of the second semiconductor films is adjacent to at least one of the second number of the first semiconductor films. Additionally, the fourth straight line is closer to the contact than the third straight line, a fourth number of the first semiconductor films are provided on the fourth straight line, and each of the fourth number of the first semiconductor films is adjacent to at least one of the third number of the first semiconductor films. Additionally, a distance between the third straight line and the second straight line is larger than a distance between the second straight line and the first straight line, and a distance between the fourth straight line and the third straight line is larger than the distance between the second straight line and the first straight line.

A semiconductor memory device according to an embodiment will now be described in detail with reference to the accompanying drawings. Note that the following embodiments are only examples and are not described intending to limit the present invention.

Also, in this specification, a direction crossing a surface of a substrate is referred to as a first direction, a direction crossing the first direction is referred to as a second direction, and a direction crossing the first direction and the second direction is referred to as a third direction. Further, a predetermined direction parallel to the surface of the substrate is referred to as x-direction, the direction parallel to the surface of the substrate and perpendicular to the x-direction is referred to as y-direction, and the direction perpendicular to the surface of the substrate is referred to as z-direction. Note that, in the following description, the case in which the x-direction, the y-direction, and the z-direction correspond to the second direction, the third direction, and the first direction, respectively will be illustrated. However, the first direction, the second direction, and the third direction are not limited to the z-direction, the x-direction, and the y-direction, respectively.

Further, in this specification, "upward", "downward" and the like are referenced to the substrate. For example, the orientation leaving the substrate along the first direction described above is referred to as upward, the orientation approaching the substrate along the first direction is referred to as downward. Further, it is defined that in relation to an arrangement, a lower surface or a lower end as used herein refers to the face or the end on the side of the substrate in this arrangement, and a top surface or a top end as used herein refers to the face or the end on the opposite side of the substrate in this arrangement. Further, a face crossing the second direction or the third direction is referred to as a side surface.

Also, in this specification, when referred to that a first configuration is "electrically connected" to a second configuration, the first configuration may be directly connected to the second configuration, and also may be connected through a line, a semiconductor component or a transistor and the like. For example, when three transistors are connected in series, although the second transistor is in the off state, the first and the third transistors are "electrically connected."

Also, in this specification, it is defined that when referred to that a first configuration is "electrically insulated" from a second configuration, for example, an insulating film and the like are provided between the first configuration and the second configuration, and a contact, a line and the like connecting the first configuration to the second configuration are not provided.

First Embodiment

[Configuration]

FIG. 1 is an equivalent circuit diagram illustrating a schematic configuration of a semiconductor memory device according to a first embodiment. For the convenience of a description, a part of the configuration is omitted in FIG. 1.

The semiconductor memory device according to the embodiment comprises a memory cell array MA, and a peripheral circuit PC controlling the memory cell array MA.

The memory cell array MA comprises a plurality of memory blocks MB. The plurality of memory blocks MB comprises a plurality of subblocks SB, respectively. The plurality of subblocks SB comprises a plurality of memory units MU, respectively. Each one end of the plurality of memory units MU is connected to the peripheral circuit PC via a bit line BL. Each other end of the plurality of memory units MU is connected to the peripheral circuit PC via a common lower wiring SC and a source line SL.

The memory unit MU comprises a drain select transistor STD, a memory string MS, and a source select transistor STS, which are connected in series between the bit line BL and the lower wiring SC. Hereinafter, the drain select transistor STD and the source select transistor STS may be referred to select transistors (STD, STS) simply.

The memory string MS comprises a plurality of memory cells MC serially connected one another. The memory cell MC is a field effect transistor comprising a semiconductor film, a gate insulating film, and a gate electrode. The semiconductor film functions as a channel region. The gate insulating film includes a memory portion able to store data. The memory portion is, for example, a silicon nitride film (SiN) and a charge storage film such as a floating gate. In this case, a threshold voltage of the memory cell MC changes depending on a charge quantity in the charge storage film. The gate electrode is connected to a word line WL. The word line WL is provided corresponding to the plurality of memory cells MC belonging to one memory string MS and is commonly connected to all memory strings MS in one memory block MB.

The select transistors (STD, STS) are field effect transistors comprising a semiconductor film, a gate insulating film, and a gate electrode. The semiconductor film functions as a channel region. The gate electrode of the drain select transistor STD is connected to a drain select line SGD. The drain select line SGD is provided corresponding to the subblocks SB and is commonly connected to all select transistors for drain STD in one subblock SB. The gate electrode of the source select transistor STS is connected to a source select line SGS. The source select line SGS is commonly connected to all select transistors for source STS in one memory block MB.

The peripheral circuit PC generates voltage required for, for example, reading operation, writing operation, and erasing operation, and applies the voltage to the bit line BL, the source line SL, the word line WL, and the select gate lines (SGD, SGS). The peripheral circuit PC includes, for example, a plurality of transistors and lines provided on a same chip on which provides the memory cell array MA.

Figure 2:
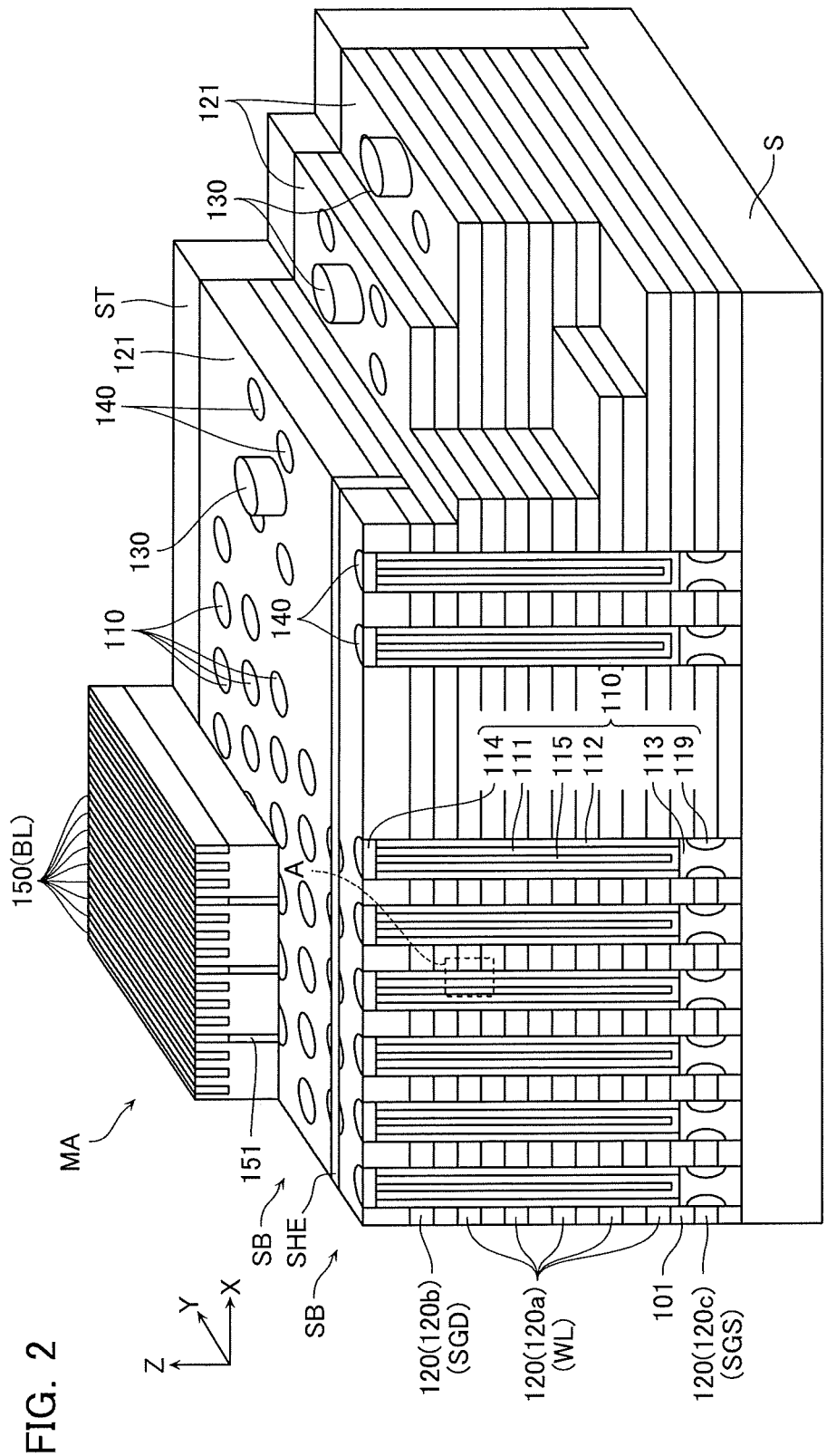
FIG. 2 is a schematic perspective view of the same semiconductor memory device.

FIG. 2 is a schematic perspective view of the semiconductor memory device according to the embodiment. For the convenience of a description, a part of the configuration is omitted in FIG. 2.

As shown in FIG. 2, the semiconductor memory device according to the embodiment comprises a substrate S and a memory cell array MA provided above the substrate S.

The substrate S is, for example, a semiconductor substrate of monocrystalline silicon (Si) and the like. The substrate S has, for example, a double well structure comprising an n-type impurity layer such as phosphorus (P) on a surface of the semiconductor substrate, and a p-type impurity layer such as boron (B) formed in the n-type impurity layer. Further, in the embodiment, a wiring layer functioning as a lower wiring SC is formed in the surface of the substrate S. However, a wiring layer may be otherwise provided above the substrate S.

The memory cell array MA comprises a plurality of memory structures 110 extending in the z-direction, a plurality of conductive layers 120 covering the peripheral faces of the plurality of memory structures on an x-y cross-section, a contact 130 connected to the plurality of conductive layers 120, a first structure 140 disposed in the vicinity of the contact 130, and a plurality of lines 150 connected to a top end of the memory structures 110.

The memory structures 110 are disposed in a predetermined pattern in the x-direction and the y-direction. The memory structures 110 basically function as memory units MU. However, as described below in detail referring to FIG. 5, part of the memory structures 110 (110b in FIG. 5, etc.) do not function as memory units MU. In other words, in this specification, it is defined that structures are included in "memory structure 110", which are not only structures functioning as memory units MU (110a in FIG. 5, etc.), but also structures which have the same structures as structures like those.

The memory structure 110 comprises a semiconductor film 111 extending in the z-direction, a gate insulating film 112 provided between the semiconductor film 111 and the conductive layer 120, a semiconductor film 113 connected to the lower end of the semiconductor film 111 and to the surface of the substrate S, and a semiconductor film 114 connected to the top end of the semiconductor film 111.

The semiconductor film 111 functions as, for example, a channel region of the plurality of memory cells MC and the drain select transistor STD included in one memory unit MU (FIG. 1). The semiconductor film 111 has an approximately cylindrical shape, and an insulating film 115 such as silicon oxide ($SiO_2$) is embedded in its center portion. The semiconductor film 111 is, for example, a semiconductor film such as non-doped polysilicon (Si).

Figure 3:
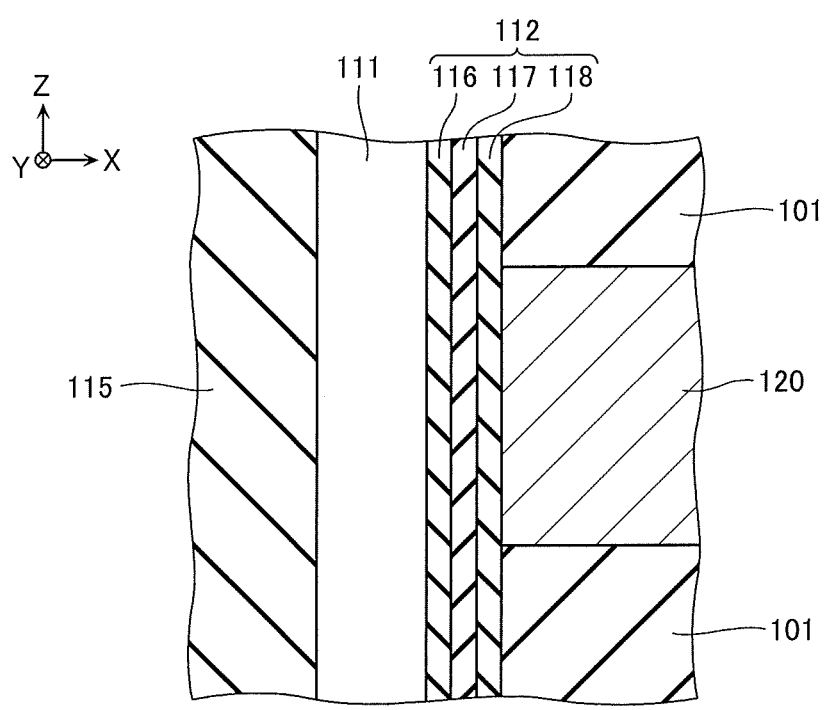
FIG. 3 is a schematic enlarged view of a part shown with A in FIG. 2.

The gate insulating film 112 is provided at each intersection of the semiconductor film 111 and the conductive layer 120. The gate insulating film 112 comprises, for example as shown in FIG. 3, a tunnel insulating film 116, a charge storage film 117, and a block insulating film 118 laminated between the semiconductor film 111 and the conductive layer 120. The tunnel insulating film 116 and the block insulating film 118 are, for example, insulating films such as silicon oxide ($SiO_2$). The charge storage film 117 is, for example, a charge accumulable film such as silicon nitride (SiN).

The semiconductor film 113 (FIG. 2) functions as, for example, a channel region of the source select transistor STS. On the peripheral face of the semiconductor film 113, a gate insulating film 119 is provided. The semiconductor film 113 is, for example, a semiconductor film such as monocrystalline silicon (Si). The gate insulating film 119 is, for example, an insulating film such as silicon oxide.

The semiconductor film 114 is, for example, a semiconductor film such as polysilicon (Si) including an n-type impurity such as phosphorus.

The plurality of conductive layers 120 are arranged in the z-direction with respectively interposing an insulating layer 101 such as silicon oxide and are substantially plate like conductive layers extending in the x-direction and the y-direction. These conductive layers 120 have a plurality of through holes formed in a predetermined pattern, and the memory structures 110 are provided within the through holes, respectively. Further, at an end in the x-direction of the conductive layer 120, a contact portion 121 connected to the contact 130 is provided. The conductive layer 120 includes, for example, a multi-layered film of a titanium nitride (TiN) and tungsten (W), and the like.

Part of conductive layers 120a function as word lines WL (FIG. 1) and gate electrodes of the plurality of memory cells MC (FIG. 1) connected to the word line WL.

A conductive layer 120b provided above the conductive layers 120a functions as the drain select line SGD (FIG. 1) and gate electrodes of the plurality of drain select transistors STD (FIG. 1) connected to the drain select line SGD. The conductive layer 120b has narrower width in the y-direction than that of the conductive layer 120a. Between the conductive layers 120b adjacent in the y-direction, an insulating portion SHE such as silicon oxide is provided.

A conductive layer 120c provided under the conductive layers 120a functions as the source select line SGS (FIG. 1) and gate electrodes of the plurality of source select transistors STS connected to the source select line SGS. The conductive layer 120c covers the peripheral faces of the semiconductor film 113 via the gate insulating film 119.

The contact 130 extends in the z-direction and is connected to contact portions 121 of the plurality of conductive layers 120 at its lower end. The contact 130 includes, for example, a multi-layered film of a titanium nitride (TiN) and tungsten (W), and the like.

The first structure 140 is provided at the contact portion 121 of the conductive layer 120 so as to surround the contact 130, for example. The first structure 140 comprises almost the same configuration as that of the memory structure 110. However, while a lower end of the semiconductor film 111 of the memory structure 110 is connected to the semiconductor film 113, a lower end of the semiconductor film 111 of the first structure 140 is covered with the gate insulating film 119. This makes the semiconductor film 111 to be electrically insulated from the semiconductor film 113.

The line 150 functions as a bit line BL. A plurality of the lines 150 are arranged in the x-direction and extend in the y-direction. The line 150 is connected to the plurality of memory structures 110 through the contacts 151.

Then, with reference to FIG. 4 to FIG. 8, more specific configuration of the memory cell array MA will be described. For the convenience of a description, part of the configuration is omitted in FIG. 4 to FIG. 8.

Figure 4:
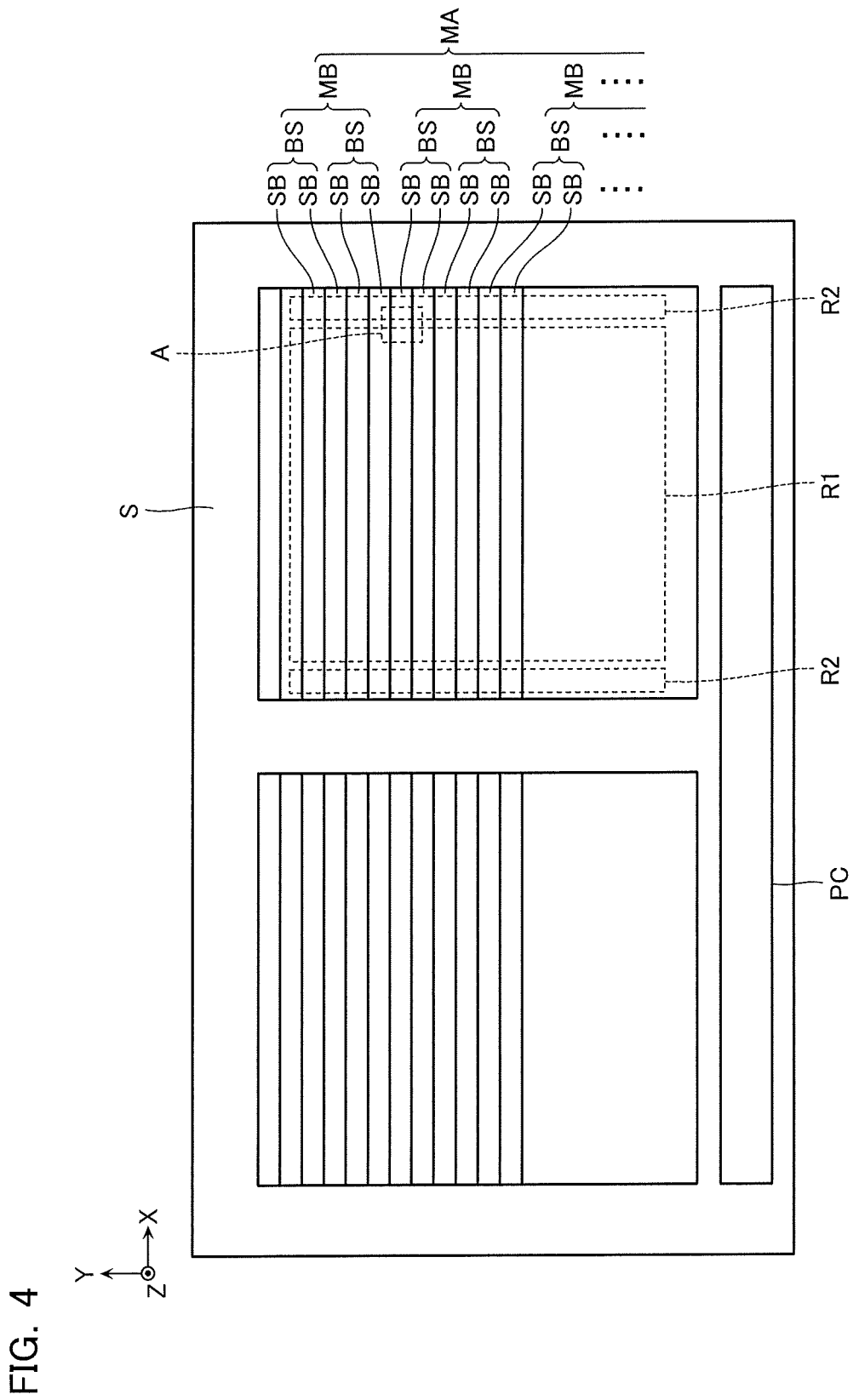
FIG. 4 is a schematic plan view of the same semiconductor memory device.

FIG. 4 is a schematic plan view of the semiconductor memory device according to the embodiment.

As shown in FIG. 4, on the substrate S, a plurality of memory cell arrays MA and a peripheral circuit PC are provided. In the illustrated example, two memory cell arrays MA are provided in line in the x-direction on the substrate S. The memory cell array MA comprises a plurality of memory blocks MB disposed in the y-direction. Also the plurality of memory blocks MB comprises a plurality of block structures BS disposed in the y-direction. Also the plurality of block structures BS comprises a plurality of subblocks SB disposed in the y-direction.

In a memory cell array MA, a region R1 provided with memory cells MC and regions R2 provided with contacts 130, etc. are provided.

Figure 5:
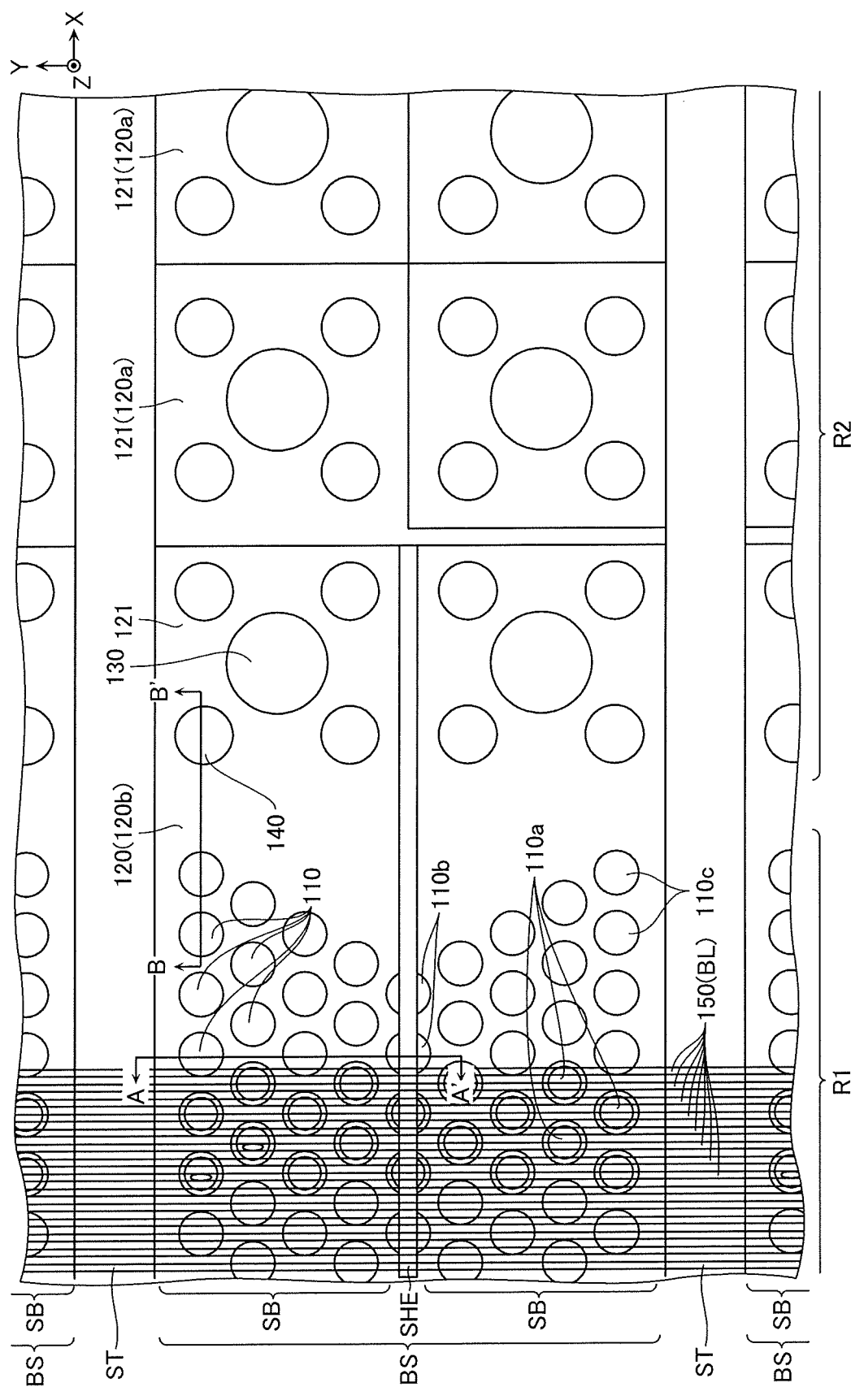
FIG. 5 is a schematic enlarged view of a part shown with A in FIG. 4.
Figure 6:
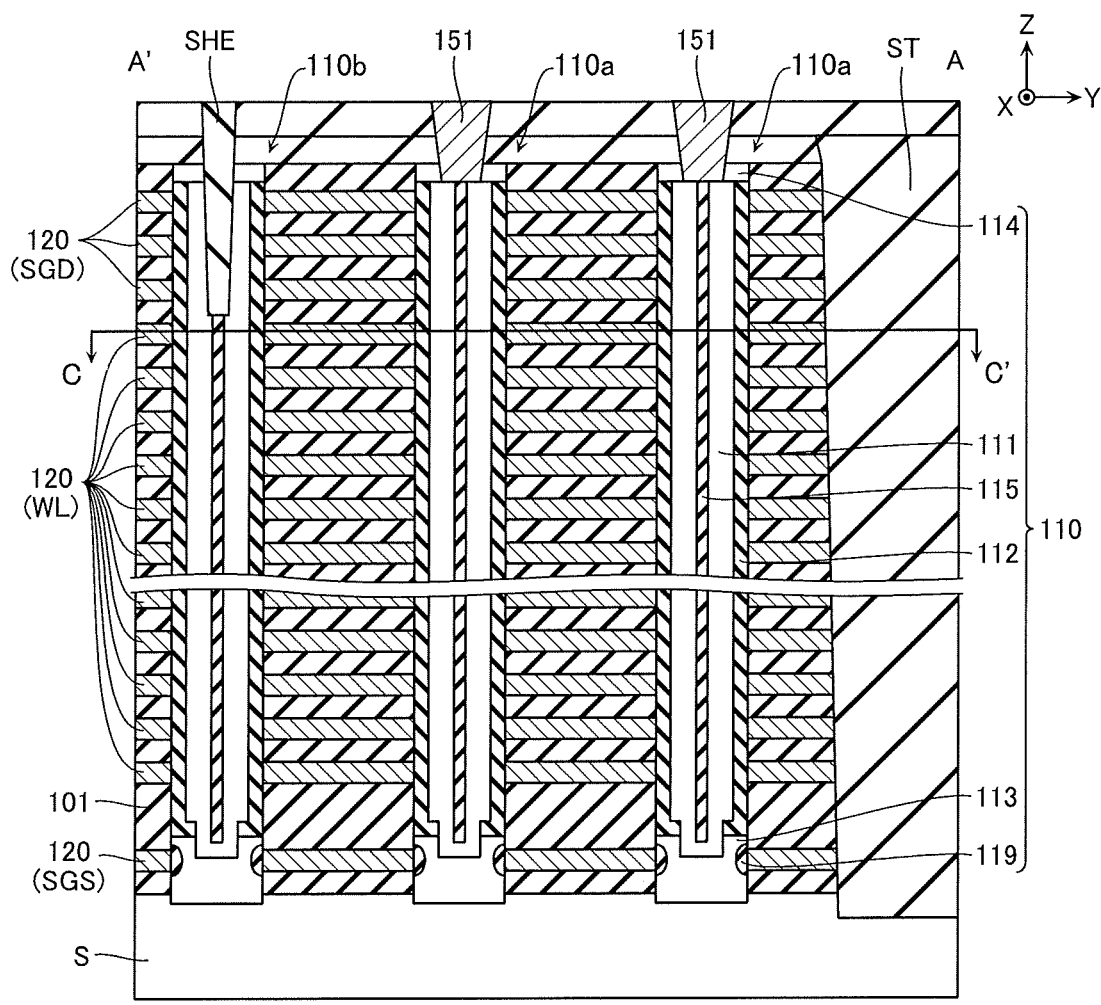
FIG. 6 is a schematic cross-sectional view of the structure cut with line A-A' in FIG. 5.
Figure 7:
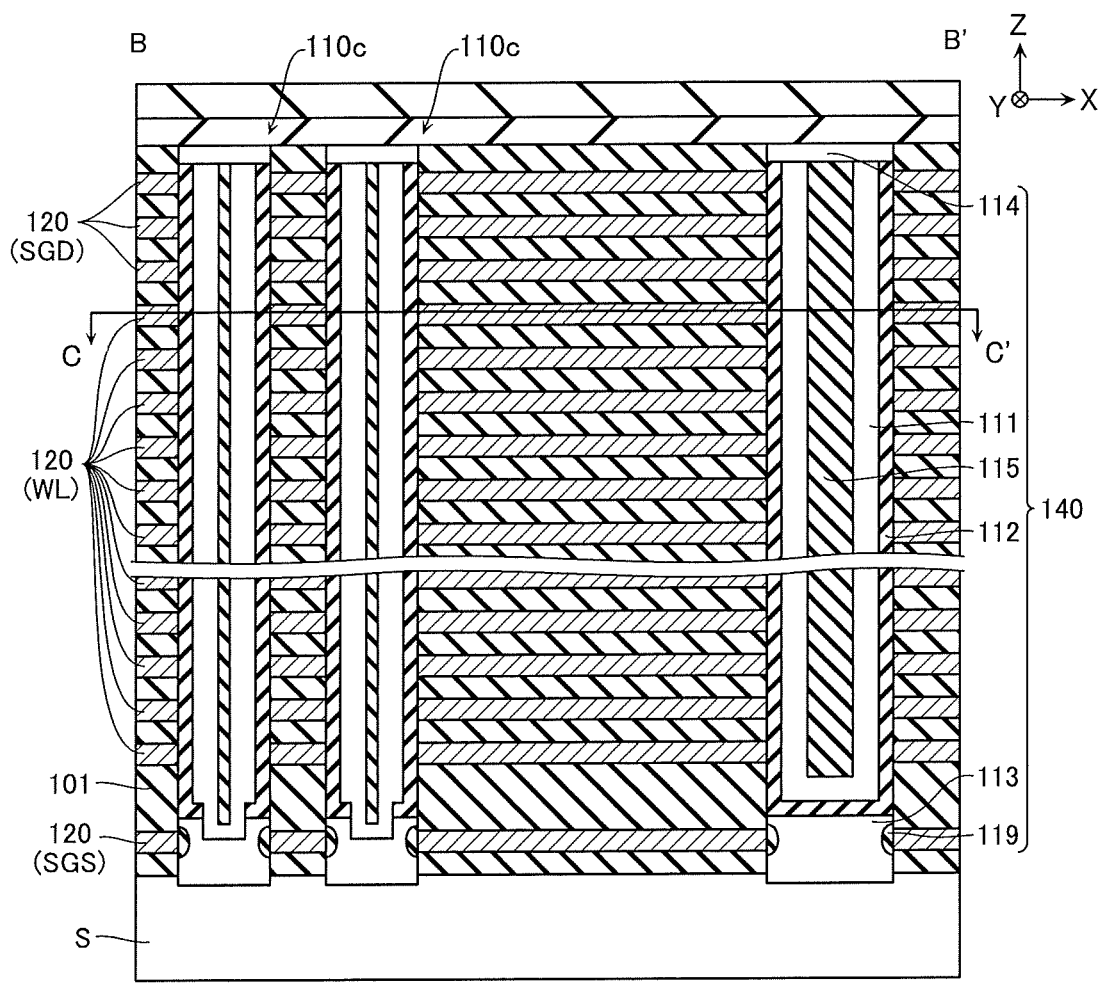
FIG. 7 is a schematic cross-sectional view of the structure cut with line B-B' in FIG. 5.

FIG. 5 is an enlarged view of a part shown with A in FIG. 4 and shows parts of the regions R1 and R2 described above. FIG. 6 is a schematic cross-sectional view cut a part illustrated with line A-A' in FIG. 5 and shown in a direction of arrows. FIG. 7 is a schematic cross-sectional view cut a part illustrated with line B-B' in FIG. 5 and shown in a direction of arrows.

In the region R1, as shown in FIG. 5, the plurality of block structures BS are provided adjacent in the y-direction with interposing insulating portions ST. Also each block structure BS comprises two subblocks SB adjacent in the y-direction with interposing an insulating portion SHE. In each block structure BS, the plurality of memory structures 110 are arranged in staggered pattern.

The plurality of memory structures 110 are electrically connected to the bit lines BL mainly. Such memory structures 110a function as memory units MU (FIG. 1).

Further, in the illustrated example, the insulating portion SHE is provided at part of memory structures 110b. As shown in FIG. 6, in such a memory structure 110b, a groove is formed at the upper end part of the semiconductor film 111, the upper end part of the gate insulating film 112, and the semiconductor film 114, and the insulating portion SHE is provided in the groove. Such a memory structure 110b is not electrically connected to a bit line BL and does not function as a memory unit MU. As shown in FIG. 5, a plurality of such memory structures 110b are disposed in the x-direction along the insulating portion SHE.

Further, in the illustrated example, part of memory structures 110c are provided in the vicinity of the region R2. Such a memory structure 110c may be electrically connected with a bit line BL and may be electrically insulated from a bit line BL. The memory structures 110c may or may not function as memory units MU.

In the region R2, a contact portion 121 of the conductive layer 120 is provided. In each contact portion 121, a contact 130 is provided, respectively. Further, in the vicinity of the contact 130, the first structure 140 is provided. The first structure 140 may have a larger outer diameter than that of the memory structure 110 as shown in FIG. 7, or may have a comparable outer diameter, or may have smaller outer diameter than that. Further, in the illustrated example, the first structure 140 is electrically insulated from the bit line BL.

Figure 8:
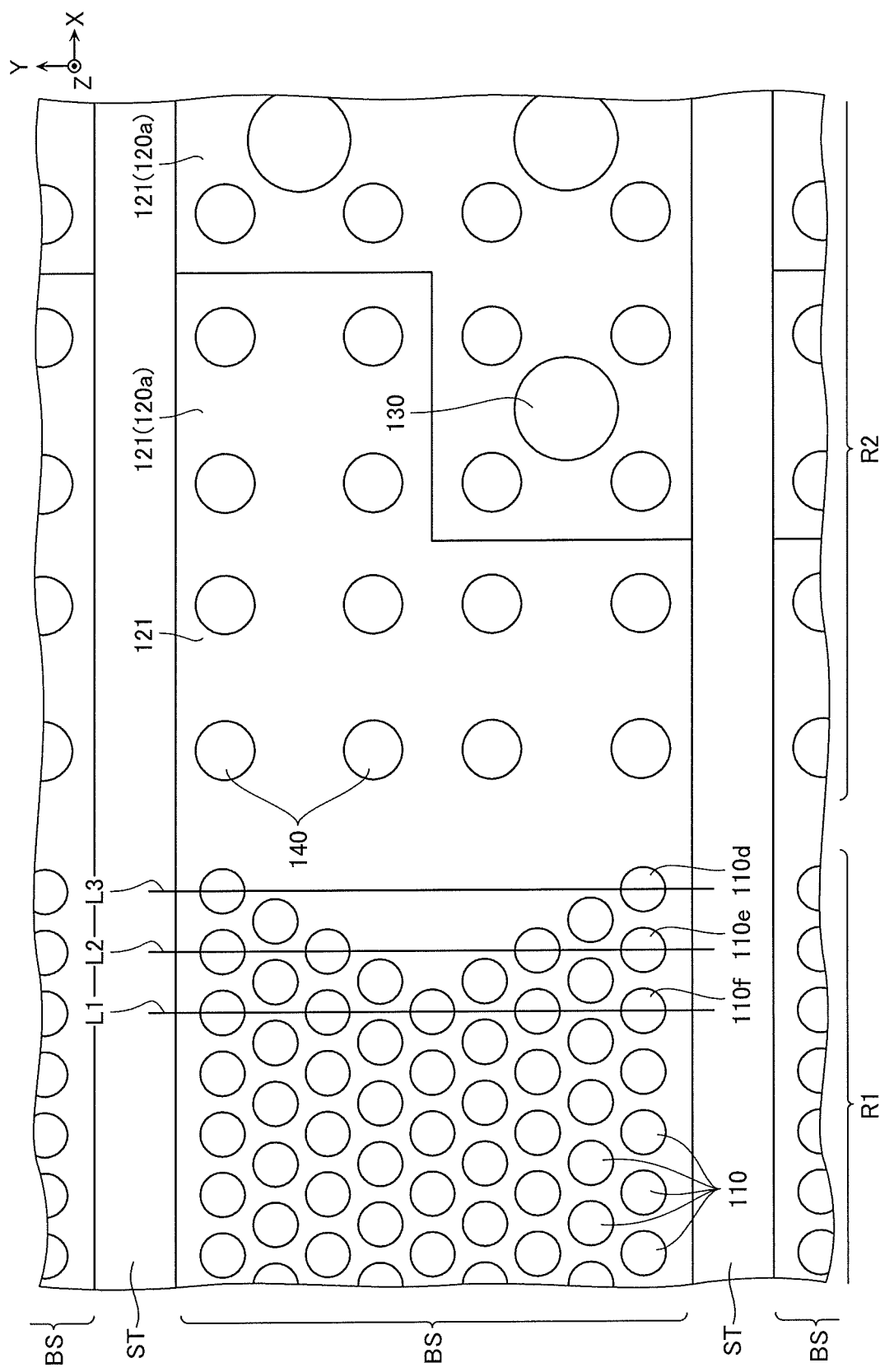
FIG. 8 is a schematic plan view of the same semiconductor memory device.

FIG. 8 is an x-y cross-sectional view of the structure described with reference to FIG. 5 to FIG. 7, and positions in the x-direction and y-direction correspond to that in FIG. 5. Also, a position in the z-direction corresponds to the line C-C' in FIG. 6 and FIG. 7.

In FIG. 8, straight lines L1, L2, and L3 extending in the y-direction are illustrated. These straight lines L1, L2, and L3 are imaginary lines. The straight lines L1, L2, and L3 are provided at an end in the x-direction of the region R1, the straight line L2 is closer to the region R2 than the straight line L1, and the straight line L3 is closer to the region R2 than the straight line L2. In the illustrated example, the straight lines L1, L2, and L3 are arranged at equal intervals in the x-direction corresponding to the plurality of memory structures 110 in line in the x-direction. In other words, the straight line L3 runs through the center position of the memory structure 110d which is the closest to the region R2 of the plurality of memory structures 110. The straight line L2 runs through the center position of the memory structure 110e which is adjacent to the memory structure 110d in the x-direction. The straight line L3 runs through the center position of the memory structure 110f which is adjacent to the memory structure 110e in the x-direction.

Here, when focusing on one block structure BS, 5 memory structures 110 are provided on the straight line L1, 4 memory structures 110 are provided on the straight line L2, and 2 memory structures 110 are provided on the straight line L3. In other words, in the embodiment, at the end in the x-direction of the region R1, as it comes closer to the region R2, number of the memory structures 110 is reduced gradually.

[Manufacturing Method]

Next, a manufacturing method of the semiconductor memory device according to the embodiment will be described with reference to FIG. 9 to FIG. 24. Note that FIGS. 9, 10, 12, 13, 16, 18, 20, and 22 to 24 show cross-sections corresponding to the line A-A' in FIG. 5, FIGS. 11, 14, 15, 17, 19, and 21 show cross-sections corresponding to the line B-B' in FIG. 5.

Figure 9:
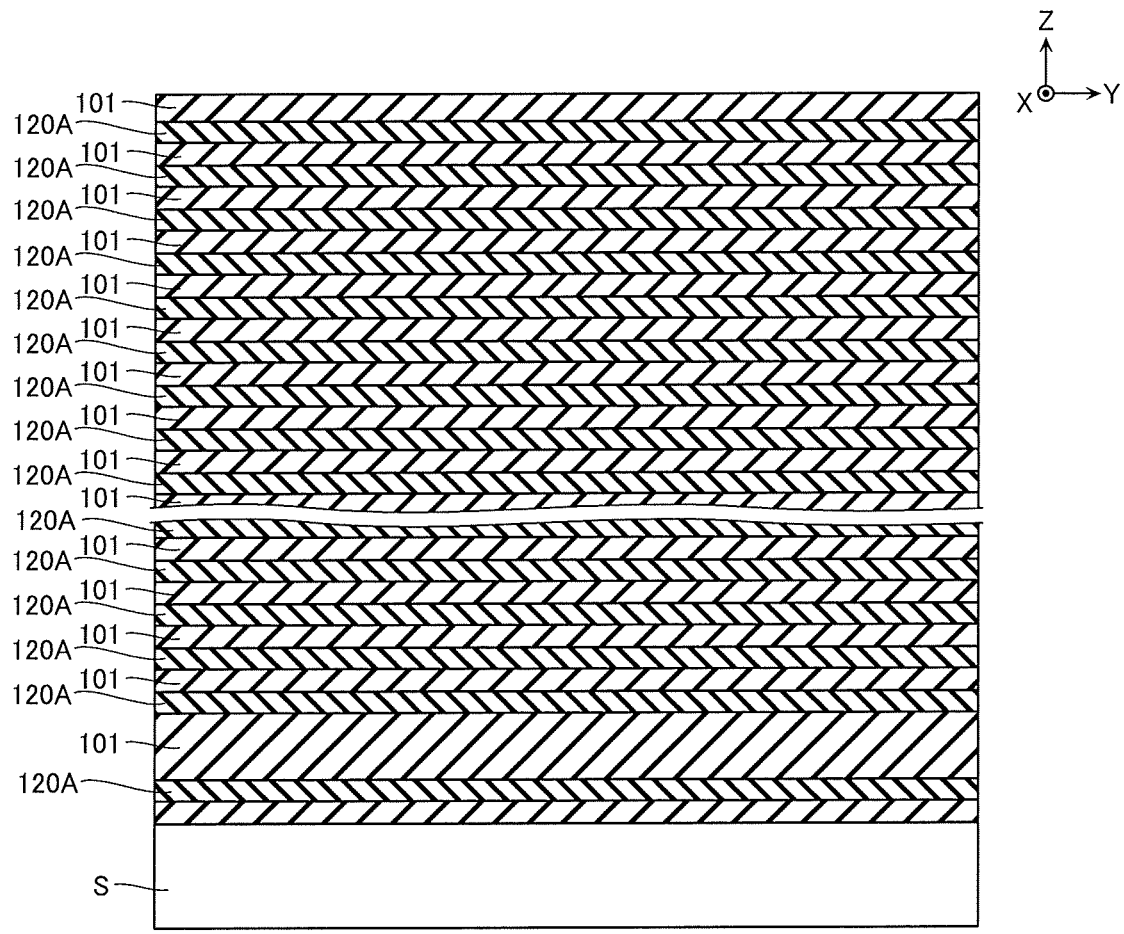
FIG. 9 is a schematic cross-sectional view showing a manufacturing method of the same semiconductor memory device.

As shown in FIG. 9, in the manufacturing method, a plurality of sacrifice layers 120A and insulating layers 101 are formed on the substrate S. The sacrifice layers 120A are composed of, for example, silicon nitride (SiN) and the like. This process is performed by, for example, a method such as CVD (Chemical Vapor Deposition).

Figure 10:
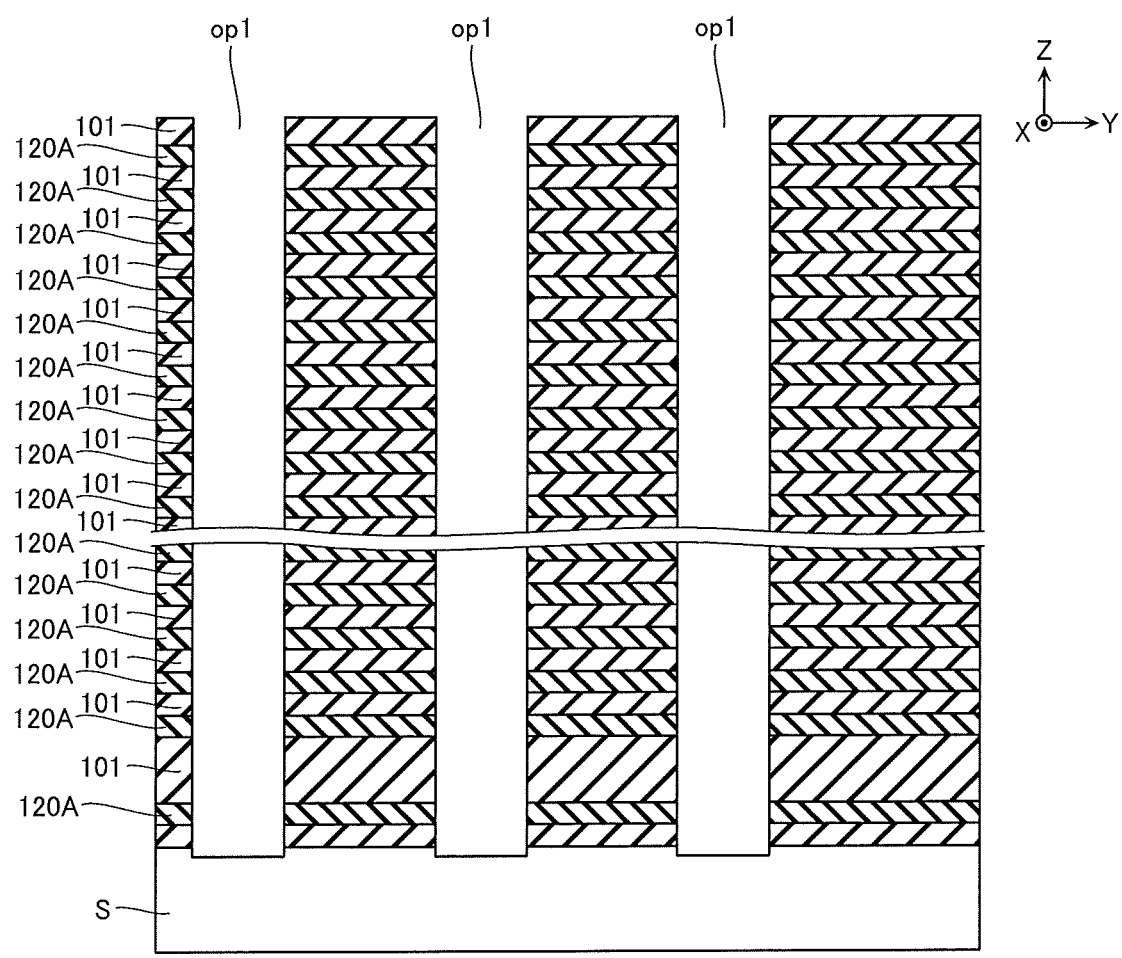
FIG. 10 is a schematic cross-sectional view showing the same manufacturing method.
Figure 11:
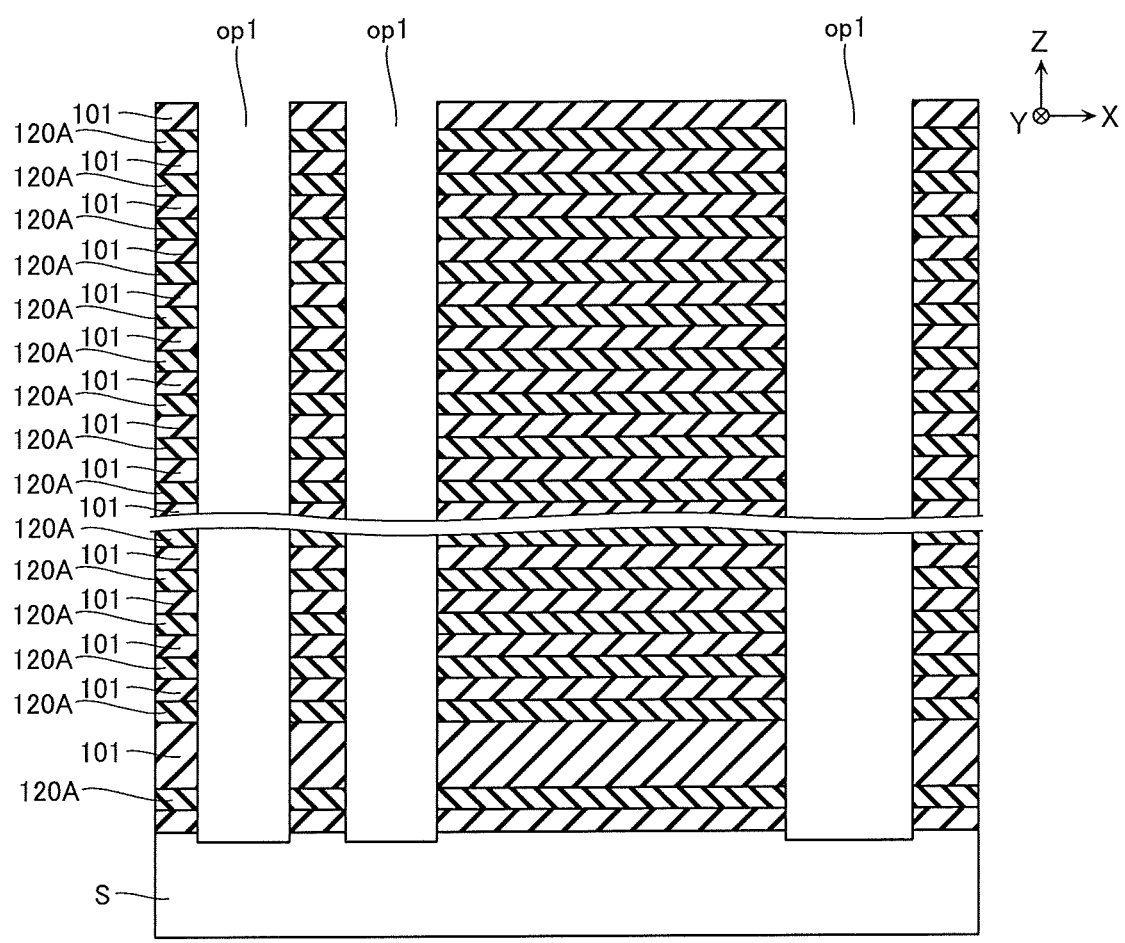
FIG. 11 is a schematic cross-sectional view showing the same manufacturing method.

Next, as shown in FIG. 10 and FIG. 11, a plurality of openings op1 are formed at the positions corresponding to the memory structures 110 and the first structures 140. The opening op1 is a through hole which extends in the z-direction, runs through the insulating layer 101 and the sacrifice layer 120A, and exposes the top surface of the substrate S. This process is performed by, for example, a method such as RIE (Reactive Ion Etching).

Figure 12:
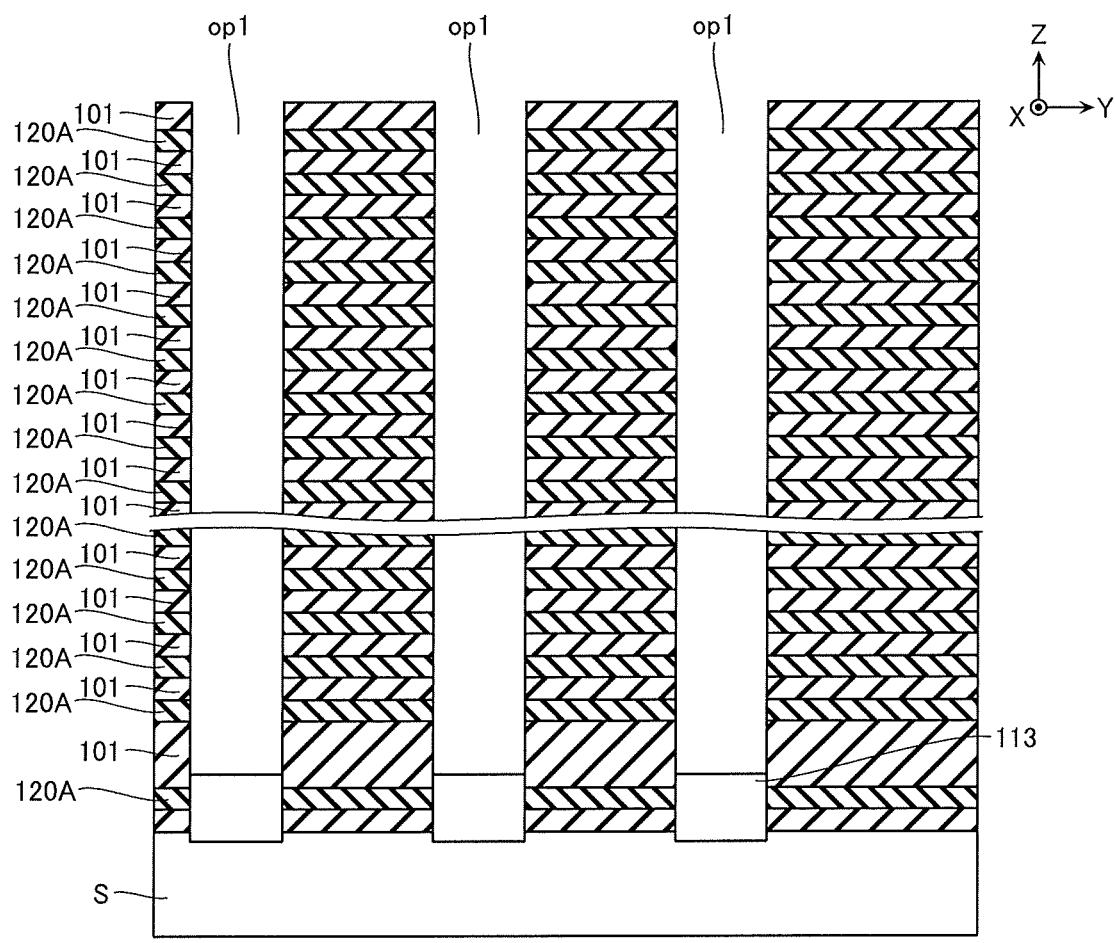
FIG. 12 is a schematic cross-sectional view showing the same manufacturing method.

Next, as shown in FIG. 12, semiconductor films 113 are formed on bottom surfaces of the openings op1. This process is performed by, for example, a method such as epitaxial growth.

Figure 13:
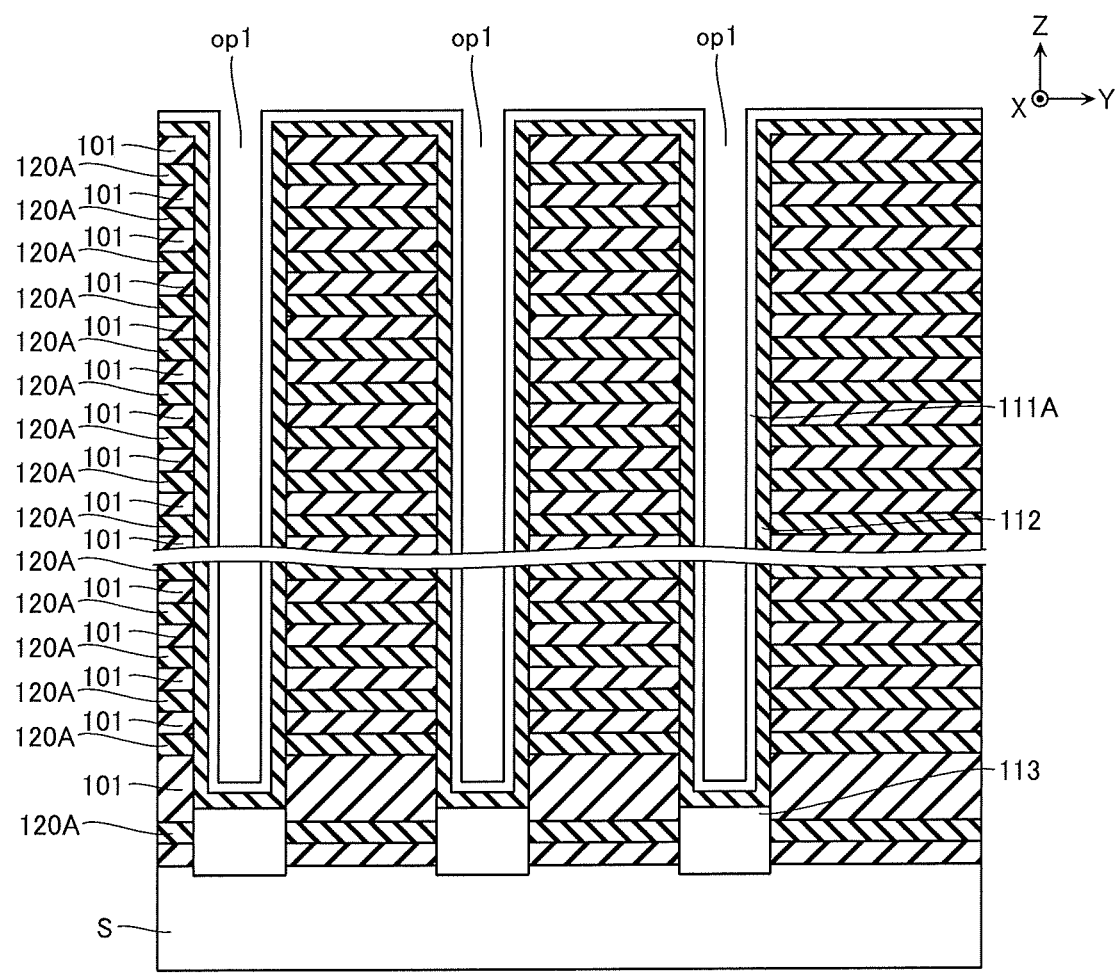
FIG. 13 is a schematic cross-sectional view showing the same manufacturing method.
Figure 14:
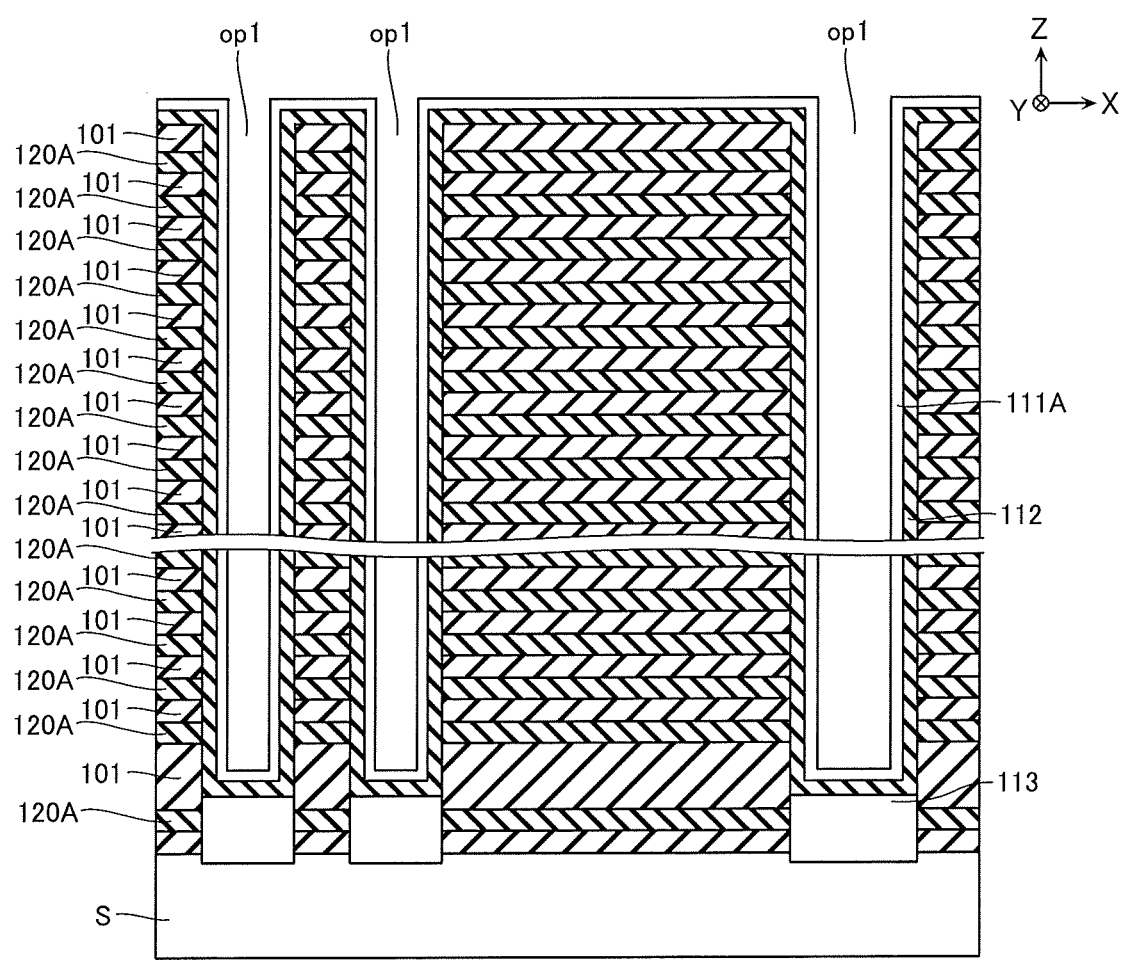
FIG. 14 is a schematic cross-sectional view showing the same manufacturing method.

Next, as shown in FIG. 13 and FIG. 14, on top surfaces of the semiconductor films 113 and inner peripheral surfaces of the openings op1, gate insulating films 112 and amorphous silicon films 111A are formed. This process is performed by, for example, a method such as CVD.

Figure 15:
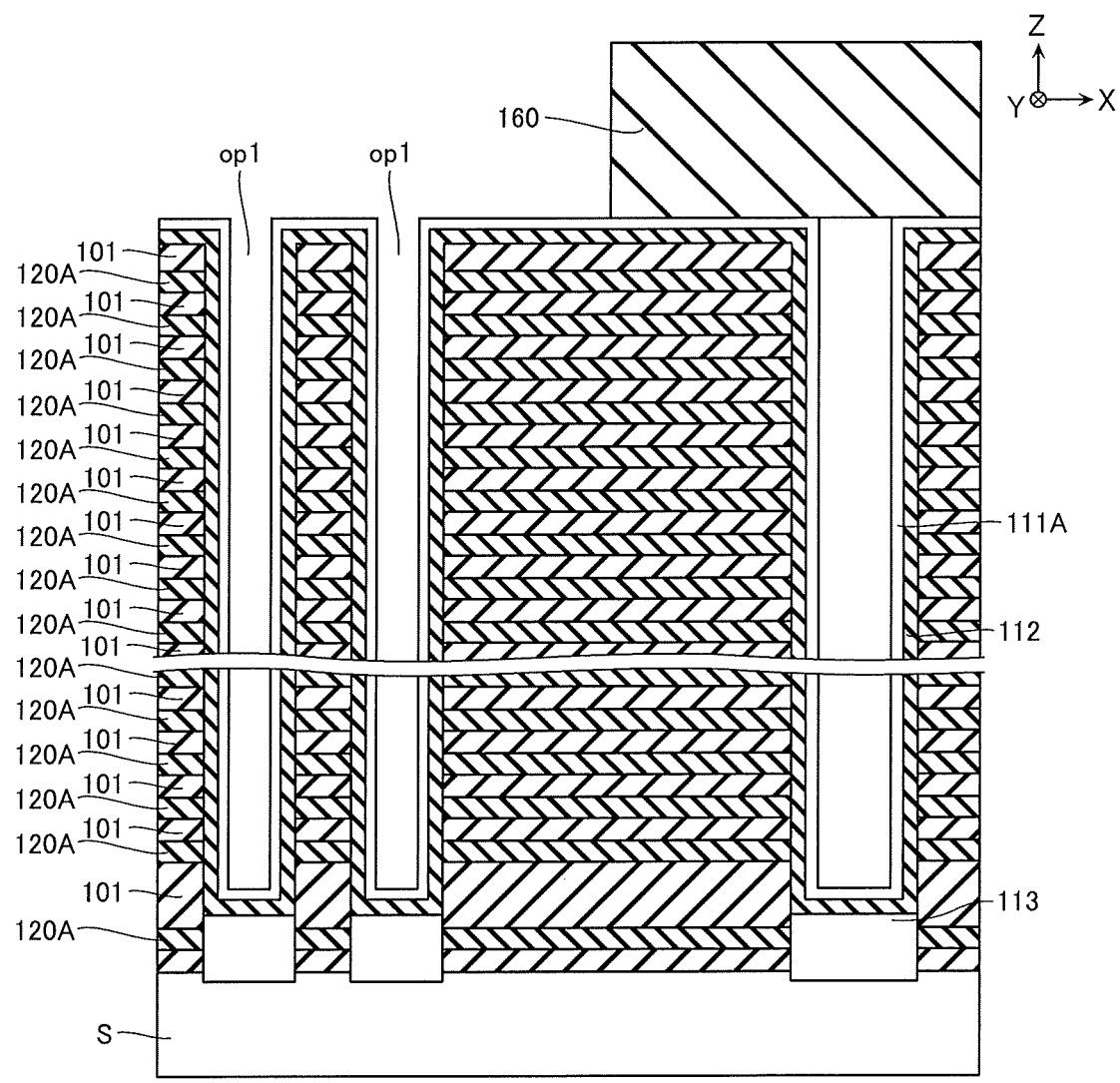
FIG. 15 is a schematic cross-sectional view showing the same manufacturing method.

Next, as shown in FIG. 15, among the openings op1, openings op1 corresponding to the first structures 140 are covered with a mask 160.

Figure 16:
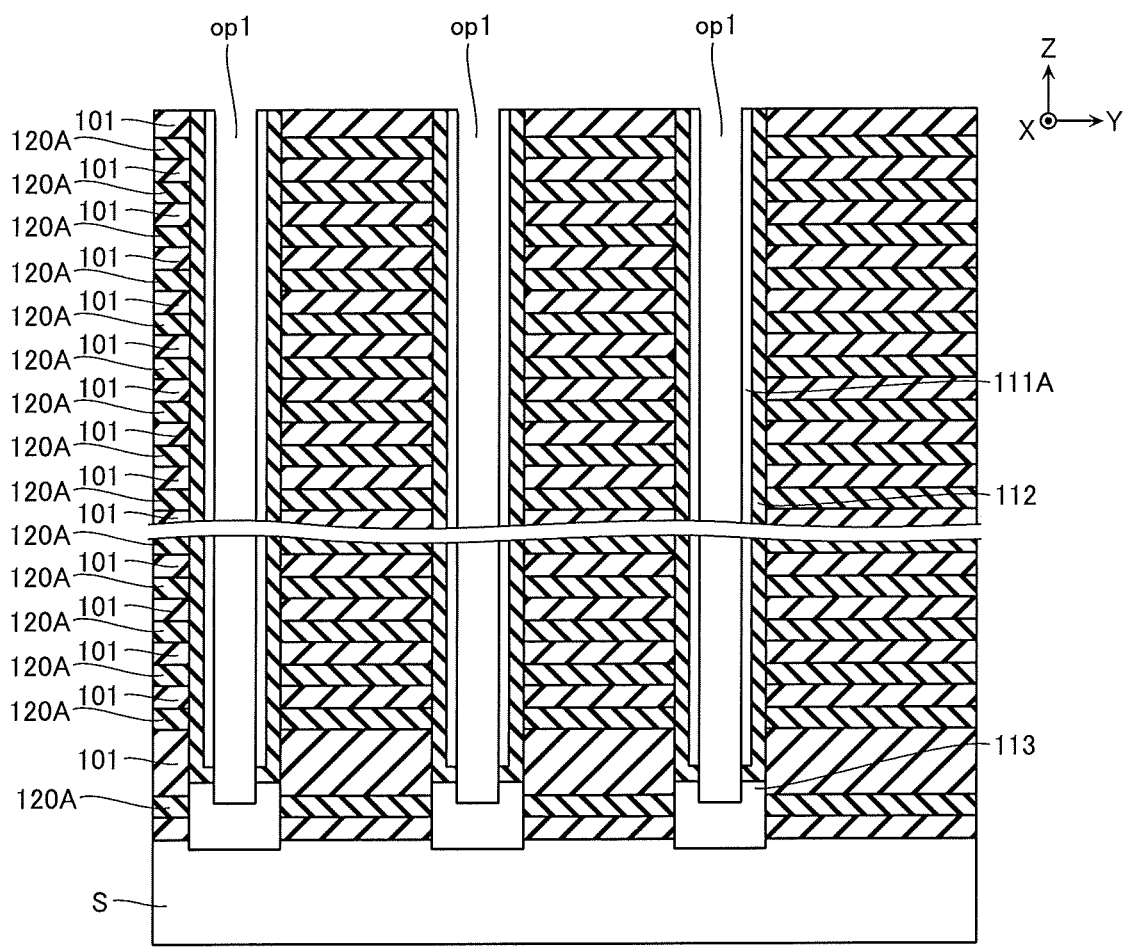
FIG. 16 is a schematic cross-sectional view showing the same manufacturing method.
Figure 17:
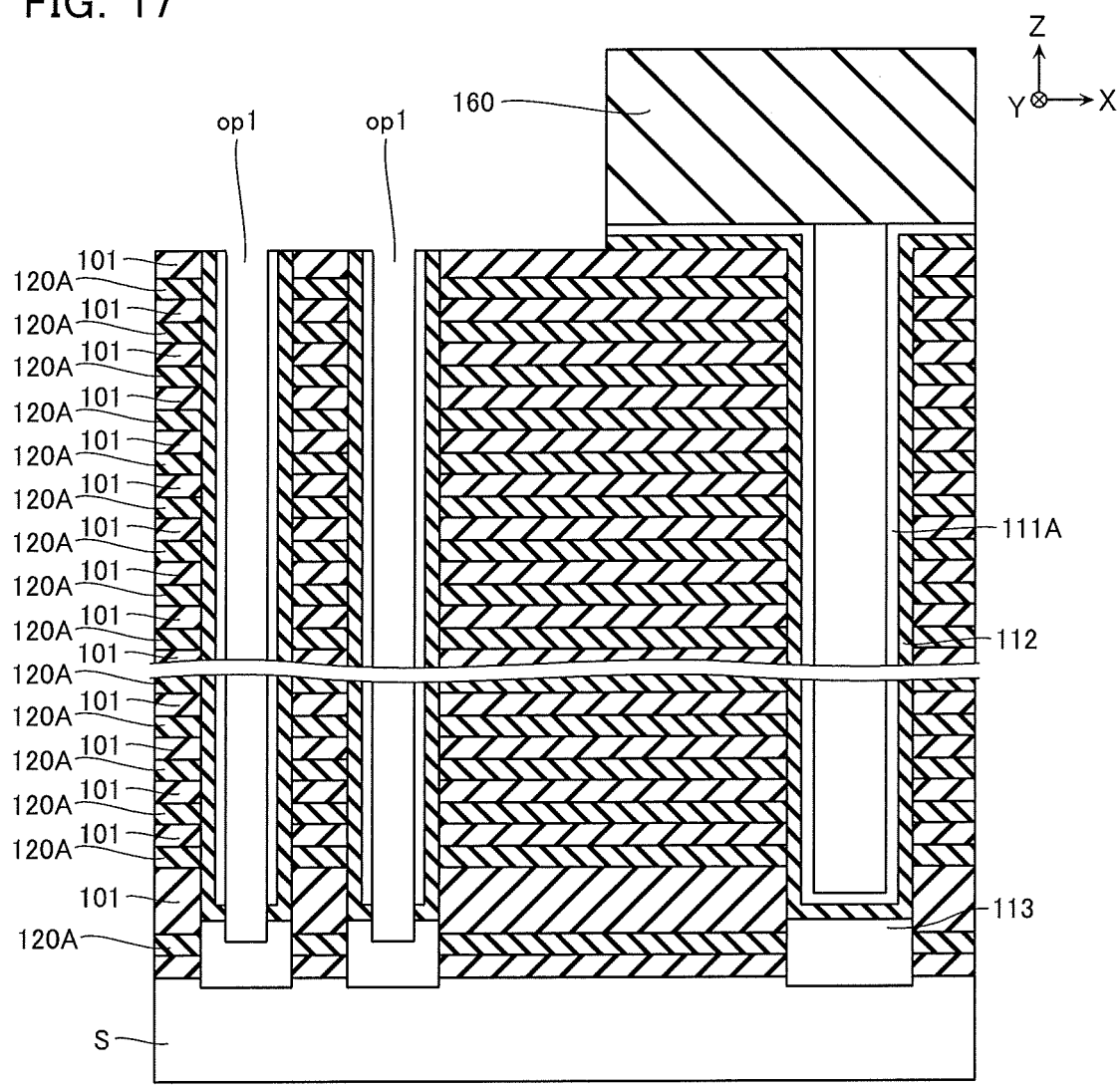
FIG. 17 is a schematic cross-sectional view showing the same manufacturing method.

Next, as shown in FIG. 16 and FIG. 17, portions of the gate insulating films 112 and the amorphous silicon films 111A covering the top surfaces of the semiconductor films 113 are removed. This process is performed by, for example, a method such as RIE. After that, the mask 160 is removed.

Figure 18:
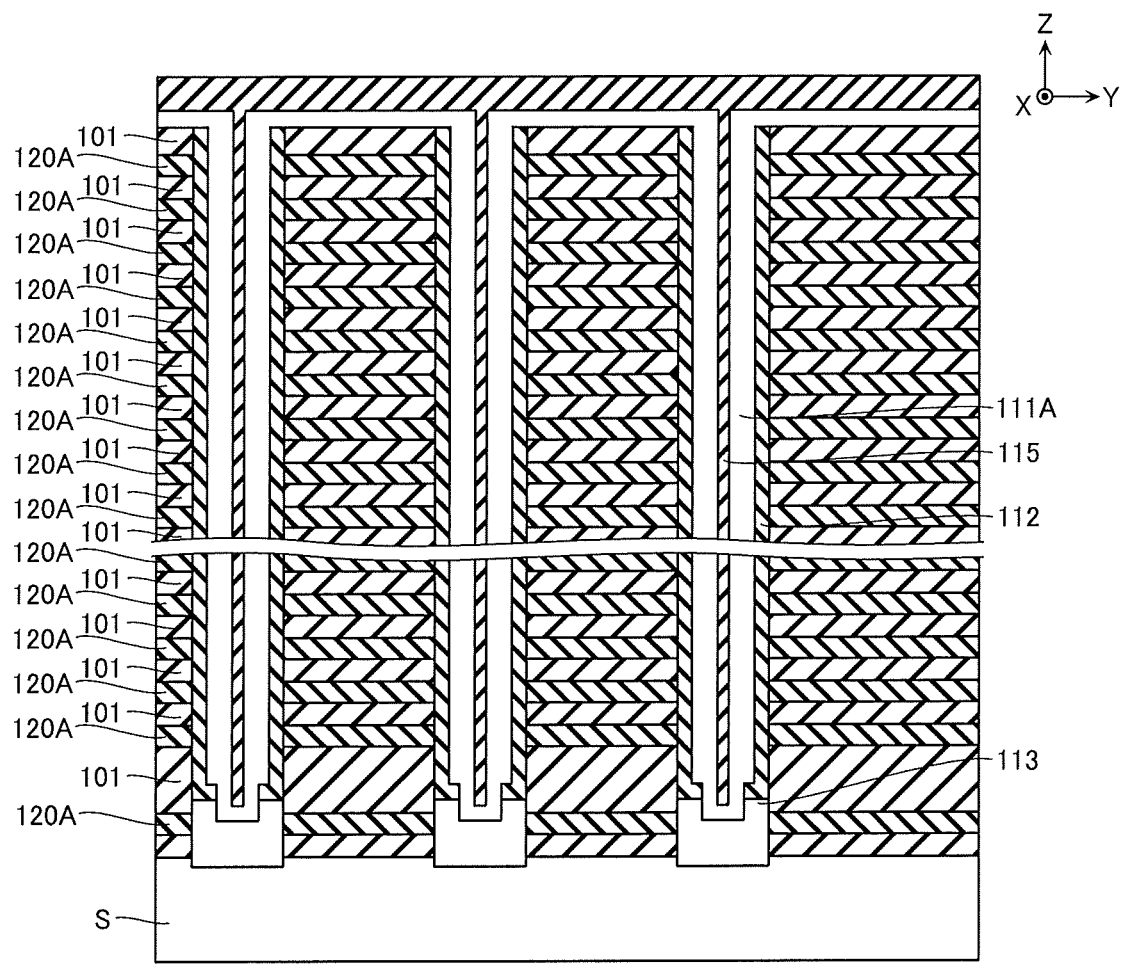
FIG. 18 is a schematic cross-sectional view showing the same manufacturing method.
Figure 19:
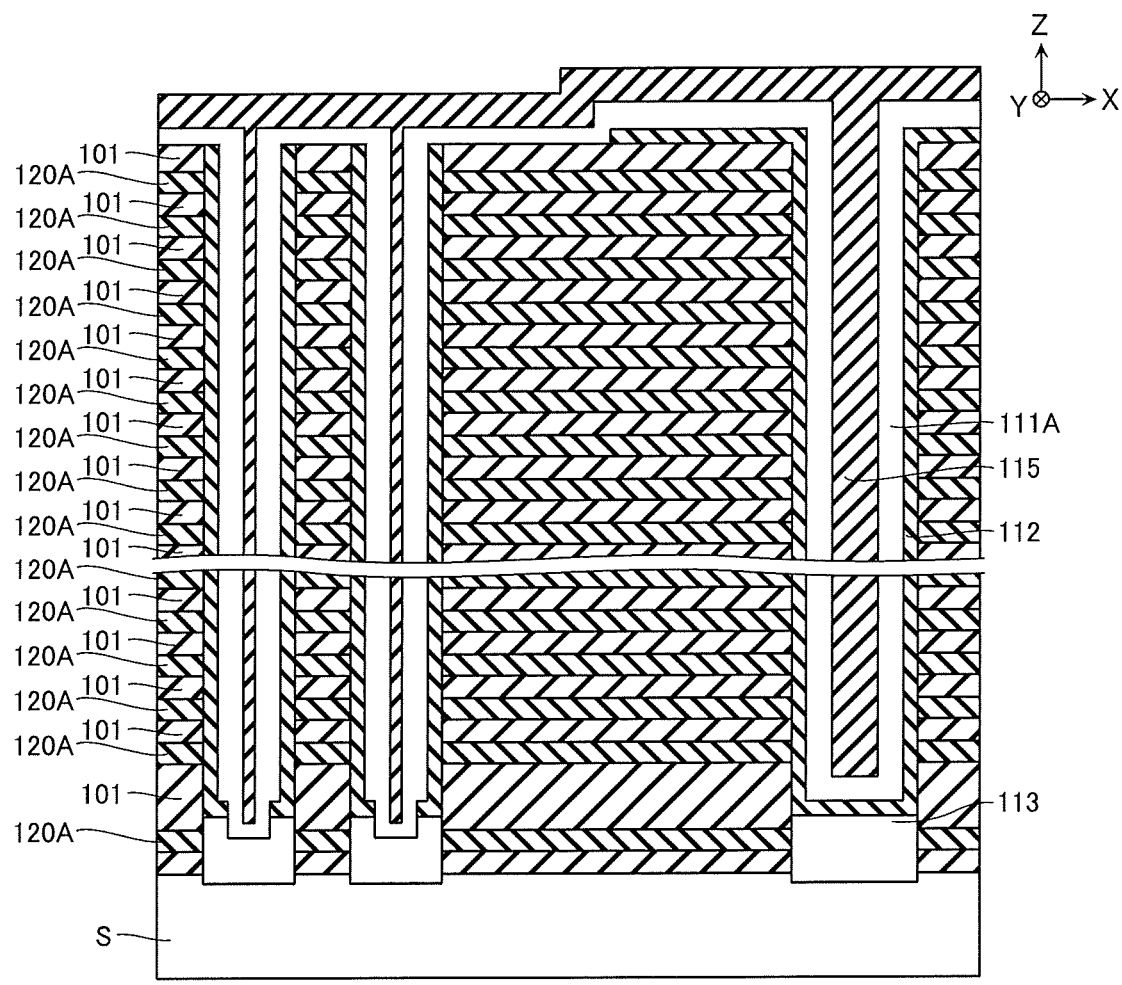
FIG. 19 is a schematic cross-sectional view showing the same manufacturing method.

Next, as shown in FIG. 18 and FIG. 19, on the top surfaces of the semiconductor films 113 and inner peripheral surfaces of the amorphous silicon film 111A, an amorphous silicon film 111A and an insulating film 115 are formed. This process is performed by, for example, a method such as CVD. After that, the crystal structure of the amorphous silicon films 111A is reformed by an annealing process and the like to form the semiconductor film 111.

Figure 20:
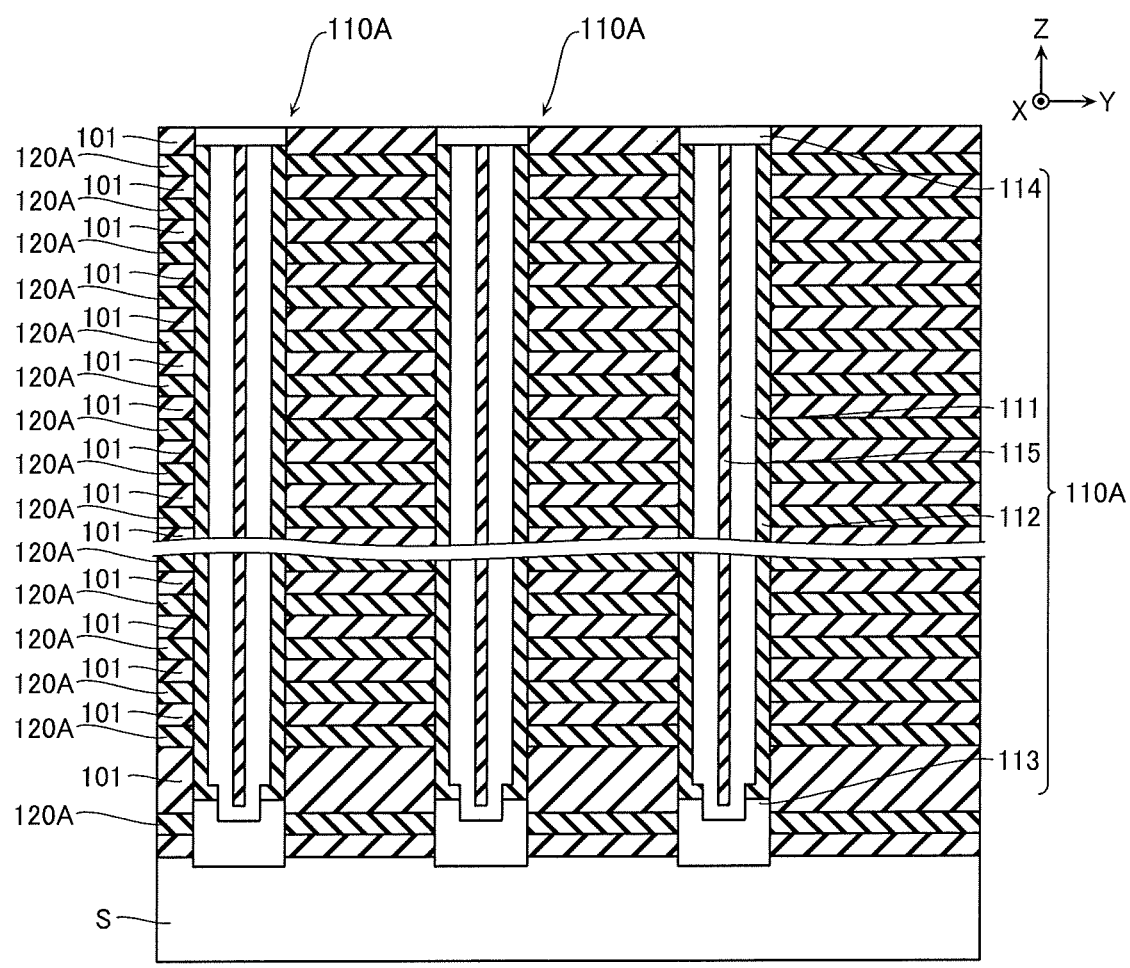
FIG. 20 is a schematic cross-sectional view showing the same manufacturing method.
Figure 21:
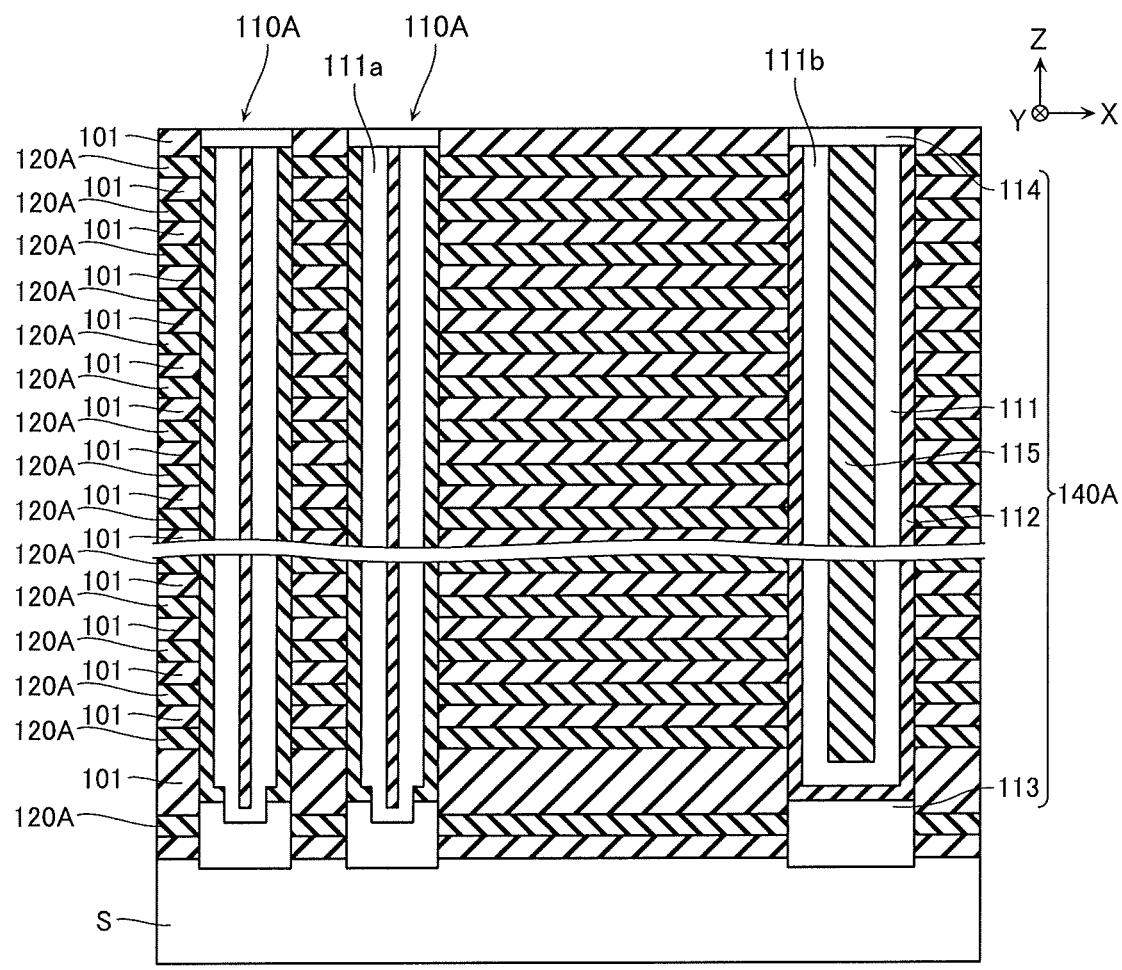
FIG. 21 is a schematic cross-sectional view showing the same manufacturing method.

Next, as shown in FIG. 20 and FIG. 21, an insulating layer 101 located as the top layer is exposed through removing parts of the insulating film 115, the semiconductor film 111, and the gate insulating films 112. Further, in the vicinity of the top end of the openings op1, semiconductor films 114 are formed. Thereby, approximately cylindrical structures 110A and 140A are formed. This process is performed by, for example, a method such as RIE and CVD.

Figure 22:
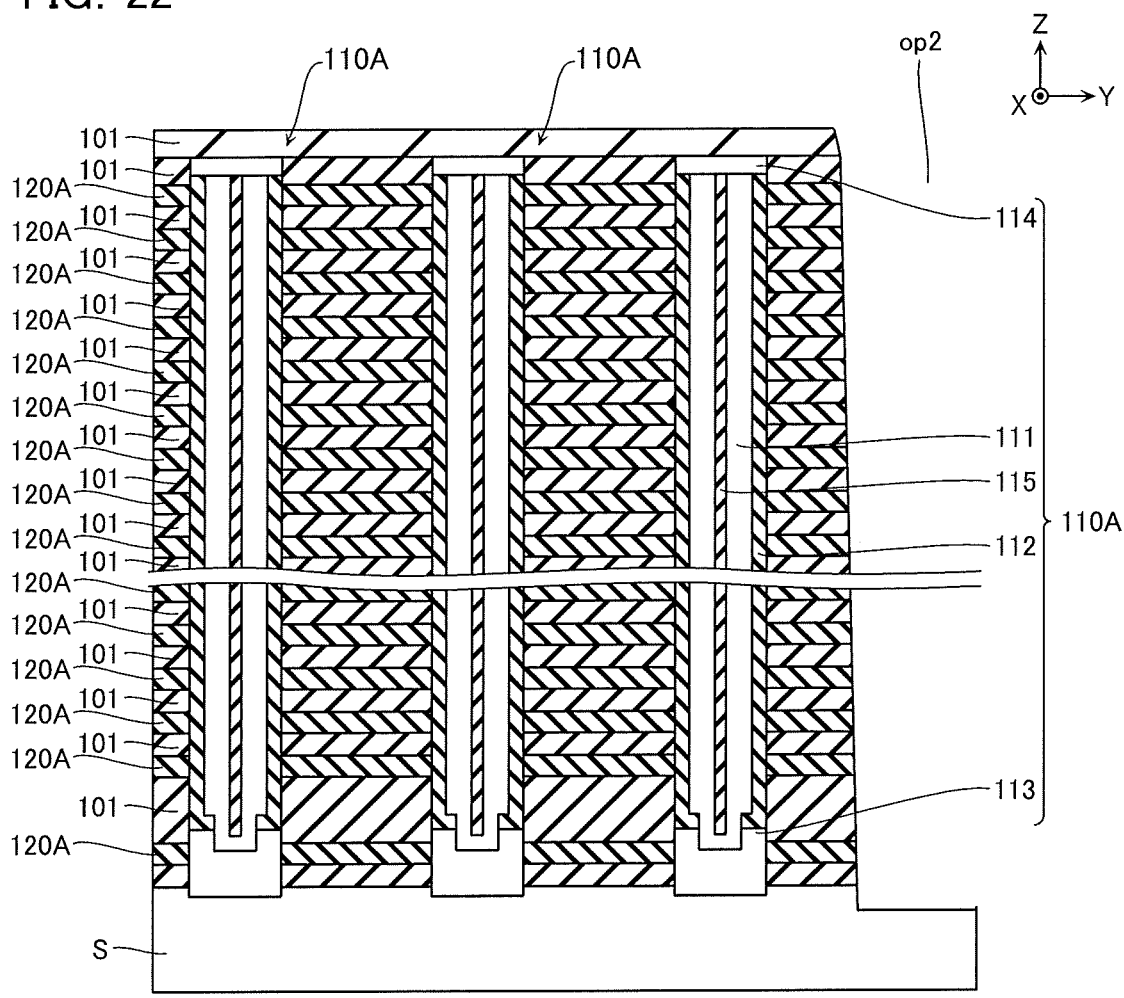
FIG. 22 is a schematic cross-sectional view showing the same manufacturing method.

Next, as shown in FIG. 22, openings op2 are formed. The opening op2 is a groove which extends in the z-direction and the x-direction, divides the insulating layers 101 and the sacrifice layers 120A in the y-direction, and exposes the top surface of the substrate S. This process is performed by, for example, a method such as RIE.

Figure 23:
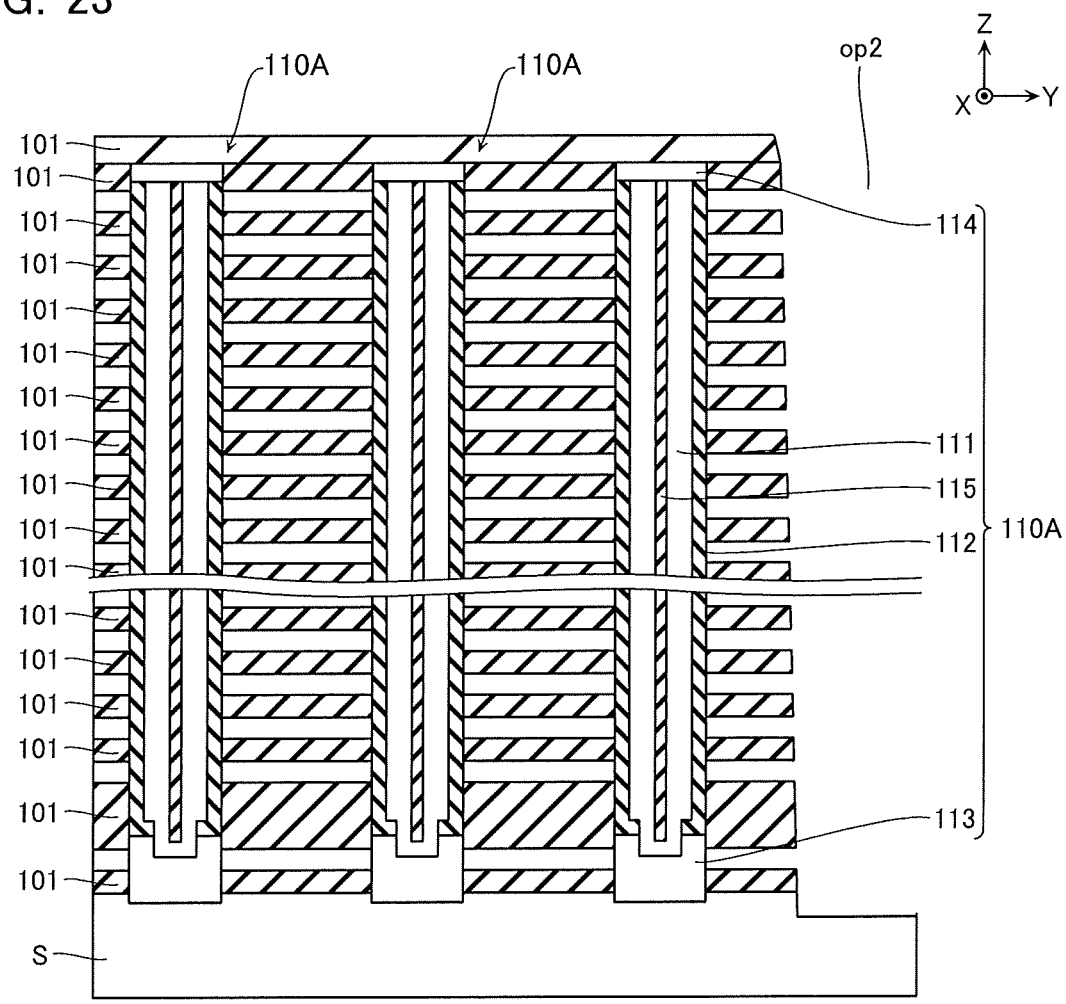
FIG. 23 is a schematic cross-sectional view showing the same manufacturing method.

Next, as shown in FIG. 23, through the openings op2, the sacrifice layers 120A are removed. Thereby, hollow structures are formed, which includes a plurality of insulating layers 101 disposed in the z-direction and structures 110A and 140A supporting the insulating layers 101. This process is performed by, for example, a method such as wet etching.

Figure 24:
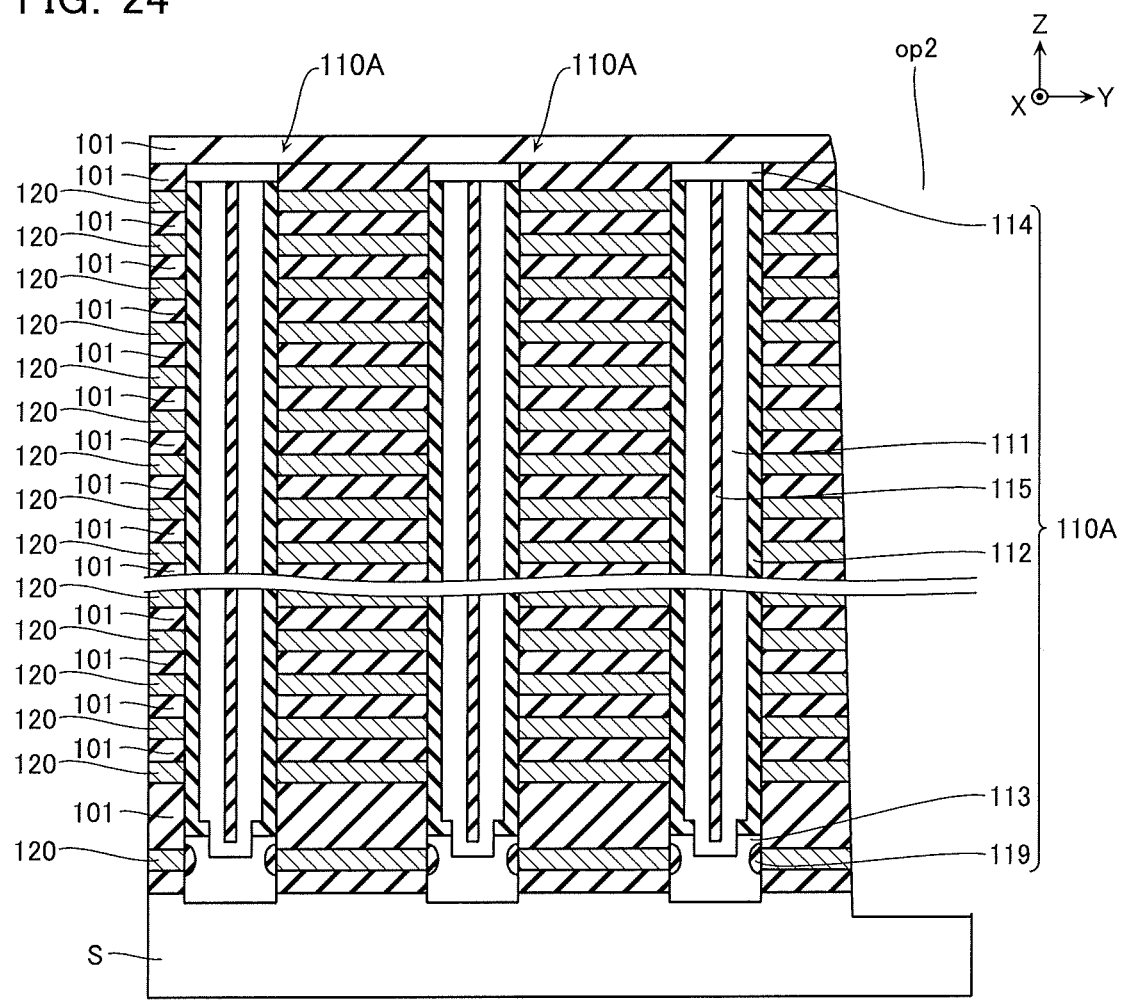
FIG. 24 is a schematic cross-sectional view showing the same manufacturing method.

Next, as shown in FIG. 24, gate insulating films 119 and conductive layers 120 are formed. Forming of the gate insulating films 119 is performed by, for example, a method such as oxidation. Forming of the conductive layers 120 is performed by, for example, a method such as CVD.

After that, through forming insulating portions ST of silicon oxide and the like in the openings op2 and forming contacts, lines, and the like, the configuration described with reference to FIG. 4 to FIG. 8 is formed.

[Advantages]

As described above, in the process shown in FIG. 23, through removing the sacrifice layers 120A, the hollow structures are formed, which include the plurality of insulating layers 101 and the structures 110A and 140A. The structures 140A, in this condition, have a role supporting an end and the like of the insulating layers 101 in the x-direction.

Here, as described with reference to FIG. 2 and the like, the first structures 140 corresponding to the structures 140A are provided in the vicinity of the contacts 130. Therefore, in a manufacturing process, it is conceivable that when positions of the contacts 130 are misaligned, the contacts 130 contact to the semiconductor films 111 in the first structures 140. In this case, it is conceivable that the contacts 130 are electrically connected to the substrate S through the semiconductor films 111 and it becomes impossible to apply voltage to the conductive layers 120.

Therefore, in the embodiment, in the process shown in FIG. 15, the opening op1 corresponding to the first structure 140 is covered with the mask 160. Further, in the processes shown in FIGS. 16-19, for the openings op1 corresponding to the memory structures 110, the semiconductor films 111 are formed, which is electrically connected to the semiconductor films 113, and for the openings op1 corresponding to the first structures 140, semiconductor films 111 are formed, which is electrically insulated from the semiconductor films 113. Therefore, even if the contacts 130 contact the semiconductor films 111 in the first structures 140, the contacts 130 can be electrically insulated from the substrate S.

Here, as described above, the process shown in FIG. 22 is performed by, for example, a method such as RIE. In this case, ions for processing are emitted, for example, to a structure shown in FIG. 21. These ions are accumulated in masks which are not shown and the like. Here, because the semiconductor films 111a corresponding to the memory structures 110 are electrically connected to the substrate S, electrons move in a direction in which the electrons cancel effect of electric charge by the ions. On the other hand, because the semiconductor films 111b corresponding to the first structure 140 are electrically insulated from the substrate S, such movement of electrons does not occur. Thereby, imbalance of electric charge occurs between structures 110A and 140A. When such imbalance of electric charge reaches a level equal to or more than a predetermined level, it is conceivable that the ions for processing reaches portions which are not intended to process, and it causes the openings OP2 to be distorted.

Therefore, in the embodiment, as described with reference to FIG. 8, at the end in the x-direction of the region R1, the memory structures 110 are arranged, with a pattern that as it comes closer to the region R2, number of the memory structures 110 is reduced gradually. According to such configuration, reducing effect of the imbalance of electric charge between the end in the x-direction of the region R1 and the end in the x-direction of the region R2 enables the distortion of the openings OP2 as described above to be restrained. Thereby, it is possible to reduce a manufacturing cost and to provide with the semiconductor memory device at a moderate price.

Another Examples of the First Embodiment

In the example in FIG. 8, the imaginary straight line L3 runs through the center position of the memory structure 110d which is the closest to the region R2. However, the straight line L3 may run through the center position of the memory structure 110e, and may run through the center position of other memory structure 110.

Figure 25:
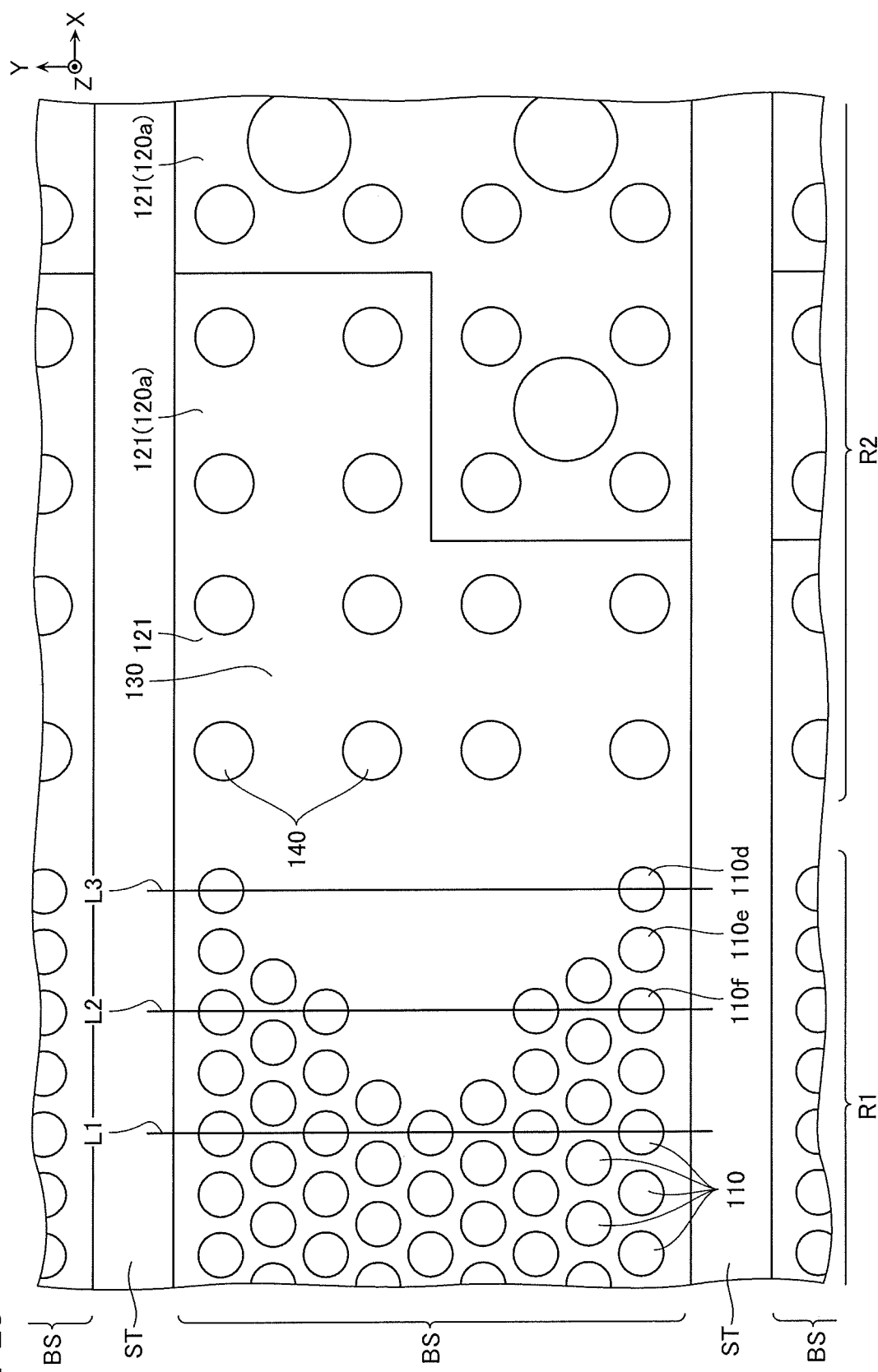
FIG. 25 is a schematic plan view of a semiconductor memory device according to another example.
Figure 26:
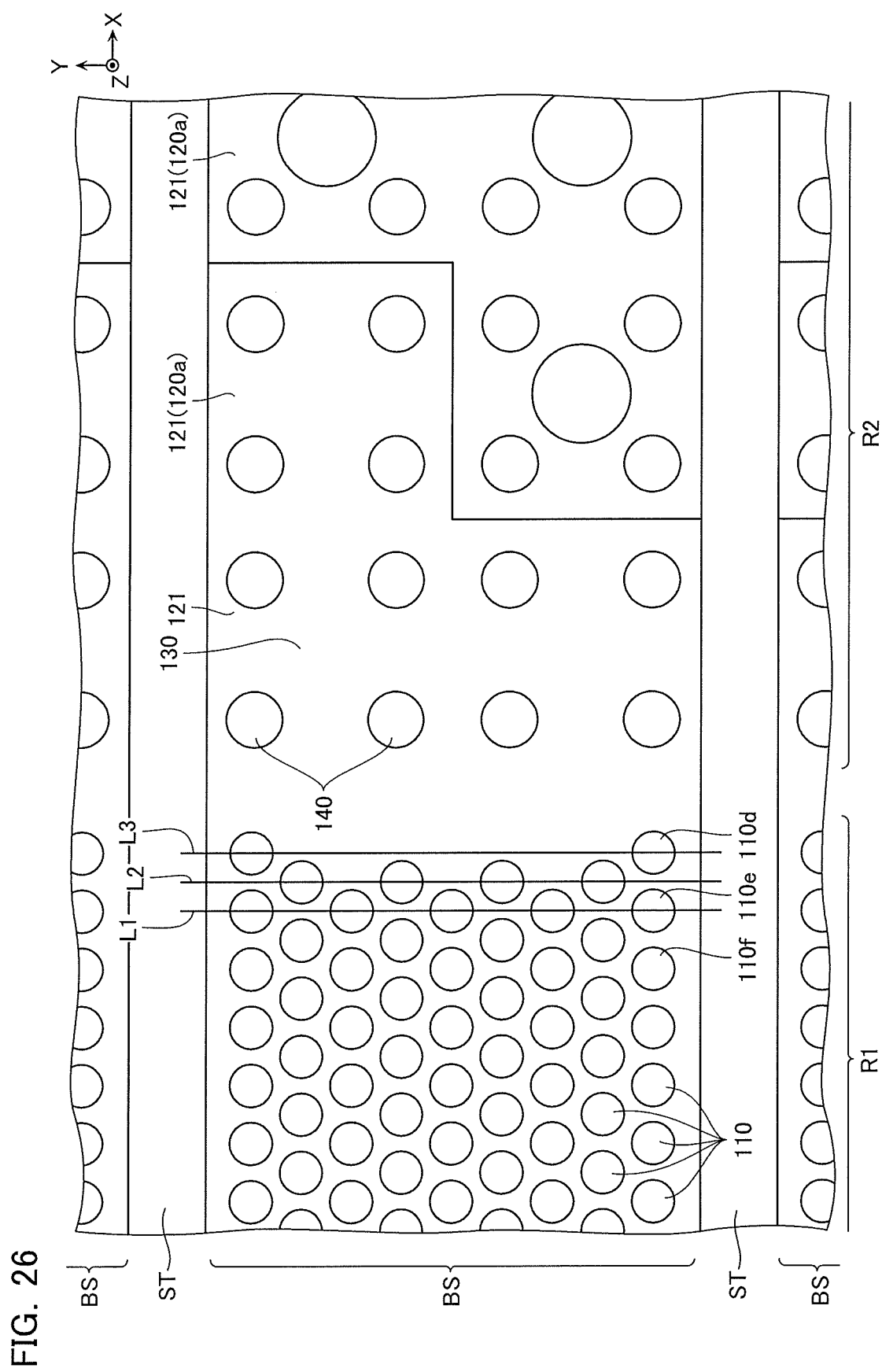
FIG. 26 is a schematic plan view of a semiconductor memory device according to another example.

Further, in the example in FIG. 8, the imaginary straight lines L1, L2, and L3 are in line in the x-direction corresponding to the plurality of memory structures 110 in line in the x-direction. However, the straight lines L1, L2, and L3 are only required to be in line at equal intervals in the x-direction. For example, as illustrated in FIG. 25, the straight lines L1, L2, and L3 may be selected so that they run through center positions of the memory structures 110 selected alternately from a plurality of memory structures 110 in line in the x-direction. In such a case, for example, the straight line L3 may run through the center position of the memory structure 110d (FIG. 8), and the straight line L2 may run through the center position of the memory structure 110f (FIG. 8). Further, the straight lines L1, L2, and L3 may correspond to half pitch of those of the plurality of memory structures 110 in line in the x-direction. In such a case, for example as illustrated in FIG. 26, the straight line L3 may run through the center position of the memory structure 110d (FIG. 8), the straight line L1 may run through the center position of the memory structure 110e (FIG. 8), and the straight line L2 may be provided between them.

Further, in the example in FIG. 8, with focusing on one block structure BS, number of the memory structures 110 on the straight lines L1, L2, and L3 has been determined. However, for example, based on another unit such as one subblock SB, the number of the memory structures 110 on the straight lines L1, L2, and L3 may be determined.

Further, in the example described above, the memory structure 110c (FIG. 5, FIG. 7) has had the same form and size as those of the memory structures 110a and 110b (FIG. 5, FIG. 6). However, the memory structure 110c may have a different form and size from those of the memory structures 110a and 110b (FIG. 5, FIG. 6).

Second Embodiment

Figure 27:
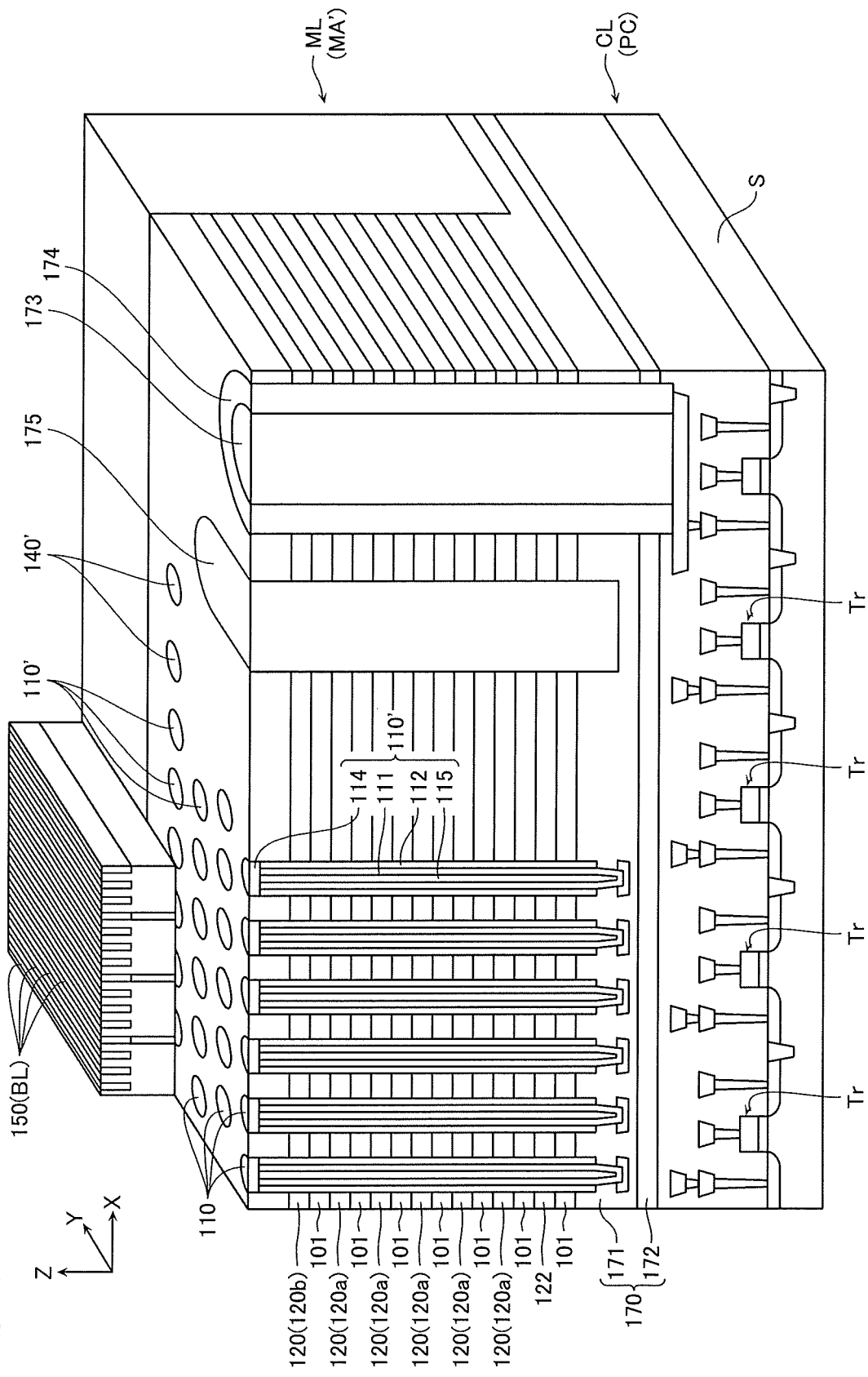
FIG. 27 is a schematic perspective view of a semiconductor memory device according to a second embodiment.

[Configuration]
FIG. 27 is a schematic perspective view of the semiconductor memory device according to a second embodiment. For the convenience of a description, a part of the configuration is omitted in FIG. 27. Note that in the description below, portions similar to in the first embodiment will be assigned with the same reference symbols as in the first embodiment, and descriptions thereof will be omitted.

As shown in FIG. 27, the semiconductor memory device according to the embodiment comprises a substrate S, a circuit layer CL provided above the substrate, and a memory layer ML provided above the circuit layer CL.

The circuit layer CL comprises a plurality of transistors provided on the substrate S and a plurality of wirings connected to the plurality of transistors. The plurality of the transistors and the wirings function as the peripheral circuit PC (FIG. 1).

The memory layer ML functions as the memory cell array MA'. The memory cell array MA according to the embodiment comprises a plurality of memory structures 110' extending in the z-direction, a plurality of conductive layers 120 covering the peripheral faces of the plurality of memory structures on an x-y cross-section, a conductive layer 122 provided under the plurality of conductive layers 120, and a conductive layer 170 provided under the conductive layer 122. Additionally, the memory cell array MA' comprises a plurality of lines 150 connected to a top end of the memory structures 110'. Additionally, the memory cell array MA' comprises a contact 173 extending in the z-direction, an insulating film 174 covering the peripheral face of the contact 173, insulating films 175 provided between the contact 173 and the plurality of the memory structures 110', and a plurality of first structures 140' provided between the insulating films 175 and the plurality of the memory structures 110'.

The memory structures 110' comprises almost the same configuration as that of the memory structure 110 according to the first embodiment. However, the memory structures 110' does not comprise the semiconductor film 113 and the gate insulating film 119 (FIG. 2).

The conductive layer 122 is a substantially plate like conductive layer extending in the x-direction and the y-direction. The conductive layer 122 have a plurality of through holes formed in the predetermined pattern, and the memory structures 110' are provided within the through holes, respectively. The conductive layer 122 is, for example, a semiconductor film such as polysilicon (Si) including an n-type impurity such as phosphorus. The conductive layer 122 functions as the source select line SGS (FIG. 1) and gate electrodes of the plurality of source select transistors STS connected to the source select line SGS.

The conductive layer 170 functions as the source line SL (FIG. 1). The conductive layer 170 is a substantially plate like conductive layer extending in the x-direction and the y-direction. The conductive layer comprises, for example, a semiconductor film 171 and a conductive film 172. The semiconductor film 171 is, for example, a semiconductor film such as polysilicon (Si) including an n-type impurity such as phosphorus. The conductive film 172 is, for example, a metal film, a silicide film, or a semiconductor film such as polysilicon (Si) including an n-type impurity such as phosphorus.

The contact 173 extends in the z-direction and is connected to a wiring in the circuit layer CL at its lower end. The contact 173 includes, for example, a multi-layered film of a titanium nitride (TiN) and tungsten (W), and the like. The insulating film 174 is, for example, an insulating film such as silicon oxide. Note that the peripheral faces of the contact 173 and the insulating film 174 are covered by the conductive layer 120 in the x-y cross section.

The insulating film 175 is, for example, an insulating film such as silicon oxide. Note that the peripheral face of the insulating film 175 is covered by the conductive layer 120 in the x-y cross section.

The first structures 140' comprises almost the same configuration as that of the memory structure 110'. Note that the peripheral faces of the first structures 140' are covered by the conductive layer 120 in the x-y cross section.

Then, with reference to FIG. 28 to FIG. 30, more specific configuration of the memory cell array MA' will be described. For the convenience of a description, part of the configuration is omitted in FIG. 28 to FIG. 30.

Figure 28:
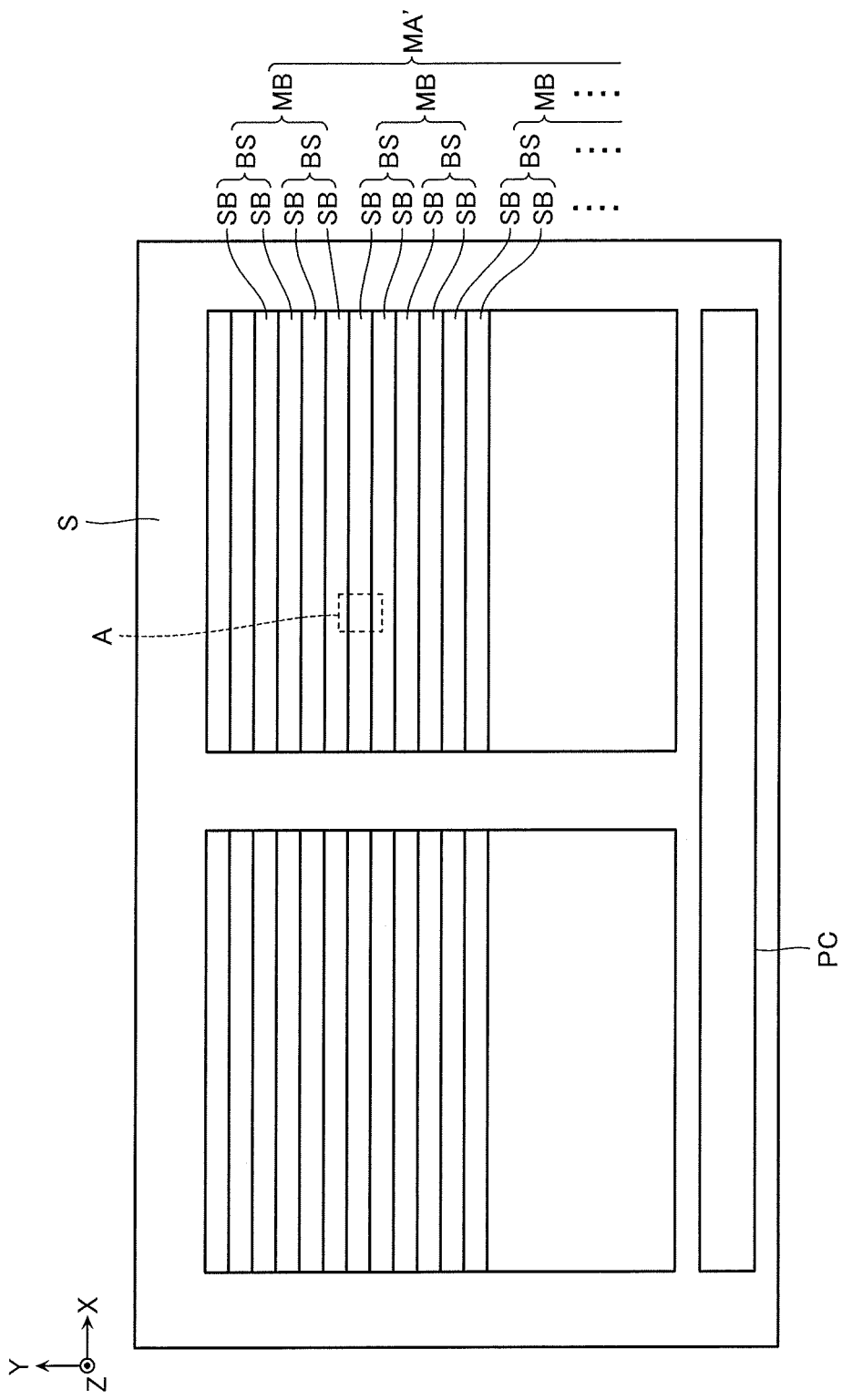
FIG. 28 is a schematic plan view of the same semiconductor memory device.

FIG. 28 is a schematic plan view of the semiconductor memory device according to the embodiment.

As shown in FIG. 28, on the substrate S, a plurality of the memory cell arrays MA' and a part of the peripheral circuit PC are provided. The memory cell arrays MA' comprises almost the same configuration as that of the memory cell arrays MA according to the first embodiment.

Figure 29:
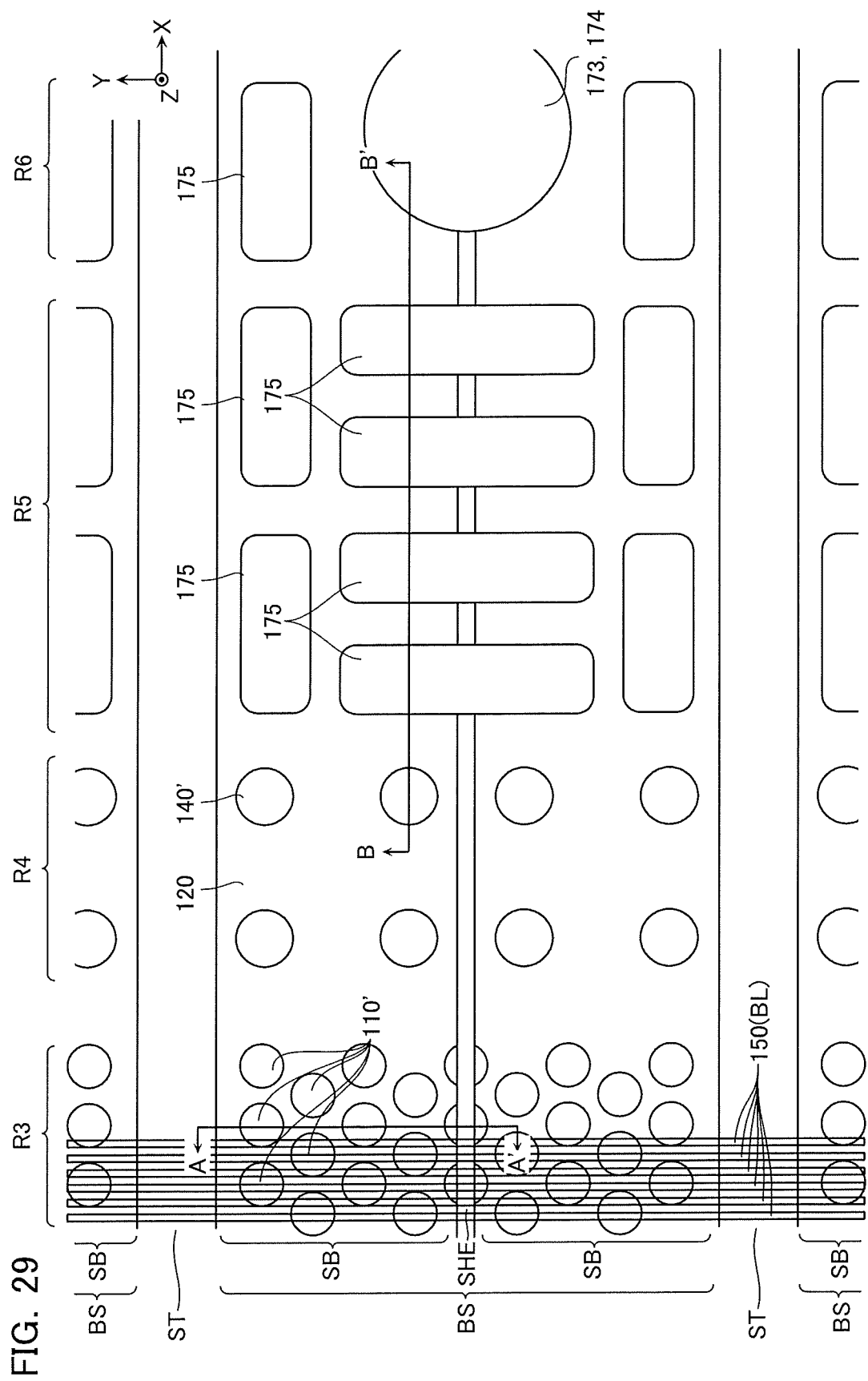
FIG. 29 is a schematic enlarged view of a part shown with A in FIG. 28.

FIG. 29 is an enlarged view of a part shown with A in FIG. 28. FIG. 30 is a schematic cross-sectional view cut a part illustrated with line A-A' in FIG. 30 and shown in a direction of arrows. FIG. 31 is a schematic cross-sectional view cut a part illustrated with line B-B' in FIG. 29 and shown in a direction of arrows.

As shown in FIG. 29, in a memory cell array MA', a region R3 provided with a plurality of the memory structures 110', a region R4 provided with a plurality of the first structures 140', a region R5 provided with a plurality of the insulating films 175, and a region R6 provided with the contact 173.

Figure 30:
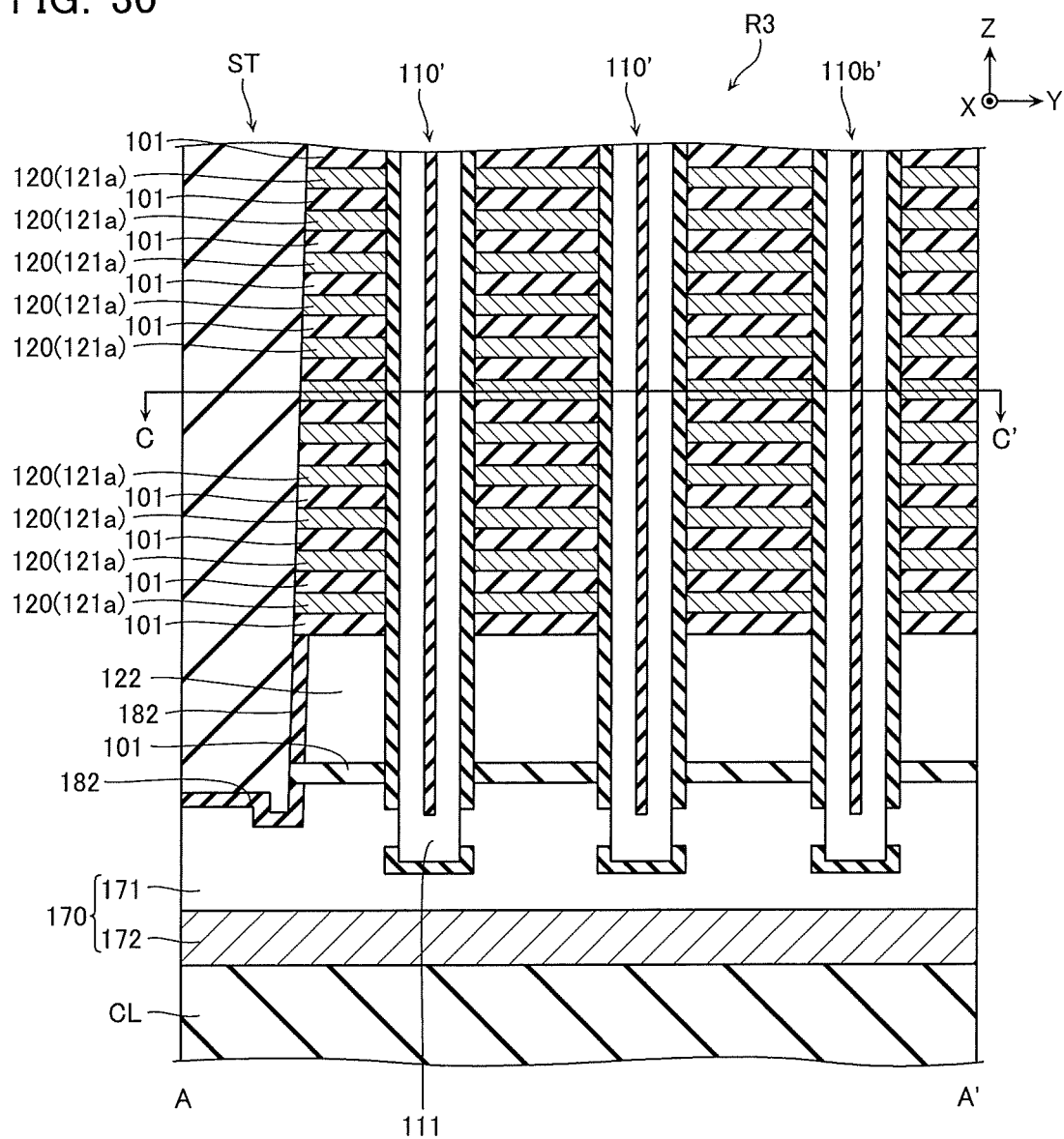
FIG. 30 is a schematic cross-sectional view of the structure cut with line A-A' in FIG. 29.
Figure 31:
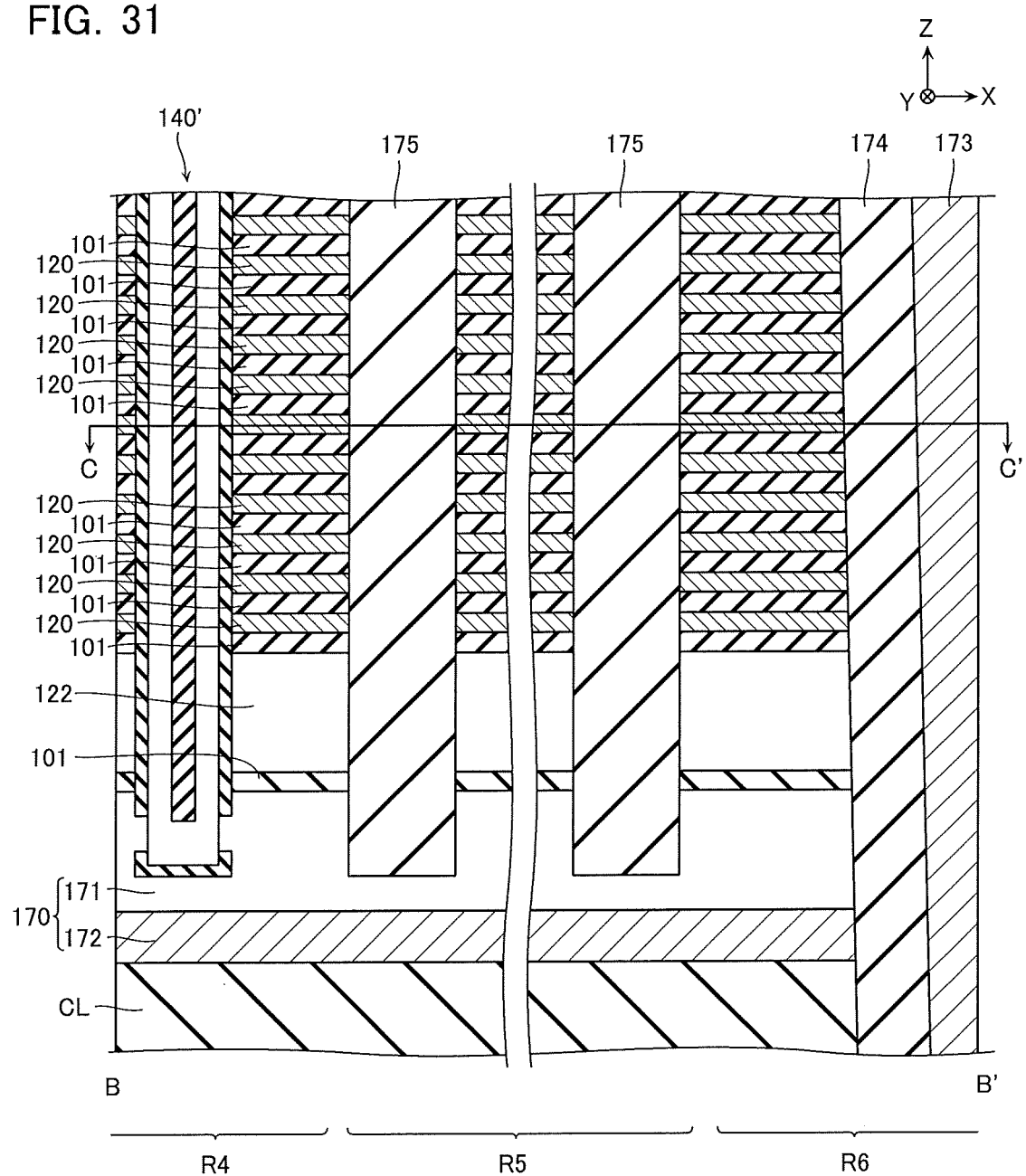
FIG. 31 is a schematic cross-sectional view of the structure cut with line B-B' in FIG. 29.

In the region R3, as shown in FIG. 29 and FIG. 30, the plurality of the memory structures 110' is arranged in the same manner as the plurality of the memory structures 110 arranged in the region R1.

In the region R4, as shown in FIG. 29 and FIG. 31, the plurality of the first structures 140' is arranged in the x-direction and in the y-direction.

In the region R5, as shown in FIG. 29, the plurality of the insulating films 175 is arranged in a certain pattern. Some of the plurality of the insulating layers extend in the x-direction and are arranged in the x-direction. Some of the plurality of the insulating layers extend in the y-direction, are provided across two of the subblocks SB, and are arranged in the x-direction. Lower ends of the insulating films 175 are, for example, as shown in FIG. 31, connected to the semiconductor film 171.

In the region R6, as shown in FIG. 29 and FIG. 31, the contact 173 and the insulating film 174 are provided. The contact 173 is provided across two of the subblocks SB.

Figure 32:
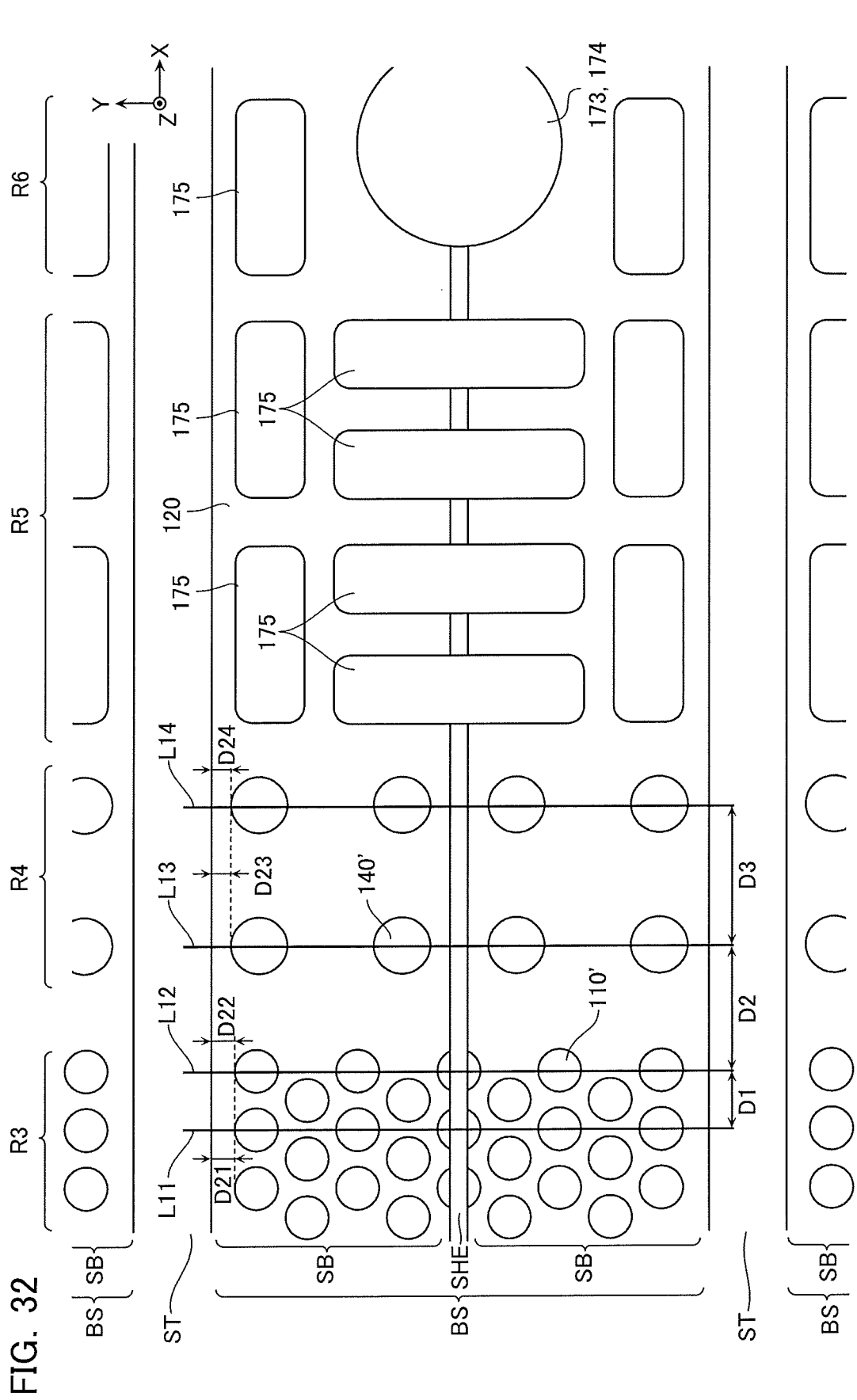
FIG. 32 is a schematic plan view of the same semiconductor memory device.

FIG. 32 is an x-y cross-sectional view of the structure described with reference to FIG. 29 to FIG. 31, and positions in the x-direction and y-direction correspond to that in FIG. 29. Also, a position in the z-direction corresponds to the line C-C' in FIG. 30 and FIG. 31.

In FIG. 32, straight lines L11, L12, L13, and L14 extending in the y-direction are illustrated. These straight lines L11, L12, L13, and L14 are imaginary lines. The straight lines L11 and L12 are provided at an end in the x-direction of the region R3, and the straight line L12 is closer to the region R4 than the straight line L11. The straight lines L13 and L14 are provided in the region R4, and the straight line L14 is closer to the region R5 than the straight line L13. In the illustrated example, a plurality of the memory structures 110' is arranged on each of the straight lines L11 and L12, and a plurality of the first structures 140' is arranged on each of the straight lines L13 and L14. Each of the plurality of memory structures 110' arranged on the straight line L12 is a memory structure 110' which is adjacent to another memory structure 110' arranged on the straight line L11 in the x-direction. Each of the plurality of first structures 140' arranged on the straight line L13 is first structures 140' which is adjacent to one of the memory structures 110' arranged on the straight line L12. Each of the plurality of first structures 140' arranged on the straight line L14 is a first structure 140' which is adjacent to another first structure 140' arranged on the straight line L13 in the x-direction.

Here, as shown in the figure, in this embodiment, when a distance between the straight line L11 and the straight line L12 is a distance D1, a distance between the straight line L12 and the straight line L13 is a distance D2, and a distance between the straight line L13 and the straight line L14 is a distance D3, the distance D2 is larger than the distance D1, and the distance D3 is larger than the distance D1. The distance D3 may be the same as the distance D2 and may be larger than the distance D2.

[Manufacturing Method]

Next, a manufacturing method of the semiconductor memory device according to the embodiment will be described with reference to FIG. 33 to FIG. 58. Note that FIGS. 34, 39, 40, 43, and 46 show cross-sections corresponding to FIG. 29, FIGS. 33, 35, 37, 47-51, 53, and 55-58 show cross-sections corresponding to the line A-A' in FIG. 29, FIGS. 36, 38, 41, 42, 44, 45, 52, and 54 show cross-sections corresponding to the line B-B' in FIG. 29.

In the manufacturing method, a circuit layer CL is formed on the substrate S.

Figure 33:
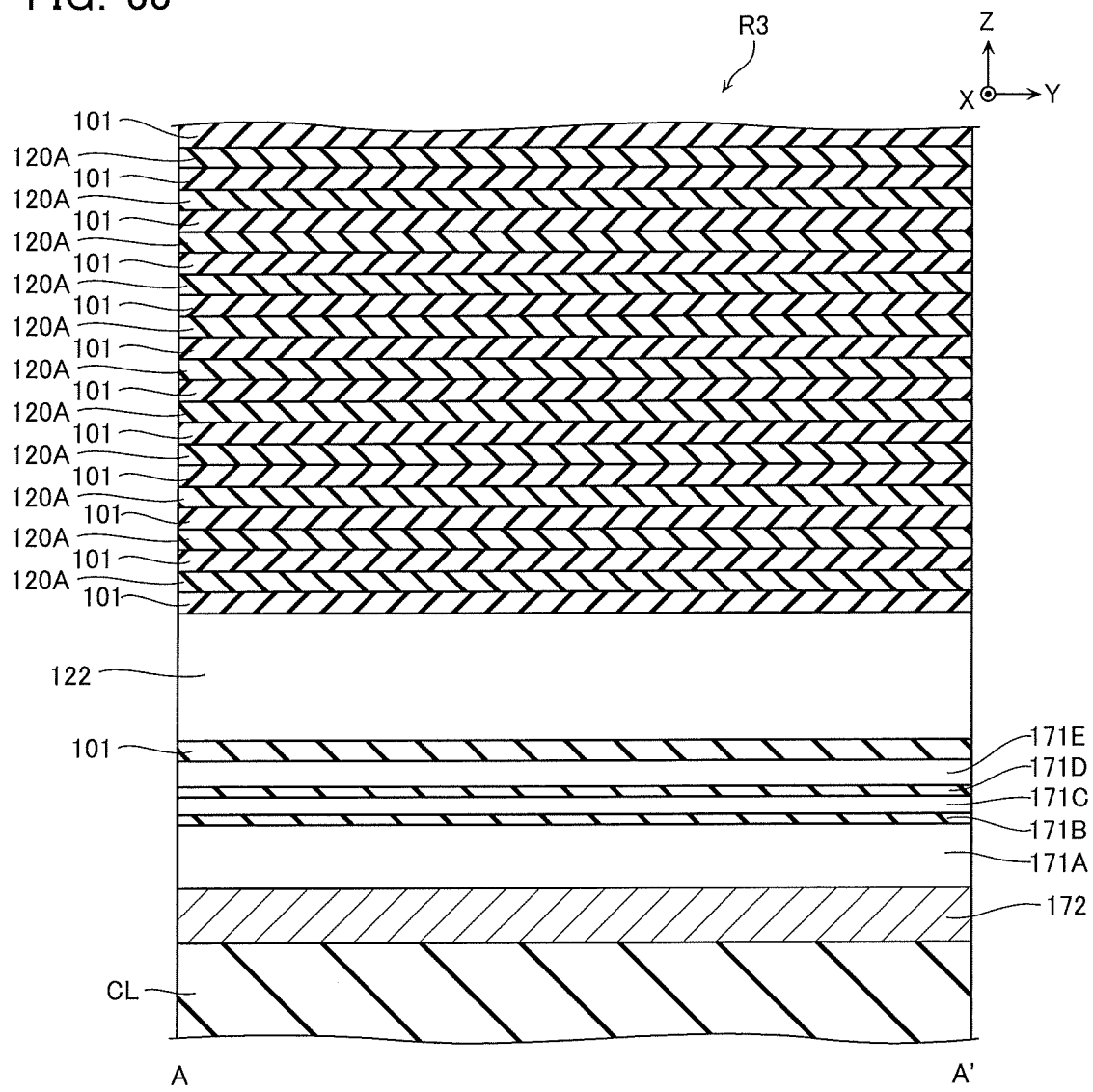
FIG. 33 is a schematic cross-sectional view showing a manufacturing method of the same semiconductor memory device.

As shown in FIG. 33, on the circuit layer CL, a conductive film 172, a semiconductor layer 171A, a sacrifice layer 171B, a sacrifice layer 171C, a sacrifice layer 171D, a semiconductor layer 171E, an insulating layer 101, and a conductive layer 122 are formed. Additionally, a plurality of sacrifice layers 120A and insulating layers 101 are formed. The semiconductor layer 171A and the semiconductor layer 171E are, for example, a semiconductor film such as polysilicon including an n-type impurity such as phosphorus. The sacrifice layer 171B and the sacrifice layer 171D are, for example, insulating layers such as silicon oxide. The sacrifice layer 171C is, for example, a semiconductor layer such as polysilicon. This process is performed by, for example, a method such as CVD.

Figure 34:
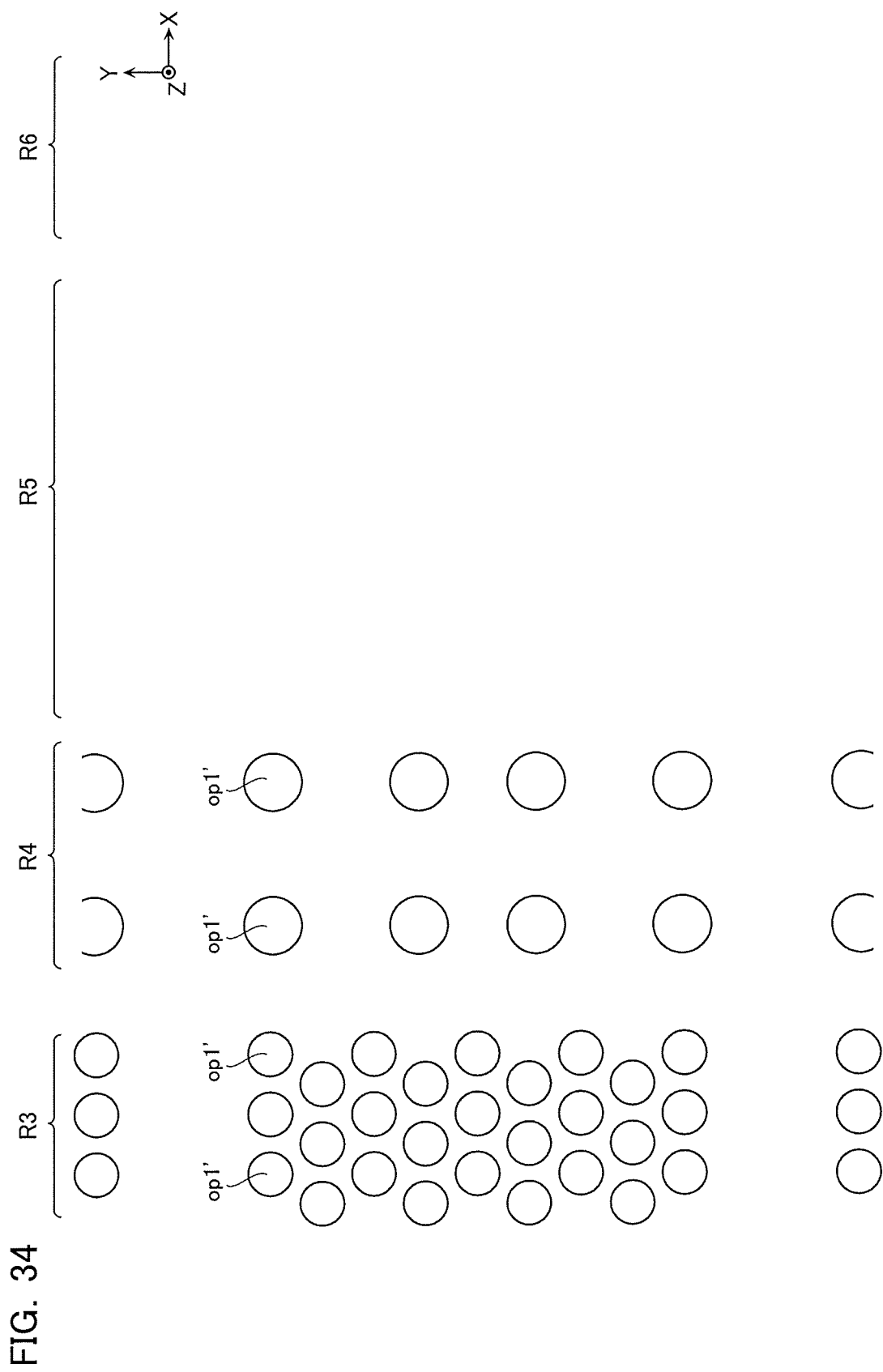
FIG. 34 is a schematic cross-sectional view showing the same manufacturing method.
Figure 35:
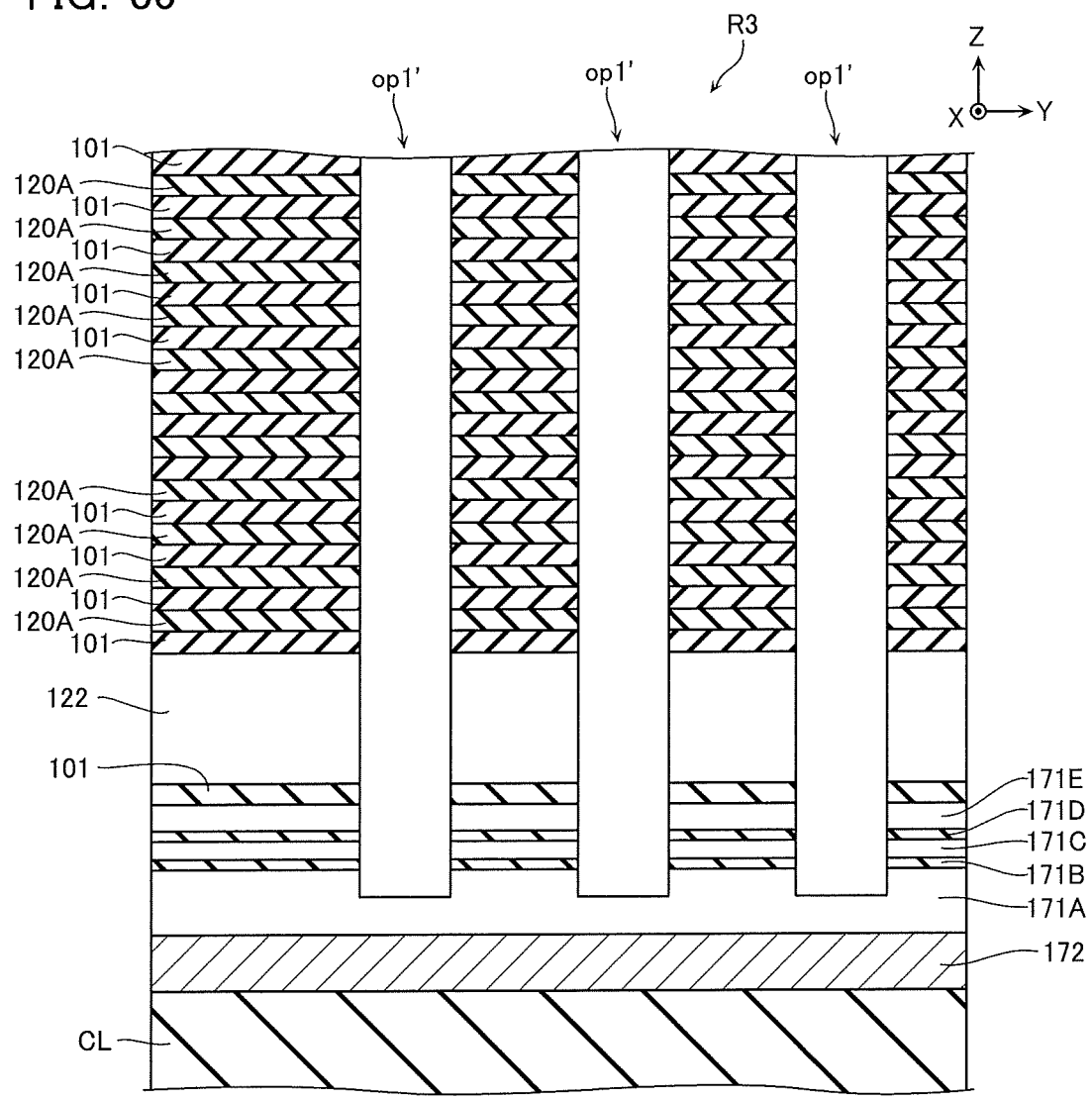
FIG. 35 is a schematic cross-sectional view showing the same manufacturing method.
Figure 36:
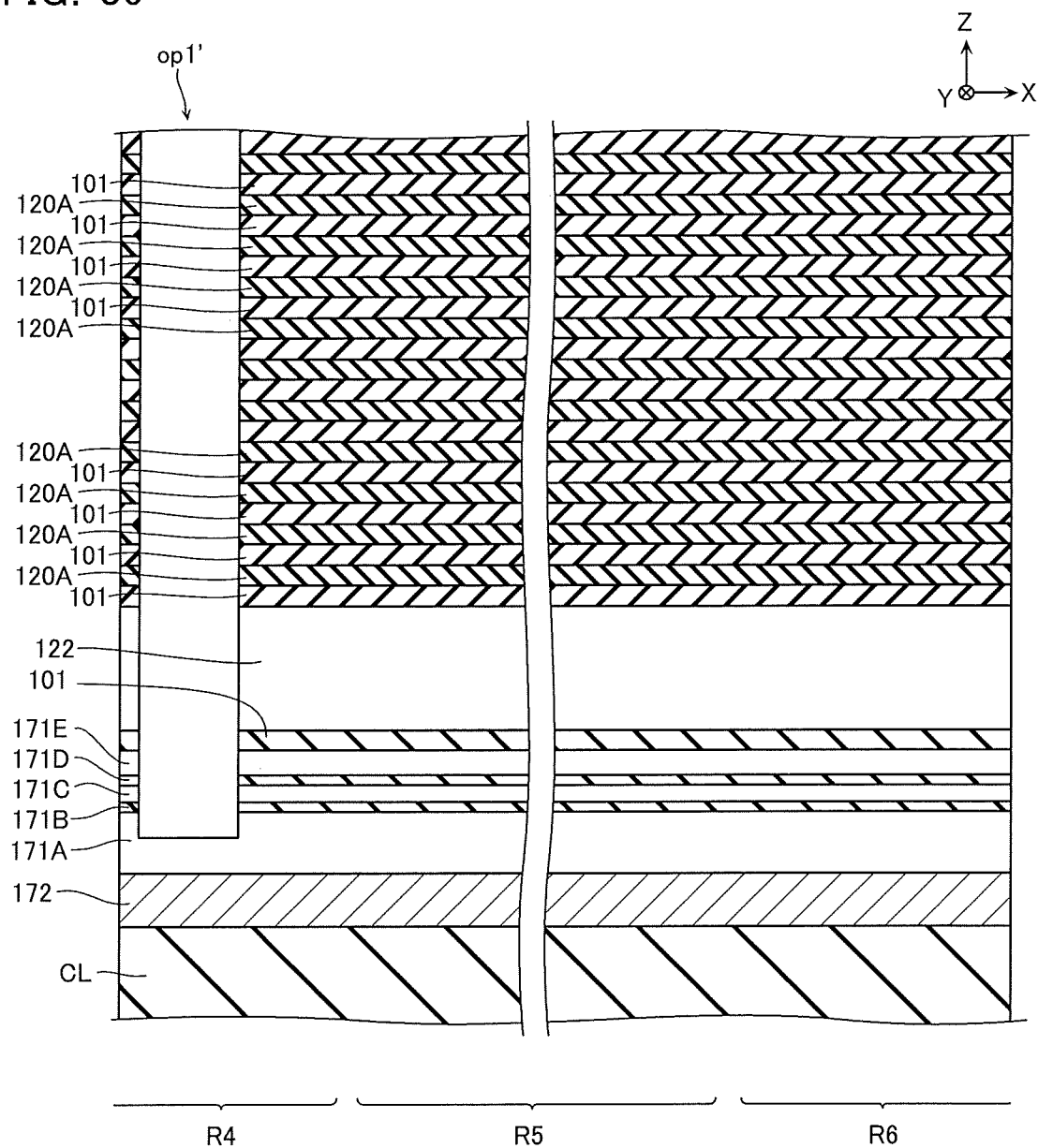
FIG. 36 is a schematic cross-sectional view showing the same manufacturing method.

Next, as shown in FIG. 34 to FIG. 36, a plurality of openings op1' are formed at the positions corresponding to the memory structures 110' and the first structures 140'. The opening op1' is a through hole which extends in the z-direction, runs through the sacrifice layers 171B-171D, the semiconductor layer 171E, the conductive layer 122, and the plurality of the insulating layers 101 and the sacrifice layers 120A, and exposes the top surface of the semiconductor layer 171A. This process is performed by, for example, a method such as RIE.

Figure 37:
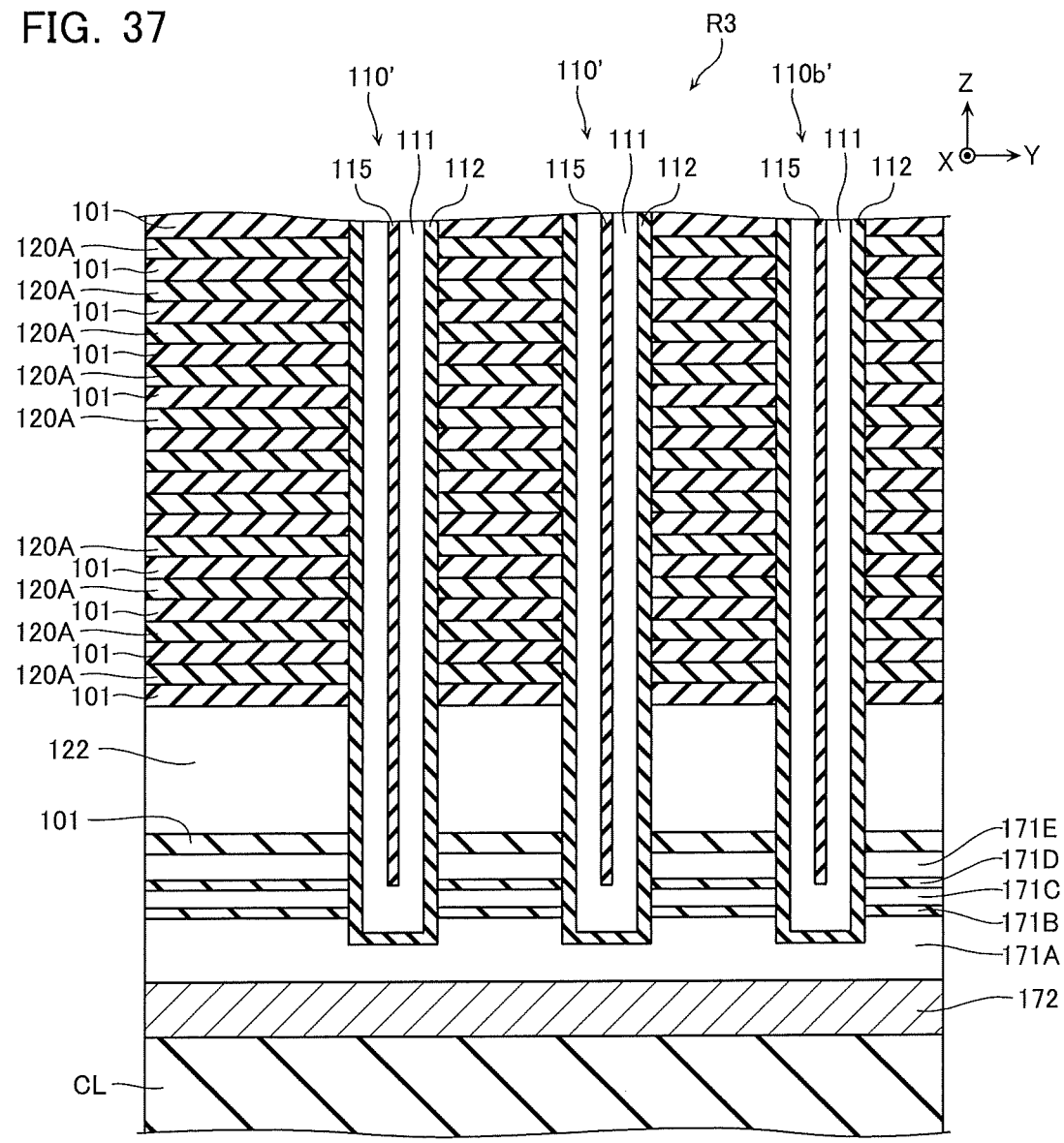
FIG. 37 is a schematic cross-sectional view showing the same manufacturing method.
Figure 38:
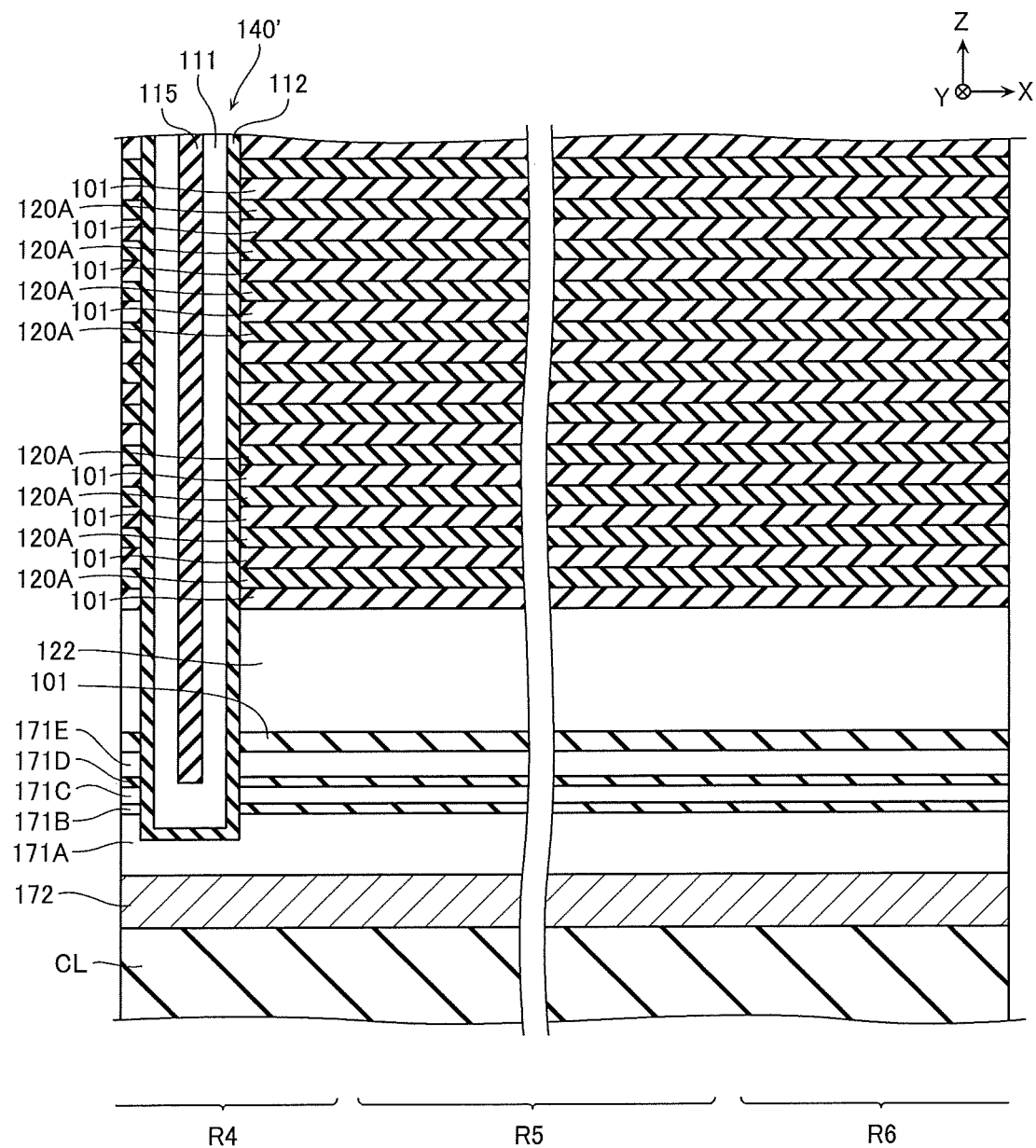
FIG. 38 is a schematic cross-sectional view showing the same manufacturing method.

Next, as shown in FIG. 37 and FIG. 38, on the inner peripheral surfaces of the openings op1', gate insulating films 112, semiconductor films 111 and insulating films 115 are formed. This process is performed by, for example, a method such as CVD and annealing process.

Figure 39:
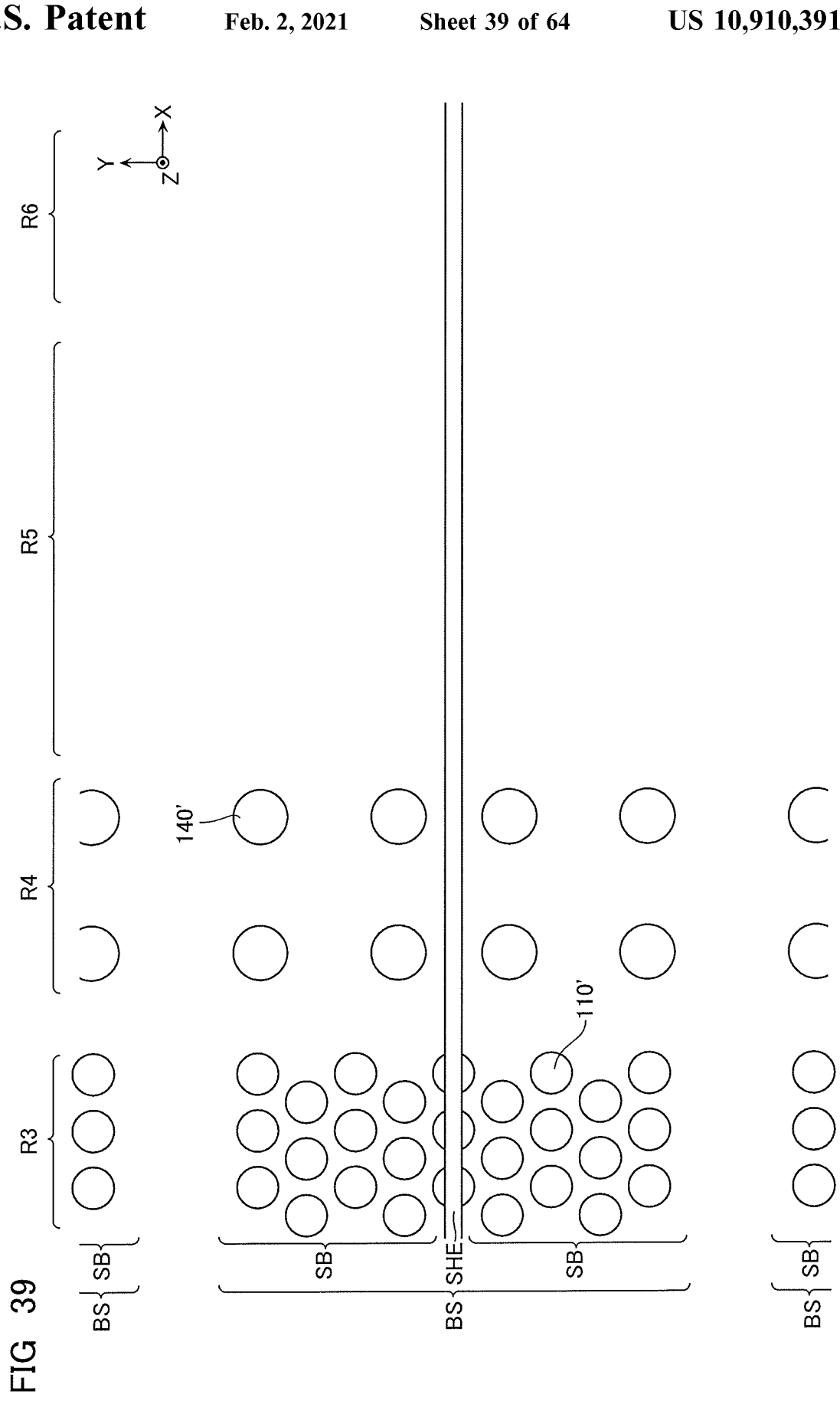
FIG. 39 is a schematic cross-sectional view showing the same manufacturing method.

Next, as shown in FIG. 39, an insulating portion SHE extending in the x-direction across the region R3 to the region R6 is formed. This process is performed by, for example, a method such as RIE and CVD.

Figure 40:
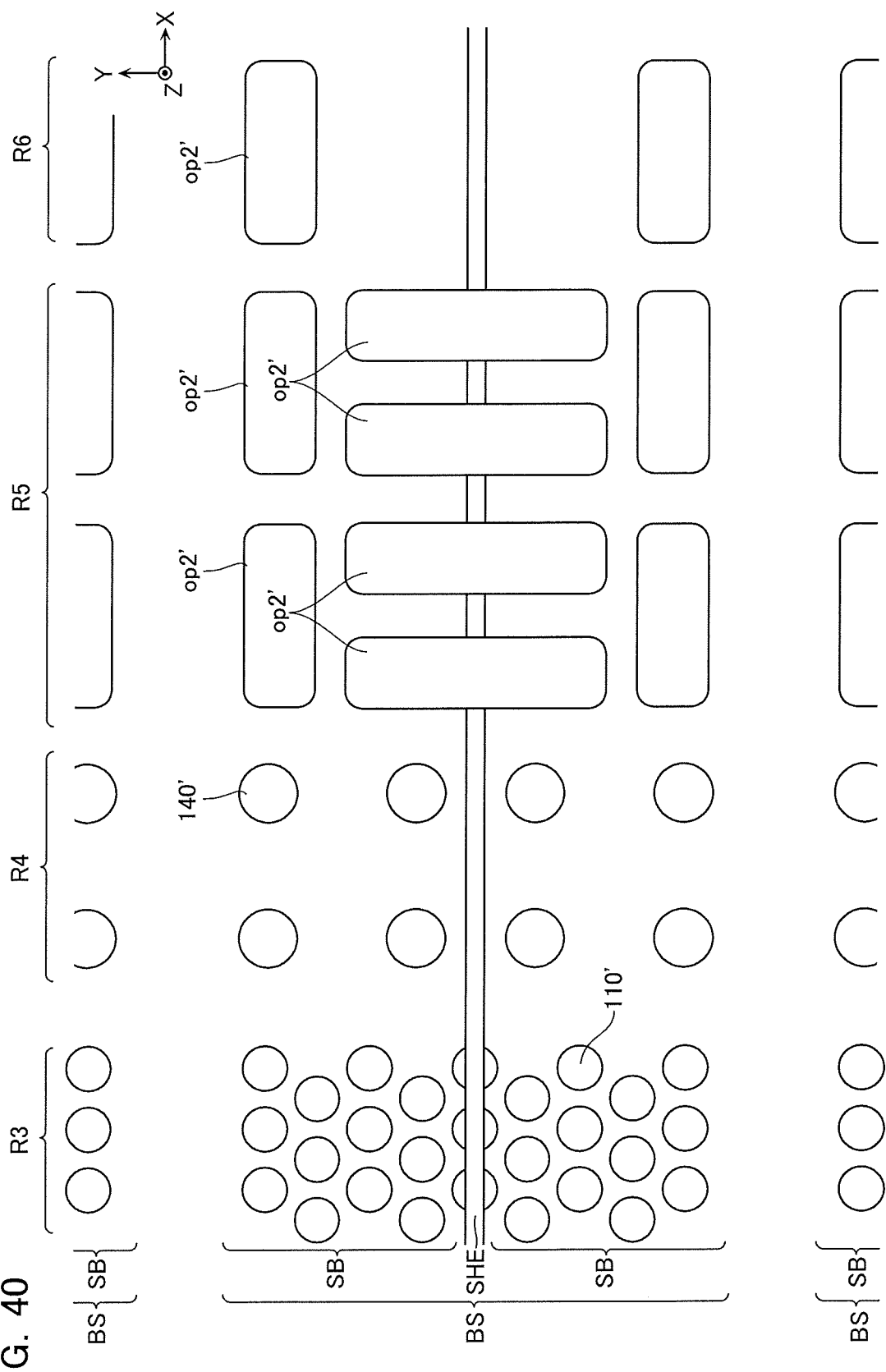
FIG. 40 is a schematic cross-sectional view showing the same manufacturing method.
Figure 41:
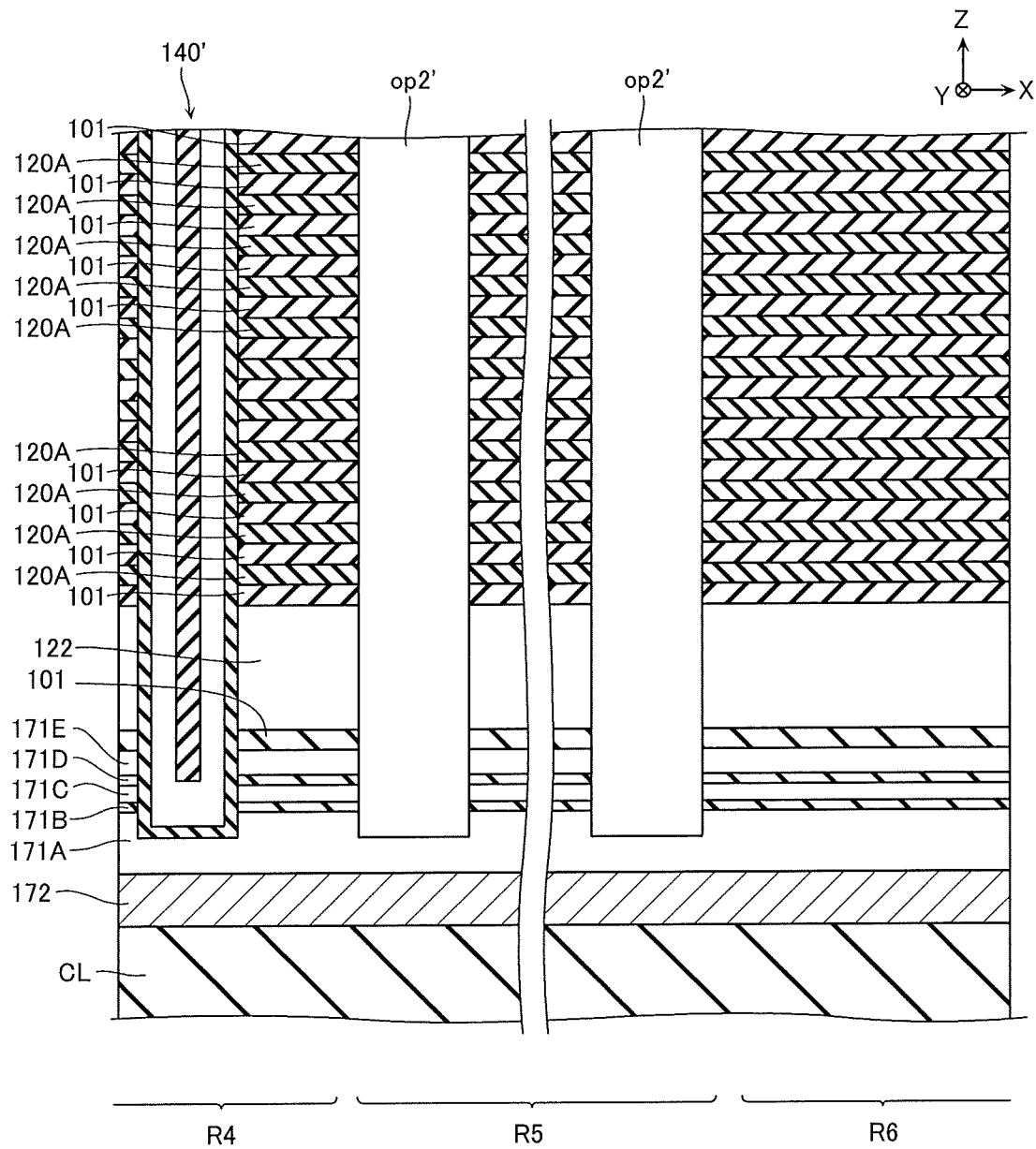
FIG. 41 is a schematic cross-sectional view showing the same manufacturing method.

Next, as shown in FIG. 40 and FIG. 41, a plurality of openings op2' are formed at the positions corresponding to the insulating films 175. The opening op2' is a through hole which extends in the z-direction, runs through the sacrifice layers 171B-171D, the semiconductor layer 171E, the conductive layer 122, and the plurality of the insulating layers 101 and the sacrifice layers 120A, and exposes the top surface of the semiconductor layer 171A. This process is performed by, for example, a method such as RIE.

Figure 42:
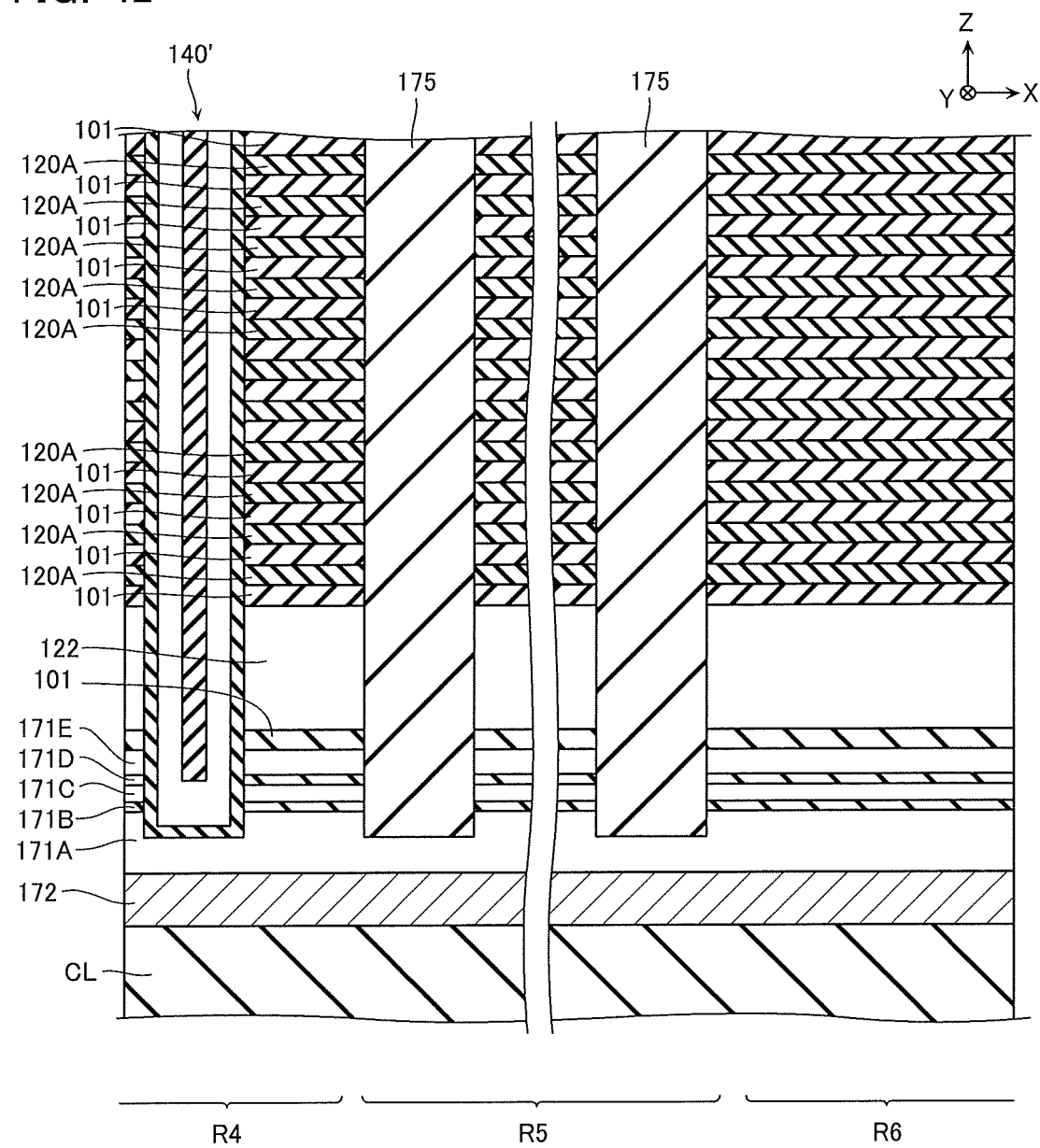
FIG. 42 is a schematic cross-sectional view showing the same manufacturing method.

Next, as shown in FIG. 42, on the inner peripheral surfaces of the openings op2', insulating films 175 are formed. This process is performed by, for example, a method such as CVD.

Figure 43:
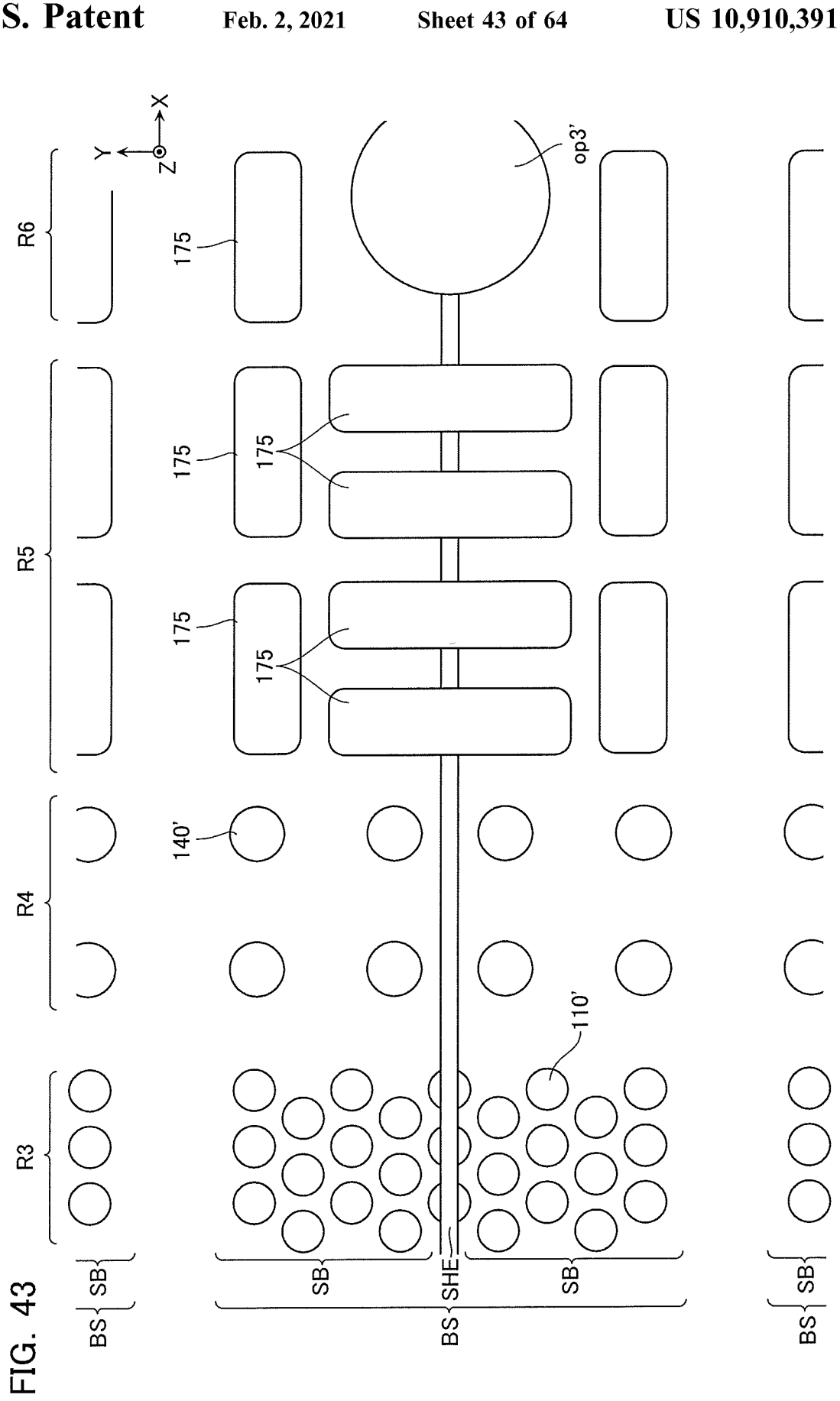
FIG. 43 is a schematic cross-sectional view showing the same manufacturing method.
Figure 44:
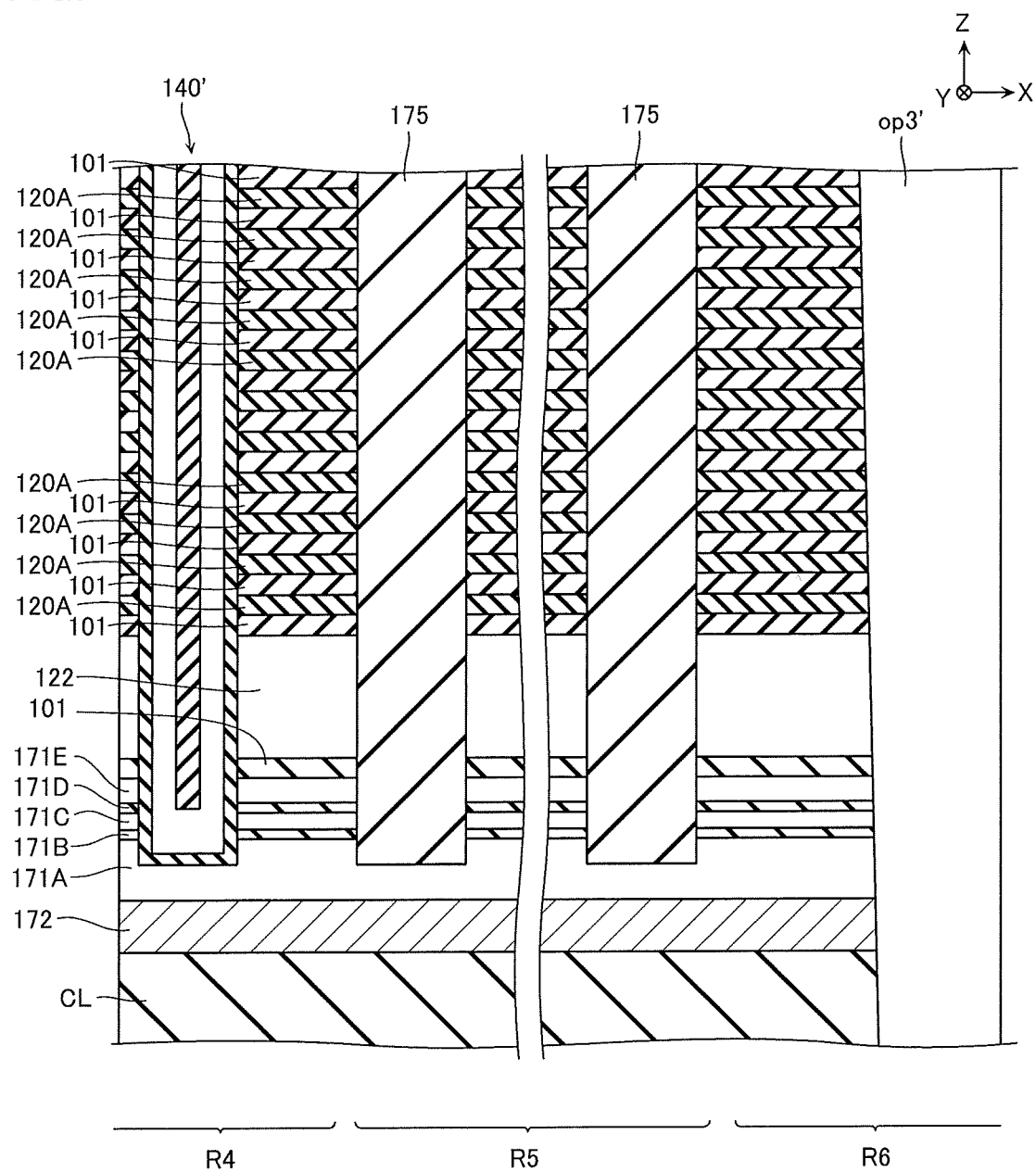
FIG. 44 is a schematic cross-sectional view showing the same manufacturing method.

Next, as shown in FIG. 43 and FIG. 44, a plurality of openings op3' are formed at the positions corresponding to the contacts 173 and the insulating films 174. The opening op3' is a through hole which extends in the z-direction, runs through a portion of the circuit layer CL, the conductive film 172, the semiconductor layer 171A, the sacrifice layers 171B-171D, the semiconductor layer 171E, the conductive layer 122, and the plurality of the insulating layers 101 and the sacrifice layers 120A, and exposes the top surface of the wiring in the circuit layer CL. This process is performed by, for example, a method such as RIE.

Figure 45:
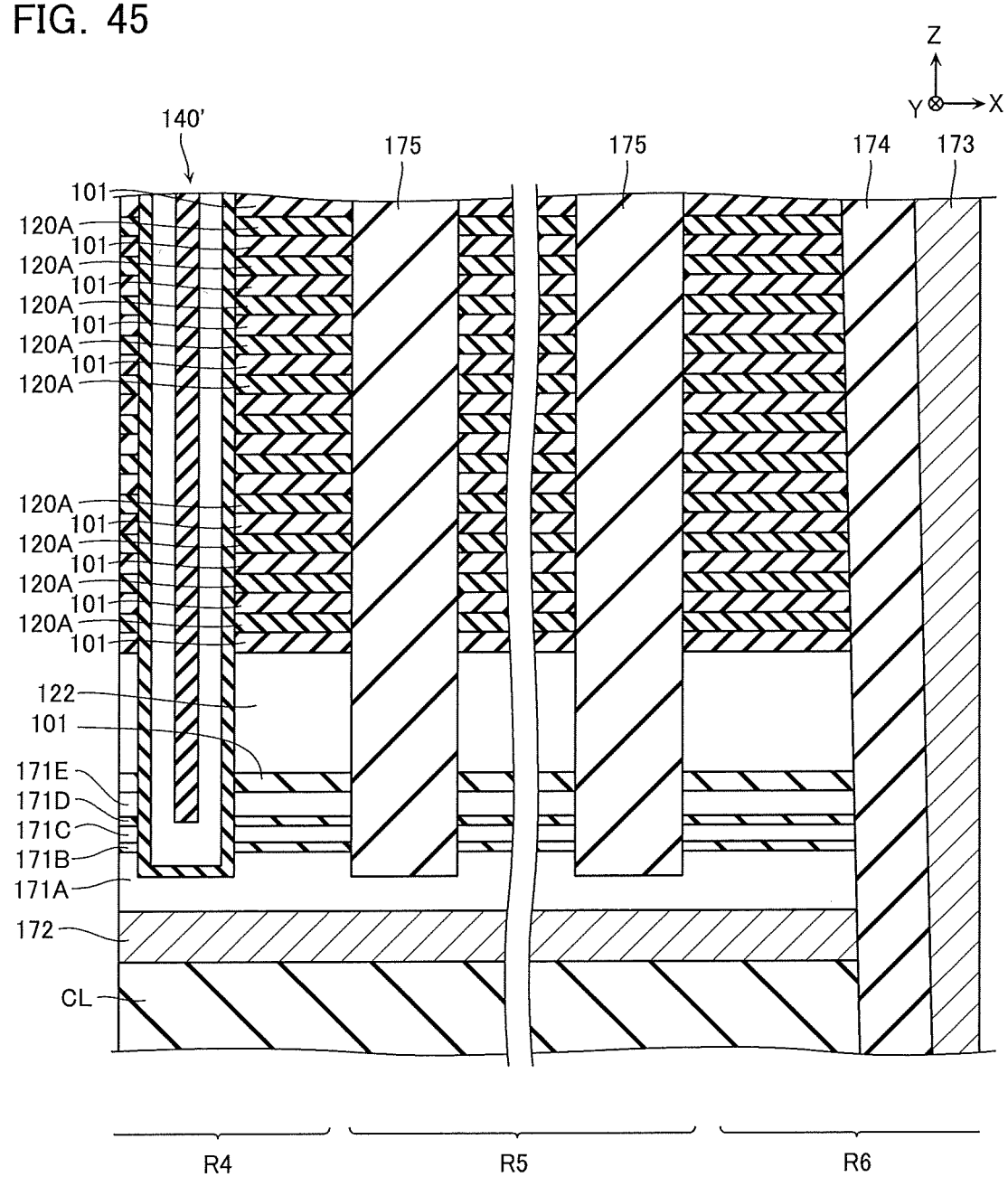
FIG. 45 is a schematic cross-sectional view showing the same manufacturing method.

Next, as shown in FIG. 45, on the inner peripheral surfaces of the openings op3', insulating films 174 and contacts 173 are formed. This process is performed by, for example, a method such as CVD.

Figure 46:
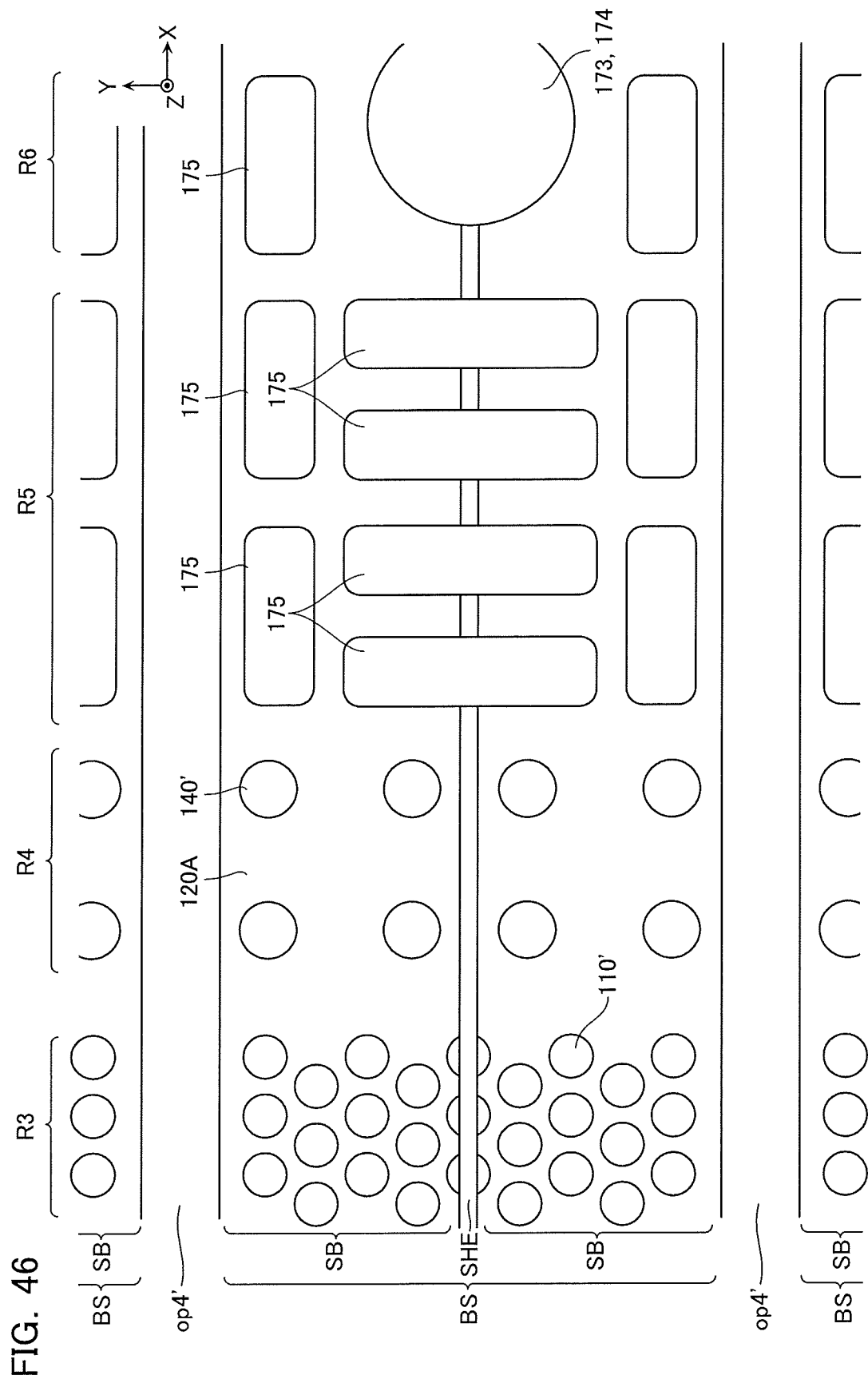
FIG. 46 is a schematic cross-sectional view showing the same manufacturing method.
Figure 47:
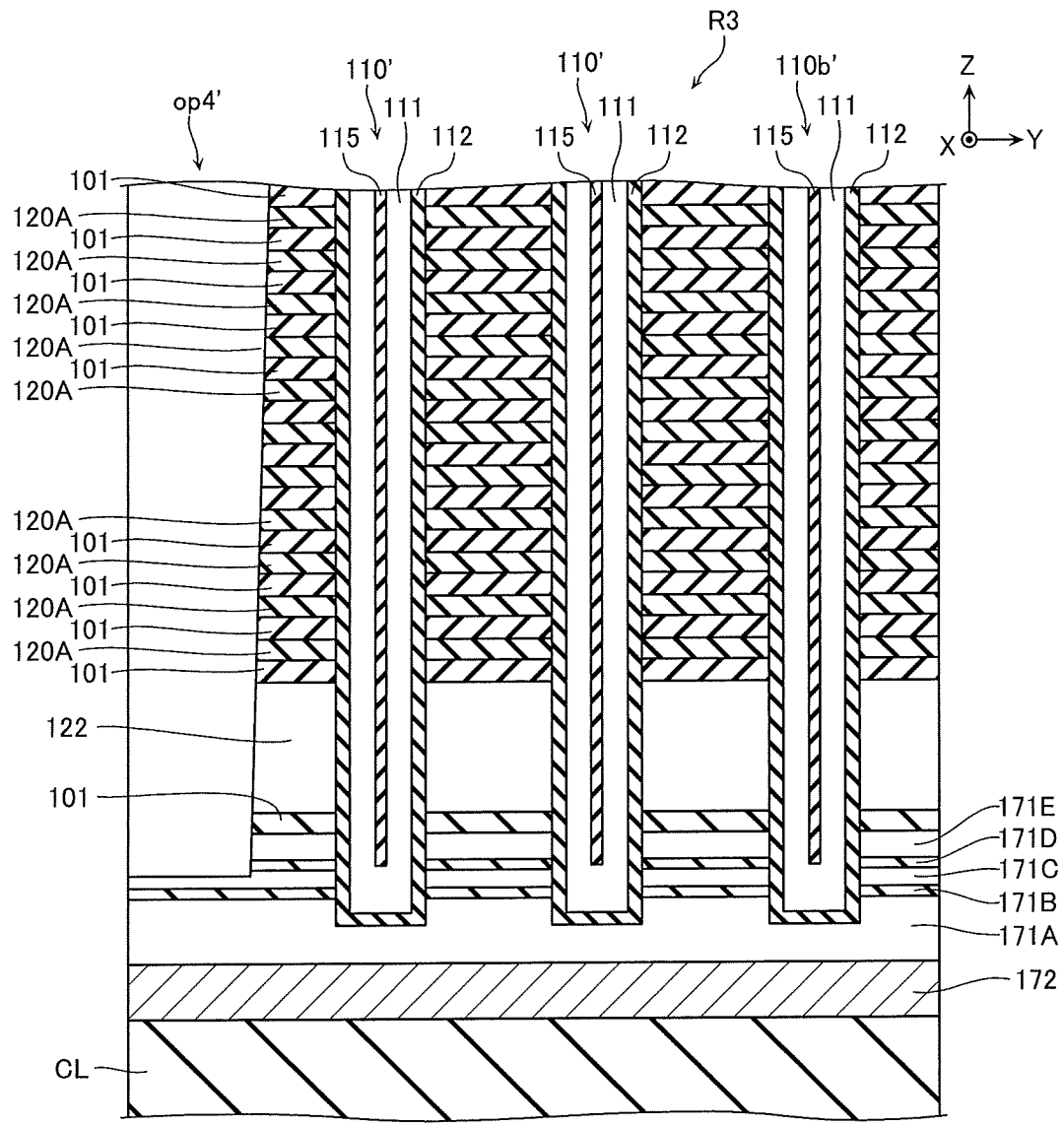
FIG. 47 is a schematic cross-sectional view showing the same manufacturing method.

Next, as shown in FIG. 46 and FIG. 47, openings op4' are formed. The opening op4' is a groove which extends in the z-direction and the x-direction, divides the sacrifice layer 171D, the semiconductor layer 171E, the conductive layer 122, and the plurality of the insulating layers 101 and the sacrifice layers 120A in the y-direction, and exposes the top surface of the sacrifice layer 171C. This process is performed by, for example, a method such as RIE.

Figure 48:
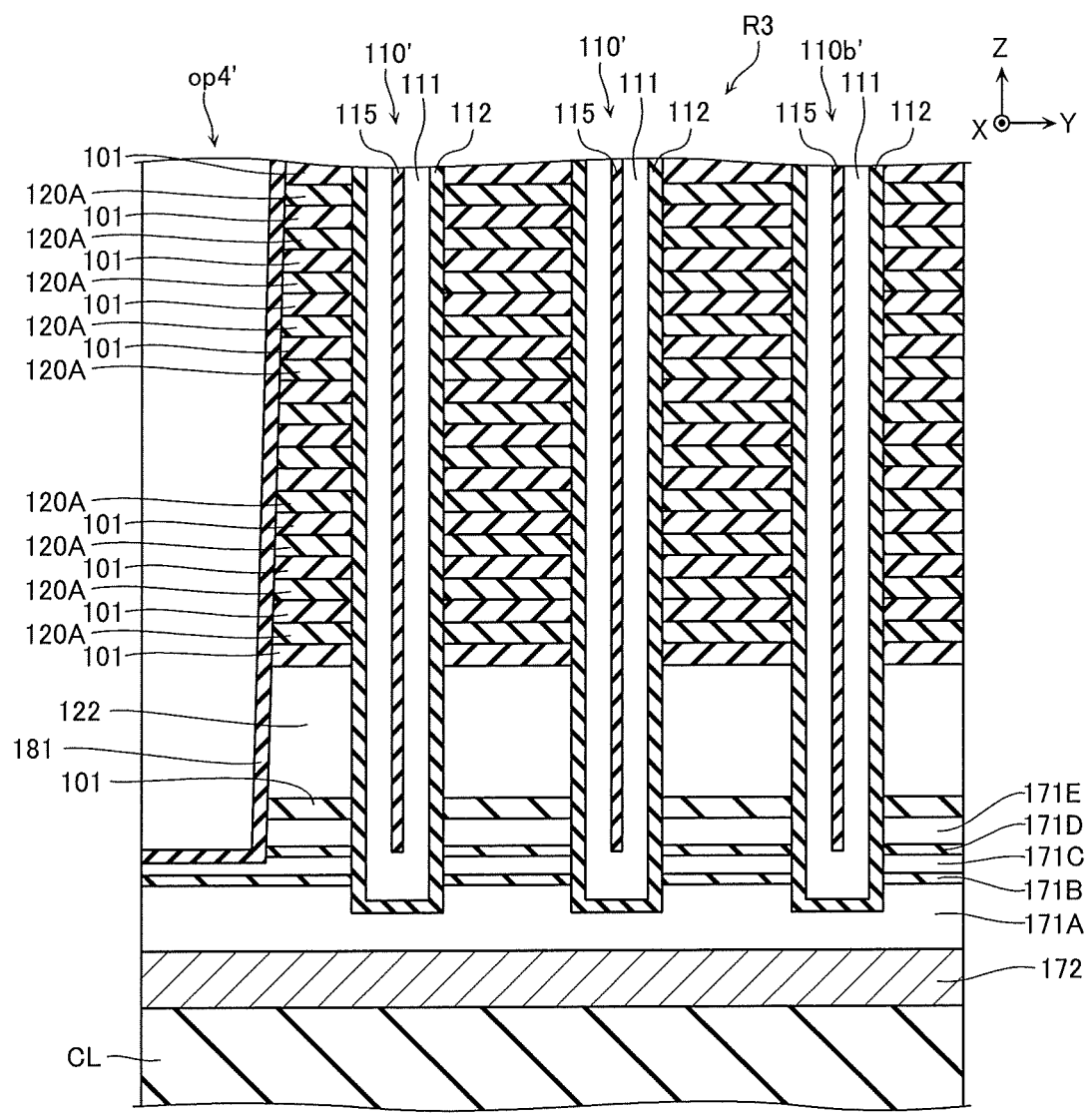
FIG. 48 is a schematic cross-sectional view showing the same manufacturing method.

Next, as shown in FIG. 48, on the inner peripheral surfaces of the openings op4', insulating films 181 are formed. This process is performed by, for example, a method such as CVD.

Figure 49:
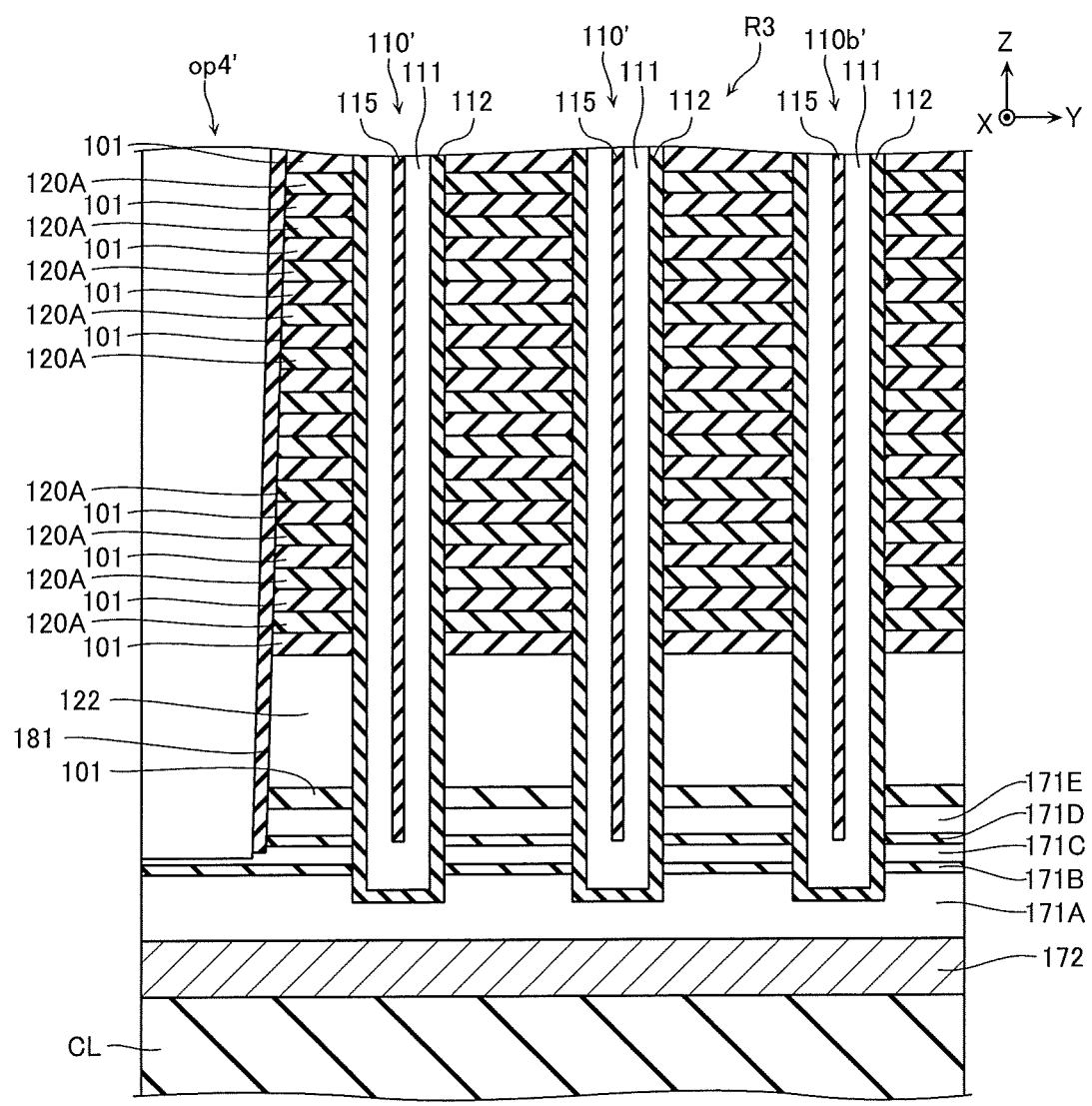
FIG. 49 is a schematic cross-sectional view showing the same manufacturing method.
Figure 50:
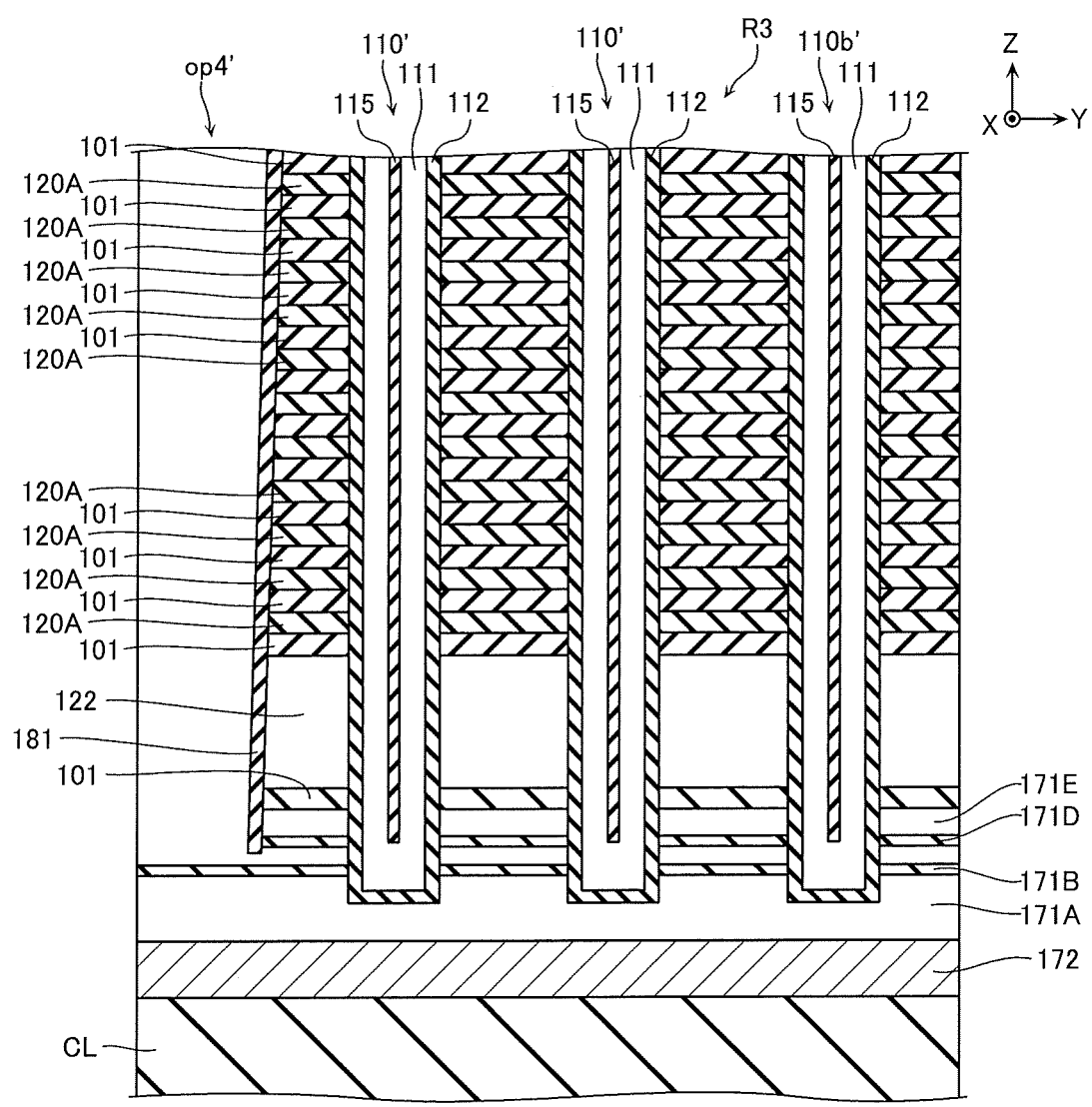
FIG. 50 is a schematic cross-sectional view showing the same manufacturing method.

Next, as shown in FIG. 49, a portion of the insulating film 181 covering the sacrifice layer 171C is removed. This process is performed by, for example, a method such as RIE Next, as shown in FIG. 50, through the openings op4', the sacrifice layer 171C is removed. Thereby, peripheral faces of portions of the memory structures 110' are exposed to the openings op4'. This process is performed by, for example, a method such as wet etching.

Figure 51:
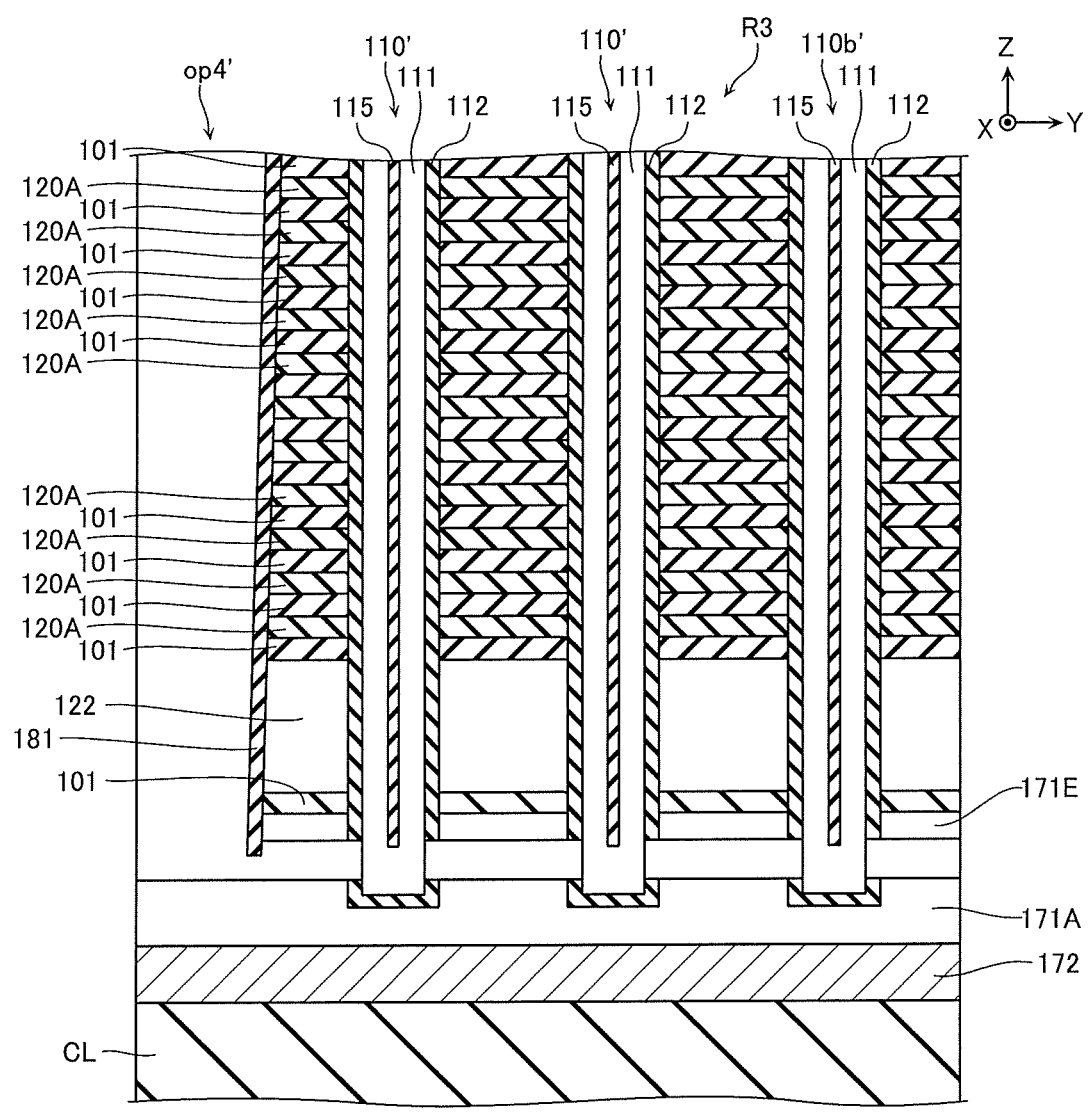
FIG. 51 is a schematic cross-sectional view showing the same manufacturing method.
Figure 52:
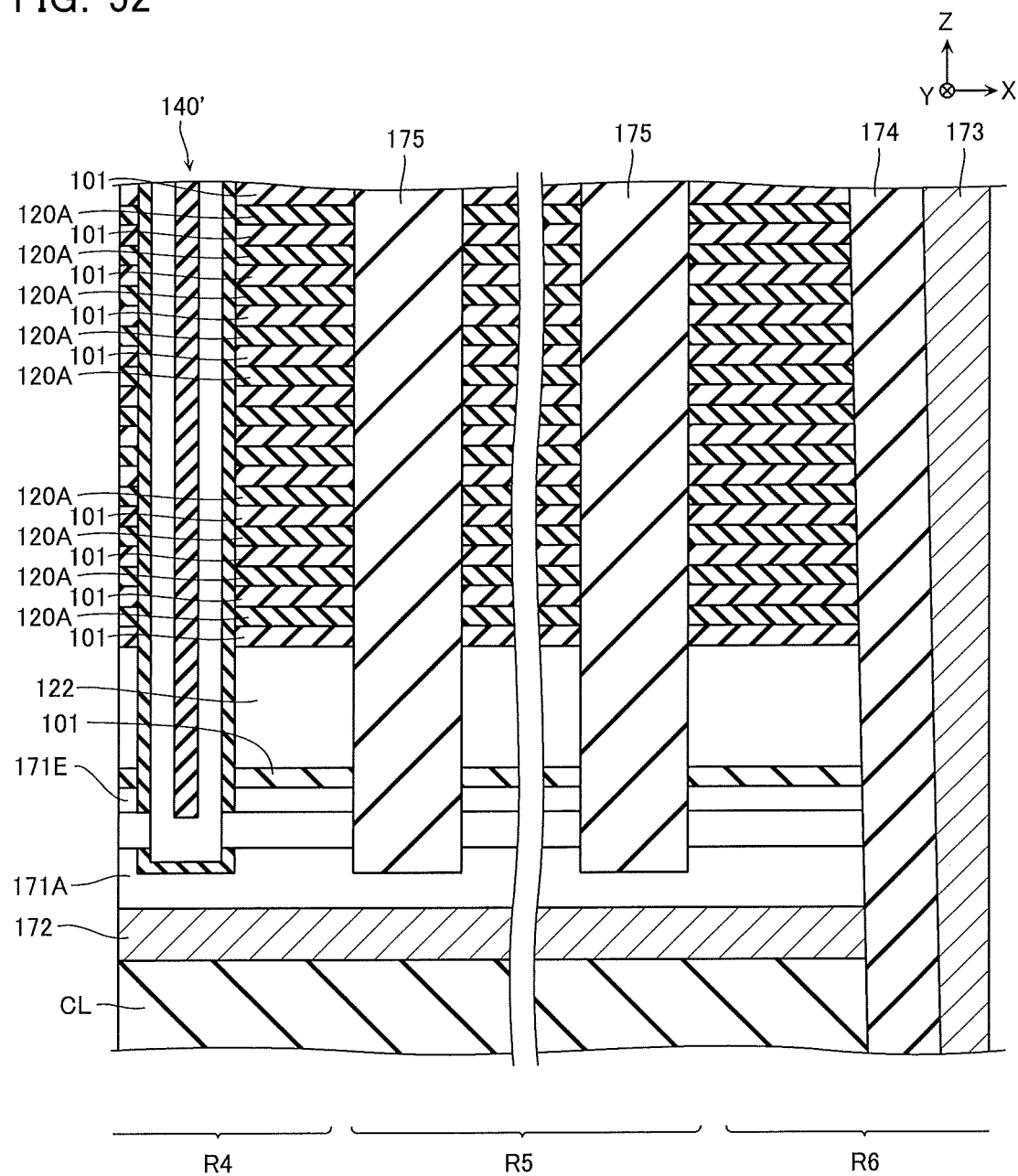
FIG. 52 is a schematic cross-sectional view showing the same manufacturing method.

Next, as shown in FIG. 51 and FIG. 52, through the openings op4', the sacrifice layer 171B, the sacrifice layer 171D, and portions of gate insulating films 112 are removed. Thereby, top surface of the semiconductor layer 171A, bottom surface of the semiconductor layer 171E, and portions of peripheral faces of the semiconductor films 111 in the memory structures 110' and the first structures 140' are exposed to the openings op4'. This process is performed by, for example, a method such as wet etching.

Figure 53:
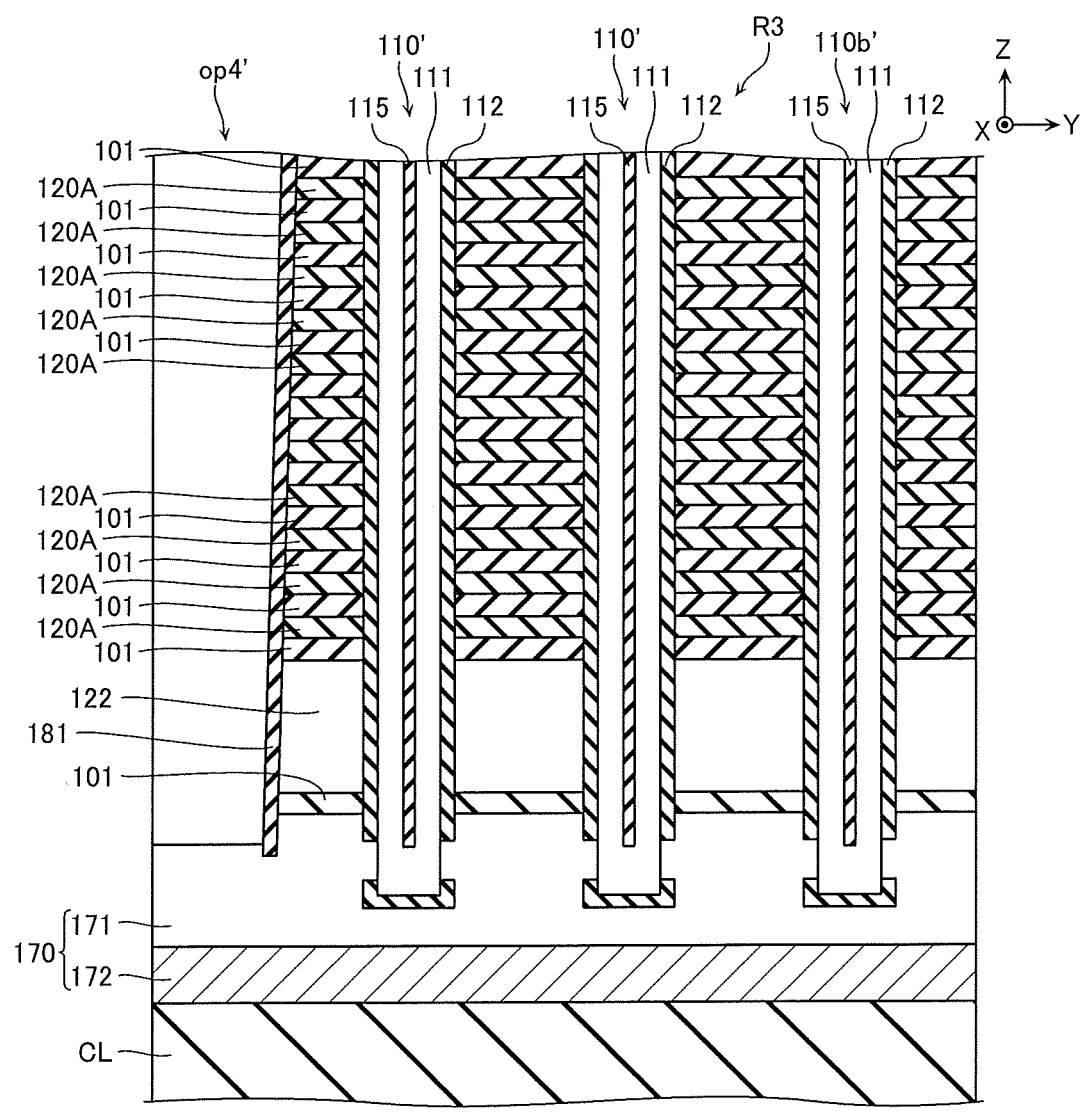
FIG. 53 is a schematic cross-sectional view showing the same manufacturing method.
Figure 54:
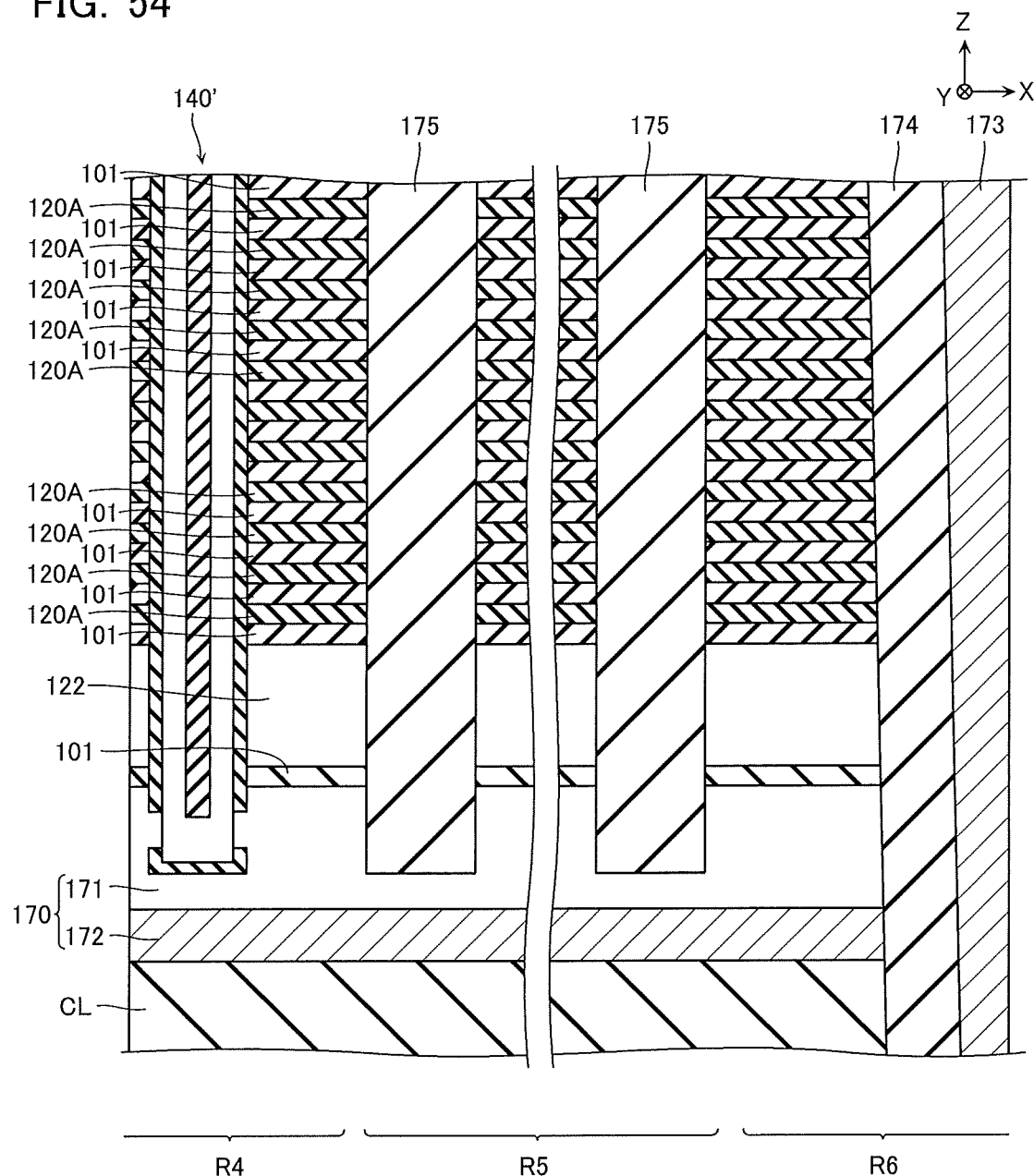
FIG. 54 is a schematic cross-sectional view showing the same manufacturing method.

Next, as shown in FIG. 53 and FIG. 54, through the openings op4', polysilicon is formed on the top surface of the semiconductor layer 171A, the bottom surface of the semiconductor layer 171E, and the portions of peripheral faces of the semiconductor films 111. Thereby, a semiconductor film 171 is formed. This process is performed by, for example, a method such as epitaxial growth.

Figure 55:
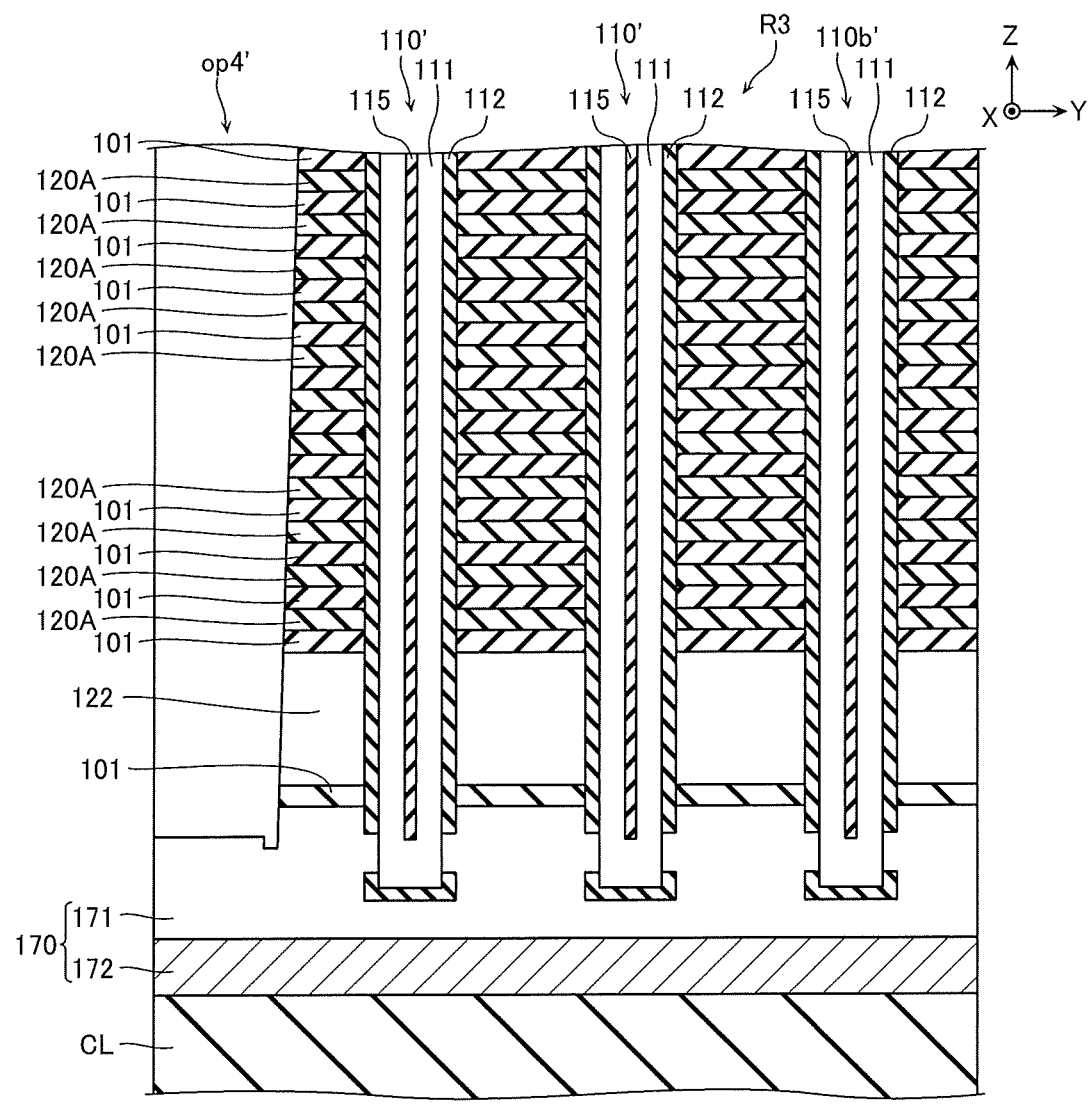
FIG. 55 is a schematic cross-sectional view showing the same manufacturing method.

Next, as shown in FIG. 55, the insulating film 181 is removed.

Figure 56:
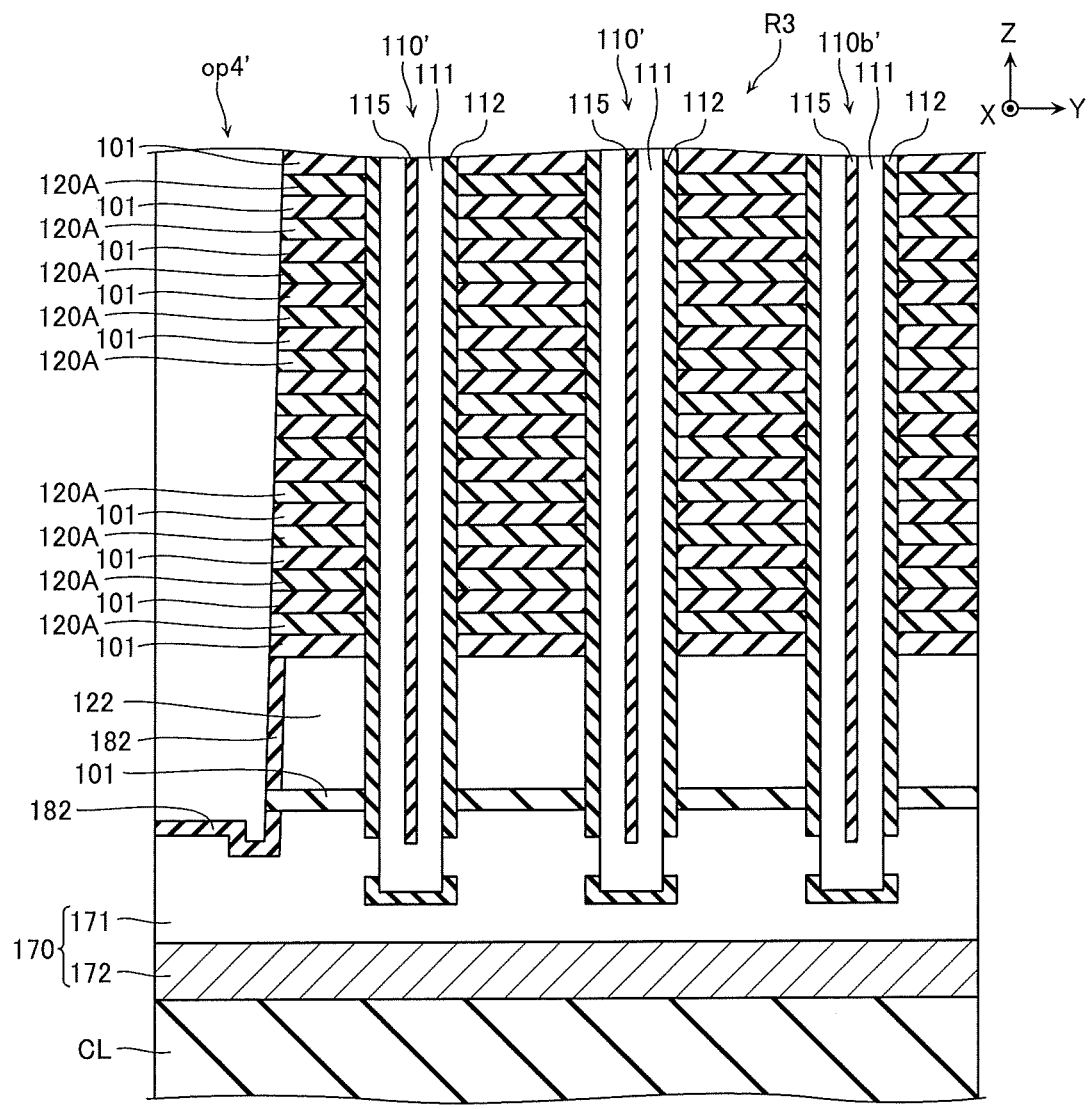
FIG. 56 is a schematic cross-sectional view showing the same manufacturing method.

Next, as shown in FIG. 56, portions of the conductive layer 122 and the semiconductor film 171 are oxidized. Thereby, insulating films 182 are formed. This oxidation process is, for example, performed so that polysilicon is selectively oxidized while silicon nitride is not oxidized.

Figure 57:
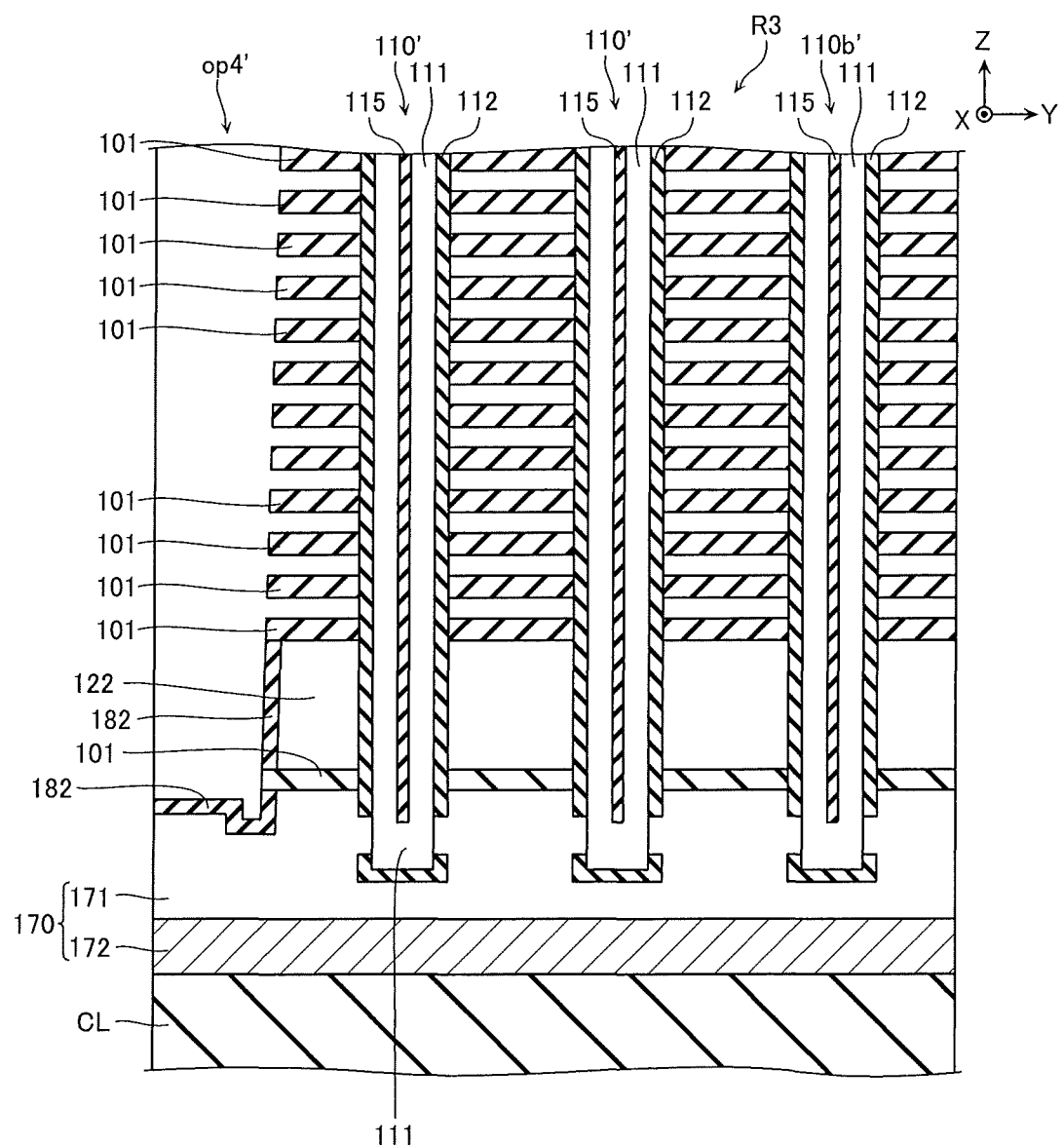
FIG. 57 is a schematic cross-sectional view showing the same manufacturing method.

Next, as shown in FIG. 57, through the openings op4', the sacrifice layers 120A are removed. Thereby, hollow structures are formed, which includes the plurality of insulating layers 101 disposed in the z-direction and structures supporting the insulating layers 101 such as the plurality of memory structures 110', the contact 173, the insulating film 174, and the plurality of first structures 140'. This process is performed by, for example, a method such as wet etching.

Figure 58:
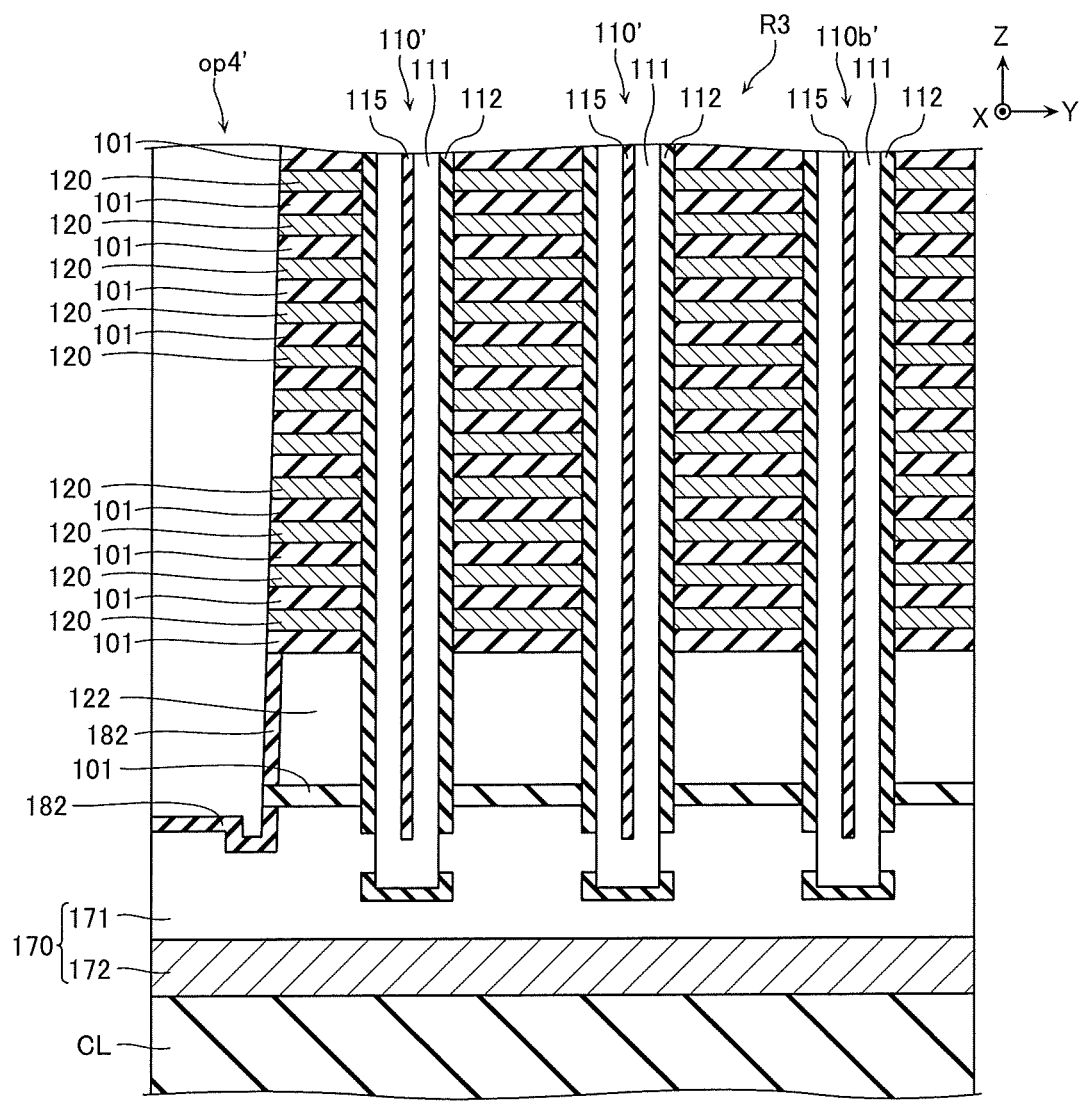
FIG. 58 is a schematic cross-sectional view showing the same manufacturing method.

Next, as shown in FIG. 58, conductive layers 120 are formed. In this processing, for example, titanium nitride and tungsten are formed by a method such as CVD. Additionally, the titanium nitride and the tungsten formed on side surface of the insulating layer 101 is removed by a method such as wet etching.

After that, through forming insulating portions ST of silicon oxide and the like in the openings op4' and forming contacts, lines, and the like, the configuration described with reference to FIG. 28 to FIG. 32 is formed.

Comparative Example

Figure 59:
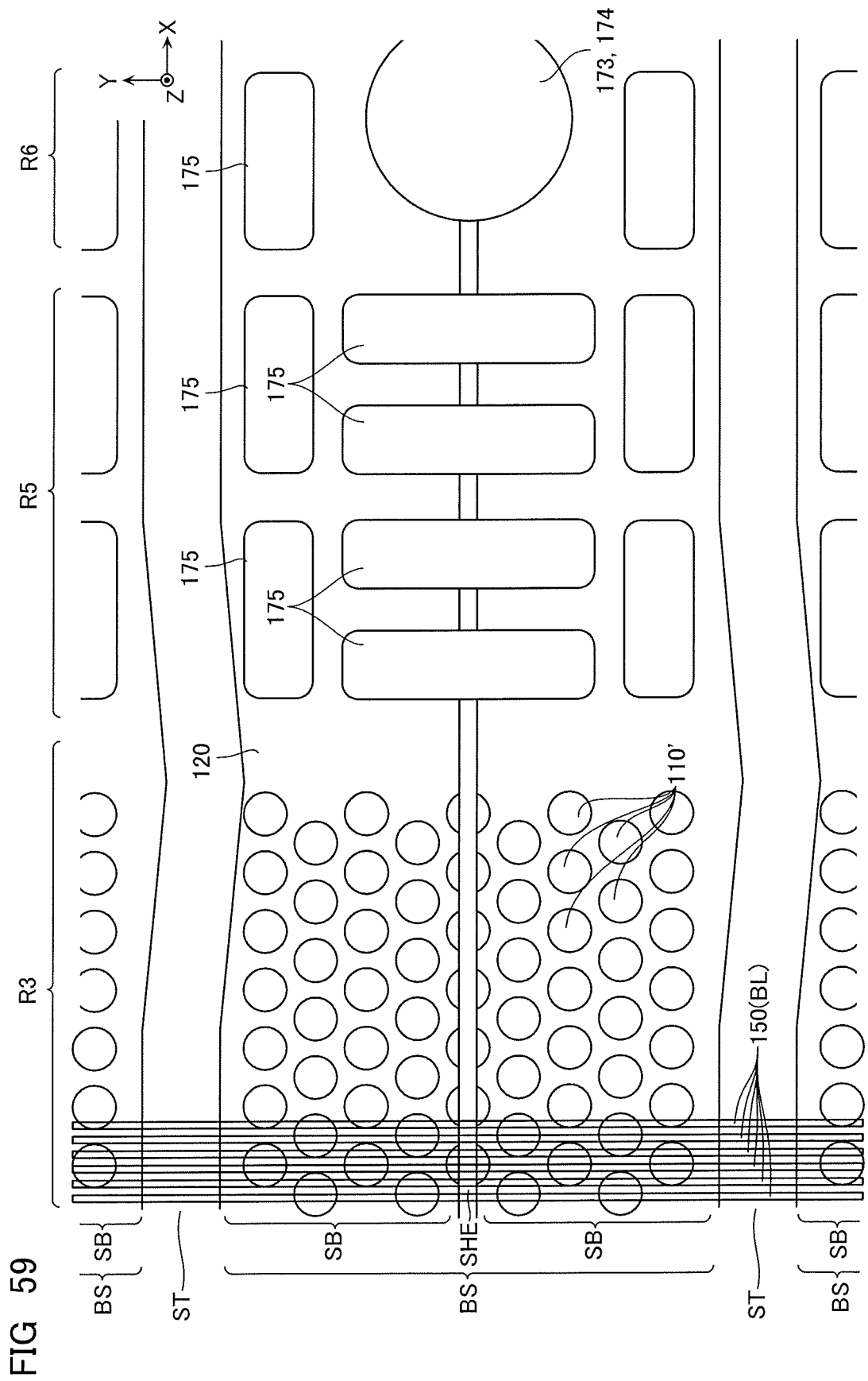
FIG. 59 is a schematic cross-sectional view showing a semiconductor memory device according to a comparative example.
Figure 60:
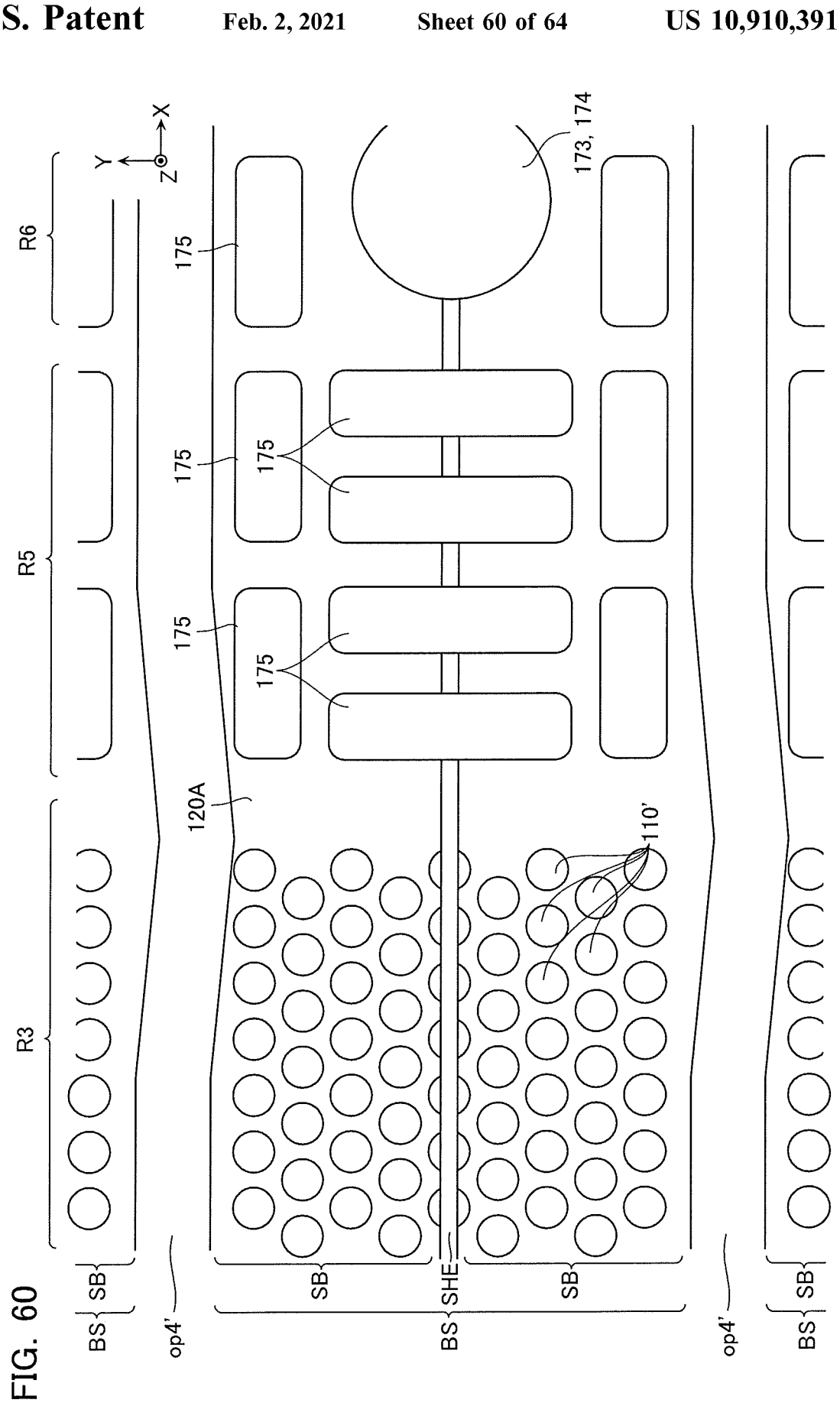
FIG. 60 is a schematic cross-sectional view showing a manufacturing method of the same semiconductor memory device.

Next, with reference to FIG. 59 and FIG. 60, a semiconductor memory device according to a comparative example is explained.

As shown in FIG. 59, the semiconductor memory device according to the comparative example comprises almost the same configuration as that of the semiconductor memory device according to the second embodiment. However, the semiconductor memory device according to the comparative example does not comprise the first structure 140' and the region R4.

A manufacturing method for manufacturing the semiconductor memory device according to the comparative example is almost the same as that of the second embodiment. However, in the manufacturing method in the comparative example, in the process explained with reference to FIG. 34 to FIG. 36, the openings op1' are not formed in the region R4.

Here, in the manufacturing method according to the comparative example, similarly to the manufacturing method according to the second embodiment, in the process described with reference to FIG. 46 and FIG. 47, openings op4' are formed. Here, as described above, the process shown in FIG. 46 and FIG. 47 is performed by, for example, a method such as RIE. In this case, ions for processing are emitted, for example, to a structure shown in FIG. 37 and FIG. 45. Here, electric charge is hardly accumulated in the insulating film 175 of FIG. 45. Additionally, because the insulating film 175 is connected to the semiconductor layer 171A, even if electric charge is accumulated in the insulating film 175, electrons move in a direction in which the electrons cancel effect of electric charge by the ions. On the other hand, because the semiconductor films 111 corresponding to the memory structures 110' of FIG. 37 are electrically insulated from the semiconductor layer 171A, such movement of electrons does not occur. Thereby, imbalance of electric charge occurs between the insulating films 175 of FIG. 45 and the semiconductor films 111 of FIG. 37. When such imbalance of electric charge reaches a level equal to or more than a predetermined level, it is conceivable that the ions for processing reaches portions which are not intended to process, and it causes the openings OP4' to be distorted.

[Advantages]

Figure 61:
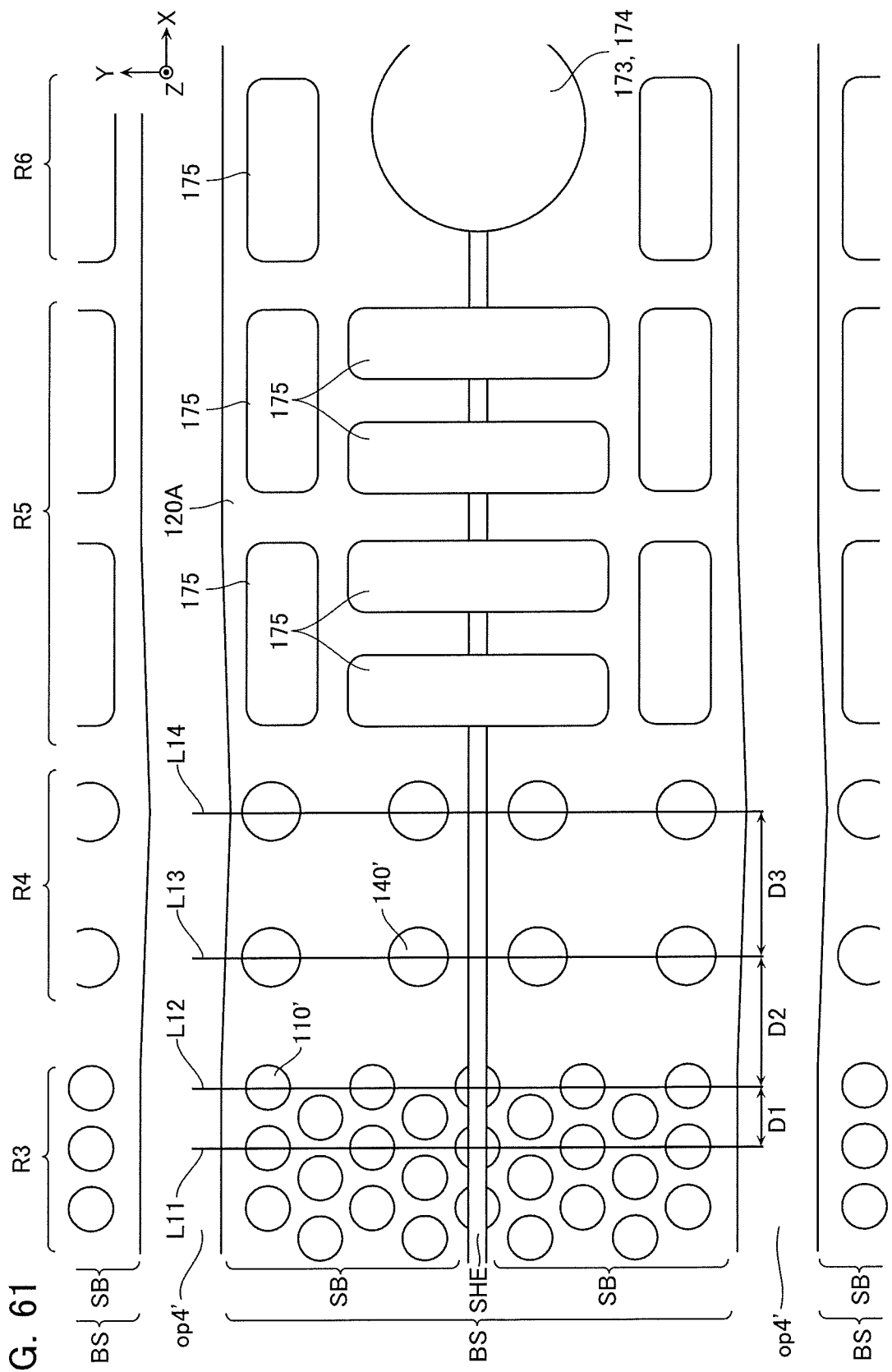
FIG. 61 is a schematic plan view of the semiconductor memory device according to the second embodiment.

In the second embodiment, as described with reference to FIG. 32, between the region R3 in which the memory structures 110' are provided and the region R5 in which the insulating films 175 are provided, the region R4 in which the first structure 140' are provided is provided. According to such configuration, as shown in FIG. 61, for example, a distance between the distorted portion of the openings op4' and the region R3 is secured, thereby variation in characteristics among the memory cells MC and effects to wiring resistance of the conductive layer 120 are reduced.

Additionally, in this embodiment, distances in the x-direction among the semiconductor films 111 provided in the region R4 are larger than distances in the x-direction among the semiconductor films 111 provided in the region R3. By such a configuration, effect of the imbalance of electric charge between the end in the x-direction of the region R3 and the end in the x-direction of the region R5 is reduced, which enables the distortion of the openings op4' as described above to be restrained. Thereby, it is possible to reduce a manufacturing cost and to provide with the semiconductor memory device at a moderate price.

Another Examples of the Second Embodiment

Figure 62:
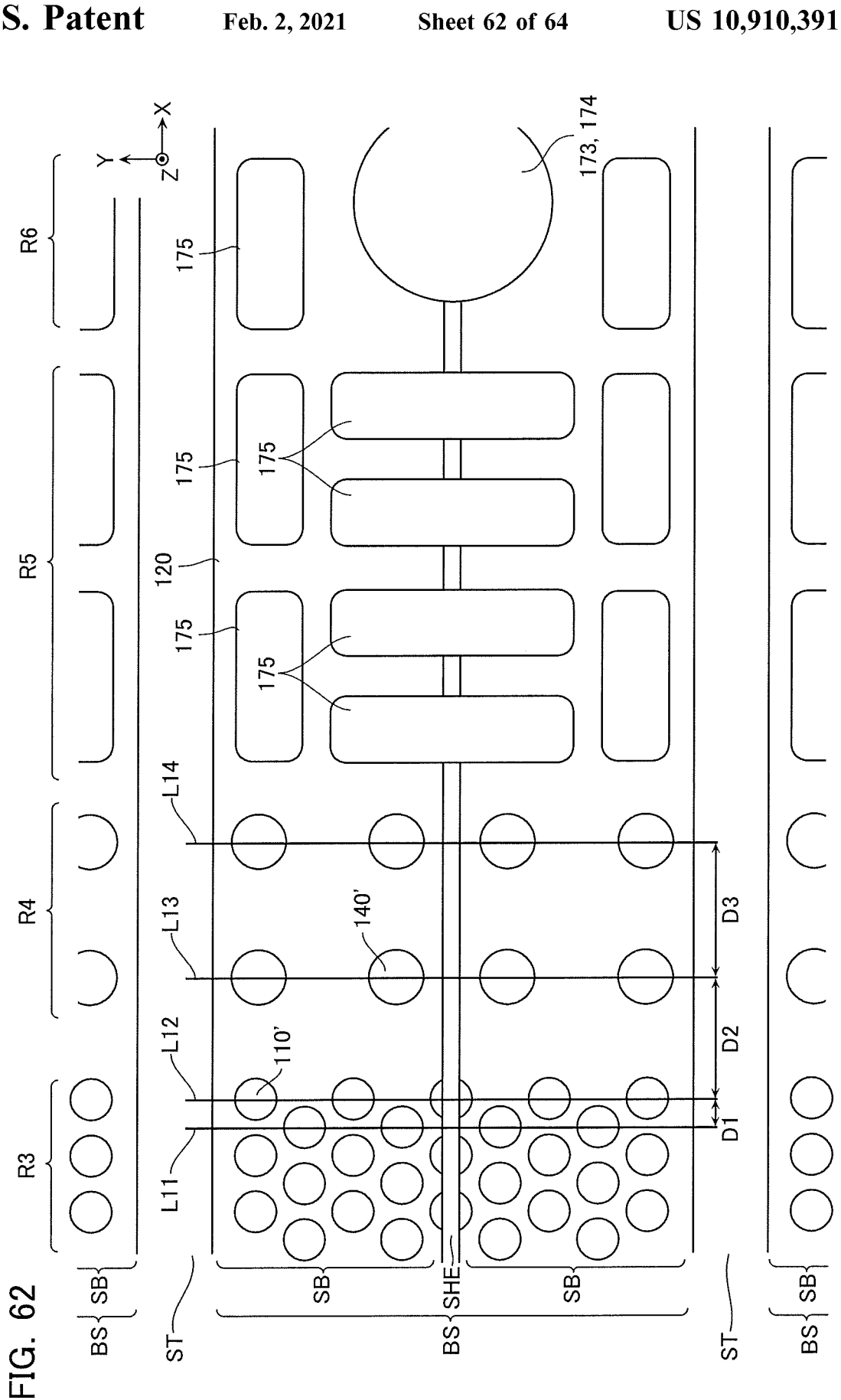
FIG. 62 is a schematic plan view of a semiconductor memory device according to another example.

In the example in FIG. 32, the plurality of memory structures 110' arranged on the imaginary straight line L12 is memory structures 110' each of which is adjacent to another memory structure 110' arranged on the imaginary straight line L11 in the x-direction. However, as shown in for example FIG. 62, the plurality of memory structures 110' arranged on the straight line L12 may be memory structures 110' each of which is adjacent to another memory structure 110' arranged on the straight line L11 in a direction other than the x-direction. Similarly, the plurality of memory structures 140' arranged on the straight line L14 may be memory structures 140' each of which is adjacent to another memory structure 140' arranged on the straight line L13 in a direction other than the x-direction.

Figure 63:
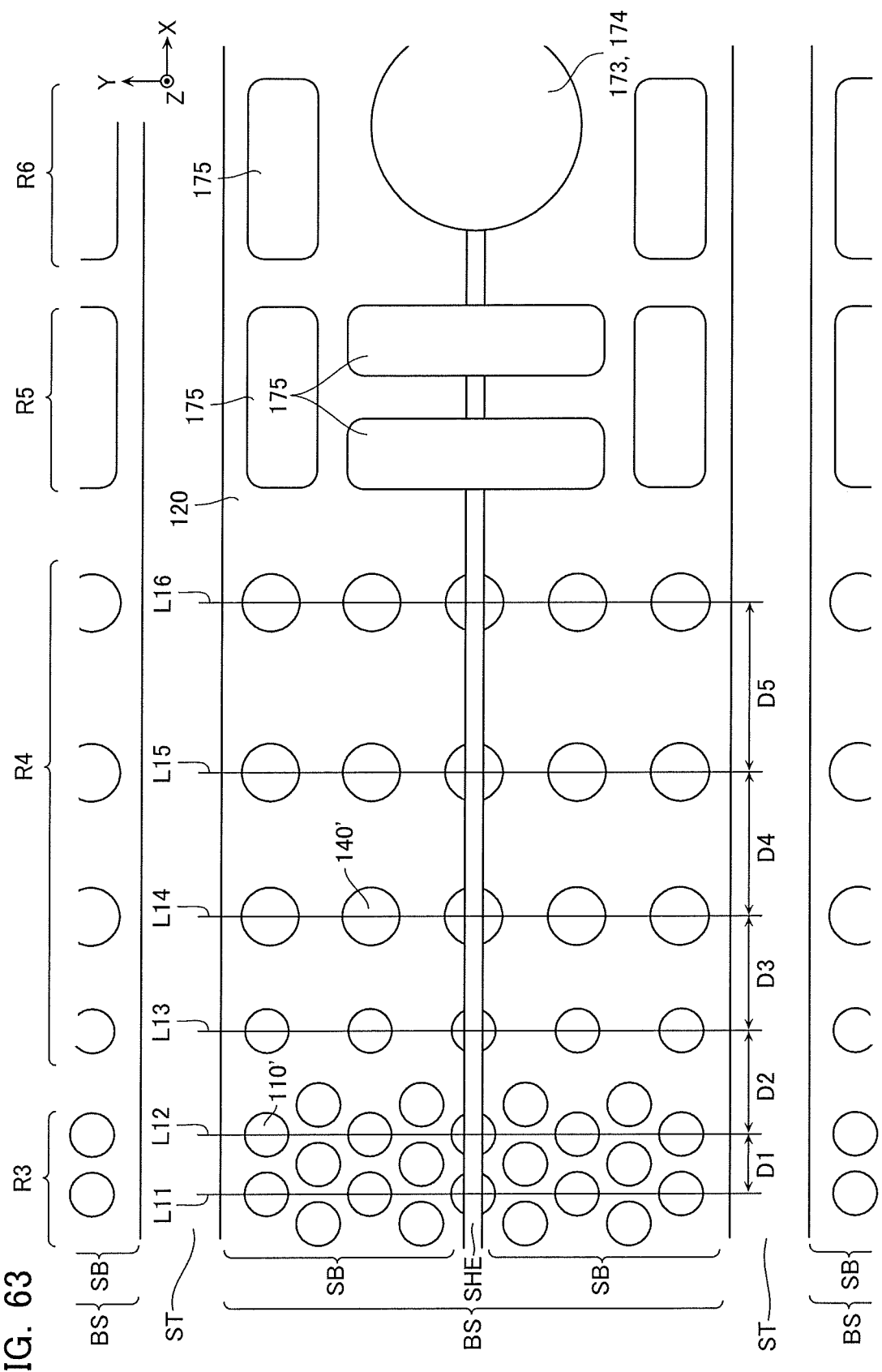
FIG. 63 is a schematic plan view of a semiconductor memory device according to another example.

In FIG. 63, in addition to the straight lines L11 to L14, straight lines L15 and L16 are shown. These straight lines L15 and L16 are also imaginary lines. The straight lines L15 and L16 are provided in the region R4. The straight line L15 is closer to the region R5 than the straight line L14, and the straight line L16 is closer to the region R5 than the straight line L15.

In the example in FIG. 63, the distance D5 between the straight line L16 and the straight line L15 is larger than the distance D4 between the straight line L15 and the straight line L14, the distance D4 is larger than the distance D3 between the straight line L14 and the straight line L13, the distance D3 is larger than the distance D2 between the straight line L13 and the straight line L12, and the distance D2 is larger than the distance D1 between the straight line L12 and the straight line L11. In such a configuration, in the region R4, as it comes closer to the region R5, distance in the x-direction between the semiconductor films 111 is increased gradually. Therefore, the imbalance of electric charge can be more preferably reduced and distortion of the openings op4' can be restrained.

In FIG. 32, a distance between an end of the conductive layer 120 on the imaginary straight line L11 and one of the memory structures 110' closest to the end of the conductive layer 120 on the straight line L11 is shown as a distance D21. A distance between an end of the conductive layer 120 on the imaginary straight line L12 and one of the memory structures 110' closest to the end of the conductive layer 120 on the straight line L12 is shown as a distance D22. A distance between an end of the conductive layer 120 on the imaginary straight line L13 and one of the memory structures 110' closest to the end of the conductive layer 120 on the straight line L13 is shown as a distance D23. A distance between an end of the conductive layer 120 on the imaginary straight line L14 and one of the memory structures 110' closest to the end of the conductive layer 120 on the straight line L14 is shown as a distance D24.

In the example in FIG. 32, the distance D21 is almost the same as the distance D22, and the distance D23 is almost the same as the distance D24.

On the other hand, in the example in FIG. 64, in the region R4, as it comes closer to the region R5, distance in the y-direction between the semiconductor film 111 and the insulating portion ST is increased gradually. For example, the distance D26 is larger than the distance D25, the distance D25 is larger than the distance D24, the distance D24 is larger than the distance D23, and the distance D23 is larger than the distance D22. Note that the distance D21 is almost the same as the distance D22. In such a configuration, from the region R3 to the region R5, the effect of the imbalance of the electric charge gradually decreases. Therefore, the imbalance of electric charge can be more preferably reduced and distortion of the openings op4' can be restrained.

Other Embodiments

The first embodiment, the second embodiment and other examples thereof are explained. However, these embodiments and examples are presented by way of example only, and specific structures and the like may be appropriately modified.

For example, in the first embodiment, with reference to FIG. 8, structures of the ends in the X direction of the region R1 where the memory structures 110 are provided and the region R2 where the contacts 130 are provided are explained. Note that, as is described above, the contacts 130 are connected to the conductive layers 120.

Additionally, in the first embodiment, at the end in the x-direction of the region R1, as it comes closer to the region R2, number of the memory structures 110 is reduced gradually.

On the other hand, in the second embodiment, with reference to FIG. 32, structures of the ends in the X direction of the region R3 where the memory structures 110' are provided and the region R6 where the contacts 173 are provided are explained. Note that, as is described above, the contacts 173 are connected to the transistors (FIG. 27) in the circuit layer CL.

Additionally, in the second embodiment, between the region R3 in which the memory structures 110' are provided and the region R5 in which the insulating films 175 are provided, the region R4 in which the first structure 140' are provided is provided. Additionally, in the second embodiment, the distance D2 is larger than the distance D1, and the distance D3 is larger than the distance D1.

However, such structures are presented by way of example only, and specific structures and the like may be appropriately modified.

For example, it is possible to provide a region between the region R1 or R3 where the memory structures 110 or 110' are provided and the region R2 where the contact 130 is provided, and to provide the first structures 140 or the first structures 140' in the region. Additionally, it is possible to arrange the semiconductor films 111 so that distances in the x-direction between the semiconductor films 111 in this region are larger than distances in the x-direction between the semiconductor films 111 in the region R1 or R3, similarly to the second embodiment.

In such a case, the first structure 140 or the first structure 140' may be arranged in the pattern explained with reference to FIG. 29, FIG. 63, and FIG. 64, or may be arranged in other pattern.

Additionally, for example, the memory structures 110' may be arranged in a pattern that as it comes closer to the region R6, number of the memory structures 110' is reduced gradually, similarly to the first embodiment.

In such a case, the memory structures 110' may be arranged in any of the patterns explained with reference to FIG. 8, FIG. 25, and FIG. 26, or may be arranged in other pattern.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a substrate;
    a plurality of first semiconductor films which extend in a first direction crossing a surface of the substrate and are arranged in a second direction crossing the first direction and in a third direction crossing the first direction and the second direction;
    a conductive layer which extends in the second direction and covers the peripheral faces of the plurality of first semiconductor films on a cross-section crossing the first direction; and
    a contact which extends in the first direction and which is connected with the conductive layer or which has a peripheral face covered by the conductive layer in the cross-section;
    wherein when straight lines which are disposed at equal intervals in the second direction on the cross-section and perpendicular to the second direction are defined as first to third straight lines,
    a first number of the first semiconductor films are provided on the first straight line,
    the second straight line is closer to the contact than the first straight line, and a second number, which is less than the first number, of the first semiconductor films are provided on the second straight line, and
    the third straight line is closer to the contact than the second straight line, and a third number, which is less than the second number, of the first semiconductor films are provided on the third straight line.

2. The semiconductor memory device according to claim 1, further comprising a wiring layer electrically connected to an end on the substrate-side of the first semiconductor film.

3. The semiconductor memory device according to claim 2, wherein the wiring layer is a part of the surface of the substrate.

4. The semiconductor memory device according to claim 1, further comprising a second semiconductor film provided at an end in the second direction of the conductive layer and extending in the first direction, wherein the conductive layer covers the peripheral face of the second semiconductor film on the cross-section.

5. The semiconductor memory device according to claim 4, further comprising a wiring layer closer to the substrate than the conductive layer, wherein the first semiconductor film is electrically connected to the wiring layer, and wherein the second semiconductor film is electrically insulated from the wiring layer.

6. The semiconductor memory device according to claim 5, further comprising: a first insulating film provided between the first semiconductor film and the conductive layer; and a second insulating film provided between the second semiconductor film and the conductive layer, wherein the second insulating film covers an end on the substrate-side of the second semiconductor film.

7. The semiconductor memory device according to claim 5, wherein the wiring layer is a part of the surface of the substrate.

8. The semiconductor memory device according to claim 1, comprising a plurality of lines farther from the substrate than the plurality of first semiconductor films, wherein the plurality of first semiconductor films include the first semiconductor film electrically connected to the line, and the first semiconductor film electrically insulated from the line.

9. The semiconductor memory device according to claim 8, wherein assuming that the first semiconductor film electrically connected to the line is a third semiconductor film and the first semiconductor film electrically insulated from the line is a fourth semiconductor film, the fourth semiconductor film is closer to the contact than the third semiconductor film, in the second direction.

10. The semiconductor memory device according to claim 8, wherein the plurality of first semiconductor films provided on the first to the third straight lines are electrically insulated from the lines.

11. The semiconductor memory device according to claim 1, wherein on the third straight line, the first semiconductor film is provided, which is the closest of the plurality of first semiconductor films to the contact.

12. A semiconductor memory device comprising:
    a substrate;
    a plurality of first semiconductor films which extend in a first direction crossing a surface of the substrate and are arranged in a second direction crossing the first direction and in a third direction crossing the first direction and the second direction;
    a conductive layer which extends in the second direction and covers the peripheral faces of the plurality of first semiconductor films on a cross-section crossing the first direction;
    a contact which extends in the first direction and which is connected with the conductive layer or which has a peripheral face covered by the conductive layer in the cross-section;

a plurality of first insulating layers which is provided between the plurality of the first semiconductor films and the contact, each of which extends in the first direction, and each of which has a peripheral face covered by the conductive layer in the cross-section; and a plurality of second semiconductor films which is provided between the plurality of the first semiconductor films and the plurality of the first insulating layers, each of which extends in the first direction, and each of which has a peripheral face covered by the conductive layer in the cross-section;

wherein when straight lines which are disposed in the second direction on the cross-section and perpendicular to the second direction are defined as first to fourth straight lines, a first number of the first semiconductor films are provided on the first straight line, the second straight line is closer to the contact than the first straight line, a second number of the first semiconductor films are provided on the second straight line, each of the second number of the first semiconductor films is adjacent to at least one of the first number of the first semiconductor films, the third straight line is closer to the contact than the second straight line, a third number of the first semiconductor films are provided on the third straight line, each of the third number of the second semiconductor films is adjacent to at least one of the second number of the first semiconductor films, the fourth straight line is closer to the contact than the third straight line, a fourth number of the first semiconductor films are provided on the fourth straight line, each of the fourth number of the first semiconductor films is adjacent to at least one of the third number of the first semiconductor films, a distance between the third straight line and the second straight line is larger than a distance between the second straight line and the first straight line, and a distance between the fourth straight line and the third straight line is larger than the distance between the second straight line and the first straight line.

13. The semiconductor memory device according to claim 12, wherein the distance between the fourth straight line and the third straight line is larger than the distance between the third straight line and the second straight line.

14. The semiconductor memory device according to claim 12, wherein when a first distance is a distance between an end of the conductive layer on the first straight line and one of the first number of the first semiconductor films closest to the end of the conductive layer, a second distance is a distance between an end of the conductive layer on the second straight line and one of the second number of the first semiconductor films closest to the end of the conductive layer, a third distance is a distance between an end of the conductive layer on the third straight line and one of the third number of the first semiconductor films closest to the end of the conductive layer, and a fourth distance is a distance between an end of the conductive layer on the fourth straight line and one of the fourth number of the first semiconductor films closest to the end of the conductive layer, the third distance is larger than the first distance, the third distance is larger than the second distance, and the fourth distance is larger than the third distance.

* * * * *